United States Patent
Nakatani et al.

(10) Patent No.: US 8,142,908 B2
(45) Date of Patent: *Mar. 27, 2012

(54) POLYMER LIGHT-EMITTING MATERIAL COMPRISING A CONJUGATED POLYMER AND COMPOUND EXHIBITING LIGHT EMISSION FROM THE TRIPLET EXCITED STATE AND POLYMER LIGHT-EMITTING DEVICE USING THE SAME

(75) Inventors: Tomoya Nakatani, Tsukuba (JP); Chizu Sekine, Tsukuba (JP); Satoshi Mikami, Tsukuba (JP); Satoshi Kobayashi, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 1134 days.

This patent is subject to a terminal disclaimer.

(21) Appl. No.: 10/573,839

(22) PCT Filed: Sep. 28, 2004

(86) PCT No.: PCT/JP2004/014569
§ 371 (c)(1),
(2), (4) Date: Mar. 29, 2006

(87) PCT Pub. No.: WO2005/033174
PCT Pub. Date: Apr. 14, 2005

(65) Prior Publication Data
US 2007/0051922 A1    Mar. 8, 2007

(30) Foreign Application Priority Data
Oct. 1, 2003 (JP) ................. 2003-343243

(51) Int. Cl.
*H01L 51/54* (2006.01)
*C09K 11/06* (2006.01)
*C08G 61/00* (2006.01)

(52) U.S. Cl. .......... 428/690; 428/917; 313/504; 257/40; 257/E51.036; 252/301.35

(58) Field of Classification Search ............ 428/690
See application file for complete search history.

(56) References Cited

U.S. PATENT DOCUMENTS

| | | | |
|---|---|---|---|
| 2002/0028347 A1 * | 3/2002 | Marrocco et al. ............. | 428/690 |
| 2002/0028349 A1 | 3/2002 | Seo | |
| 2002/0193532 A1 | 12/2002 | Ikehira et al. | |
| 2003/0168656 A1 * | 9/2003 | Kobayashi et al. ............ | 257/40 |
| 2003/0186080 A1 | 10/2003 | Kamatani et al. | |
| 2008/0138651 A1 * | 6/2008 | Doi et al. ..................... | 428/690 |

FOREIGN PATENT DOCUMENTS

| | | | |
|---|---|---|---|
| EP | 1344788 A1 * | 9/2003 | |
| JP | 2002/141173 A | 5/2002 | |
| JP | 2002-284862 A | 10/2002 | |
| JP | 2003-171659 A | 6/2003 | |
| JP | 2003-221579 A | 8/2003 | |
| JP | 2004-168999 A | 6/2004 | |
| JP | 4461762 B2 | 5/2010 | |
| WO | 01/96454 A1 | 12/2001 | |
| WO | WO 2004039859 A1 * | 5/2004 | |

OTHER PUBLICATIONS

Fang-Chung Chen, et al., "High-performance polymer light-emitting diodes doped with a red phosphorescent iridium complex," Applied Physics Letters, Apr. 1, 2002, pp. 2308-2310, vol. 80, No. 13, American Institute of Physics.

Xiwen Chen, et al., "High-Efficiency Red-Light Emission from Polyfluorenes Grafted with Cyclometalated Iridium Complexes and Charge Transport Moiety," Journal of the American Chemical Society, 2003, pp. 636-637, vol. 125, No. 3, American Chemical Society.

Office Action dated Jul. 1, 2011 in corresponding Korean Patent Application No. 10-20067008210.

* cited by examiner

*Primary Examiner* — Andrew K. Bohaty
(74) *Attorney, Agent, or Firm* — Sughrue Mion, PLLC

(57) ABSTRACT

A polymer light emitting material which contains a polymer compound comprising a repeating unit of the following formula (1) or (2) and having a polystyrene-reduced number-average molecular weight of $10^3$ to $10^8$, and which exhibits light emission from the triplet excited state.

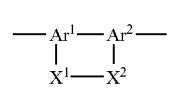

(1)

[wherein $Ar^1$ and $Ar^2$ each independently represent a trivalent aromatic hydrocarbon group or a trivalent heterocyclic group. $X^1$ and $X^2$ each independently represent O, S, C(=O), S(=O), $SO_2$, $C(R^1)(R^2)$, $Si(R^3)(R^4)$, $N(R^5)$, $B(R^6)$, $P(R^7)$ or $P(=O)(R^8)$. $X^1$ and $Ar^2$ bond to adjacent carbon atoms in the aromatic ring of $Ar^1$; and $X^2$ and $Ar^1$ bond to adjacent carbon atoms in the aromatic ring of $Ar^2$];

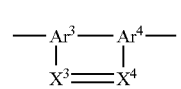

(2)

[wherein $Ar^3$ and $Ar^4$ each independently represent a trivalent aromatic hydrocarbon group or a trivalent heterocyclic group. $X^3$ and $X^4$ each independently represent N, B, P, $C(R^9)$ or $Si(R^{10})$. $X^3$ and $Ar^4$ bond to adjacent carbon atoms in the aromatic ring of $Ar^3$; and $X^4$ and $Ar^3$ bond to adjacent carbon atoms in the aromatic ring of $Ar^4$].

17 Claims, No Drawings

US 8,142,908 B2

POLYMER LIGHT-EMITTING MATERIAL COMPRISING A CONJUGATED POLYMER AND COMPOUND EXHIBITING LIGHT EMISSION FROM THE TRIPLET EXCITED STATE AND POLYMER LIGHT-EMITTING DEVICE USING THE SAME

TECHNICAL FIELD

The present invention relates to a polymer light emitting material exhibiting light emission from the triplet excited state, and a polymer light emitting device.

BACKGROUND ART

It is known that a device using in a light emitting layer a polymer light emitting material showing light emission from the triplet excited state (hereinafter, referred to as triplet light emitting material in some cases) as a light emitting material used in a light emitting layer of a light emitting device exhibits high light emitting efficiency.

When a triplet light emitting material is used in a light emission layer, the material is occasionally used as a composition comprising a polymer compound as a matrix and a low molecular weight triplet light emitting compound. There is also a case of use as a polymer complex compound having a structure of a triplet light emitting compound at a side chain, main chain or end of the polymer. Further, there is also a case of use as a composition comprising a polymer compound as a matrix and a polymer complex compound.

As an example of the composition comprising a polymer compound as a matrix in addition to a low-molecular weight triplet light emitting compound, disclosed is a composition obtained by adding 2,8,12,17-tetraethyl-3,7,13,18-tetramethylporphyrin as a low molecular weight triplet light emitting compound to a polymer compound having a repeating unit of fluorenediyl group (APPLIED PHYSICS LETTERS, 80, 13, 2308 (2002)).

A polymer complex compound containing a structure of a triplet light emitting compound in a side chain of a polymer compound having an aromatic hydrocarbon ring in the main chain has been studied, and disclosed as its example is a compound having a structure of a low molecular weight triplet light emitting compound as described below in a side chain of a polymer compound having a fluorine structure as a repeating unit (J. Am. Chem. Soc., 2003, vol. 125, No. 3, 636-637).

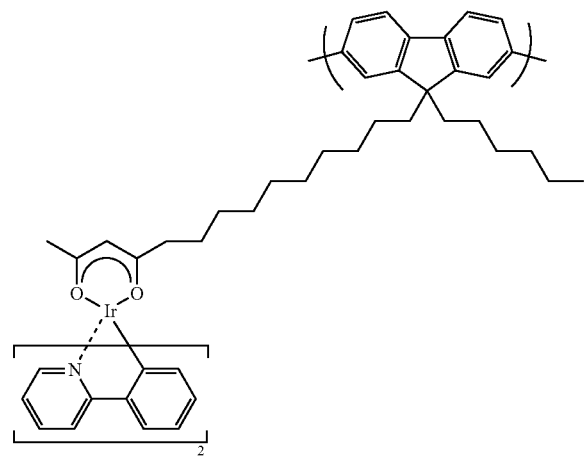

A polymer complex compound containing a structure of a triplet light emitting compound in the main chain of a polymer has also been studied, and known as its example is a compound having a partial structure of tri(2-phenylpyridine) iridium complex Ir(ppy)3 as a triple light emitting compound in the main chain of a polymer having a fluorine structure as a repeating unit (JP-A No. 2003-73480).

Devices using the above-described composition and polymer complex compound in a light emitting layer, however, still do not show sufficient characteristics of the devices such as light emitting efficiency, half-life of luminance and the like.

DISCLOSURE OF THE INVENTION

The object of the invention is to provide a polymer light emitting material exhibiting light emission from the triplet excited state, thereby enhancing light emitting efficiency of a device using this in a light emitting layer of a light emitting device.

That is, the invention provides a polymer light emitting material which contains a polymer compound comprising a repeating unit of the following formula (1) or (2) and having a polystyrene-reduced number-average molecular weight of $10^3$ to $10^8$, and which exhibits light emission from the triplet excited state.

(1)

[wherein, $Ar^1$ and $Ar^2$ each independently represent a trivalent aromatic hydrocarbon group or a trivalent heterocyclic group. $X^1$ and $X^2$ each independently represent O, S, C(=O), S(=O), $SO_2$, $C(R^1)(R^2)$, $Si(R^3)(R^4)$, $N(R^5)$, $B(R^6)$, $P(R^7)$ or $P(=O)(R^8)$ (wherein $R^1$, $R^2$, $R^3$, $R^4$, $R^5$, $R^6$, $R^7$ and $R^8$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, heteroaryloxy group, heteroarylthio group, arylalkenyl group, arylethynyl group, carboxyl group, alkoxycarbonyl group, aryloxycarbonyl group, arylalkyloxycarbonyl group, heteroaryloxycarbonyl group or cyano group. ($R^1$ and $R^2$) or ($R^3$ and $R^4$) may mutually be connected to form a ring); wherein $X^1$ and $X^2$ are not the same excepting the case of S or $Si(R^3)(R^4)$. $X^1$ and $Ar^2$ bond to adjacent carbon atoms in the aromatic ring of $Ar^1$, and $X^2$ and $Ar^1$ bond to adjacent carbon atoms in the aromatic ring of $Ar^2$;

(2)

[wherein $Ar^3$ and $Ar^4$ each independently represent a trivalent aromatic hydrocarbon group or a trivalent heterocyclic group. $X^3$ and $X^4$ each independently represent N, B, P, $C(R^9)$ or $Si(R^{10})$ (wherein $R^9$ and $R^{10}$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, heteroaryloxy group, heteroarylthio group, arylalkenyl group, arylethynyl group, carboxyl group, alkoxycarbonyl group, aryloxycarbonyl group, arylalkyloxycarbonyl group, heteroaryloxycarbonyl group or cyano group); wherein $X^3$ and $X^4$ are not the same. $X^3$ and $Ar^4$ bond to adjacent carbon atoms in the aromatic ring of $Ar^3$, and $X^4$ and $Ar^3$ bond to adjacent carbon atoms in the aromatic ring of $Ar^4$].

BEST MODE FOR CARRYING OUT THE INVENTION

The polymer compound used for the present invention comprises the repeating unit represented by the above formula (1) or (2). In the above formula (1), $Ar^1$ and $Ar^2$ each independently represent a trivalent aromatic hydrocarbon group or a trivalent heterocyclic group.

The trivalent aromatic hydrocarbon group is an atomic group in which three hydrogen atoms are removed from a benzene ring or condensed ring of an aromatic hydrocarbon, and the number of carbon atoms is usually 6-60, and preferably 6-20.

Examples of the trivalent aromatic hydrocarbon groups, shown as unsubstituted structure, include the followings.

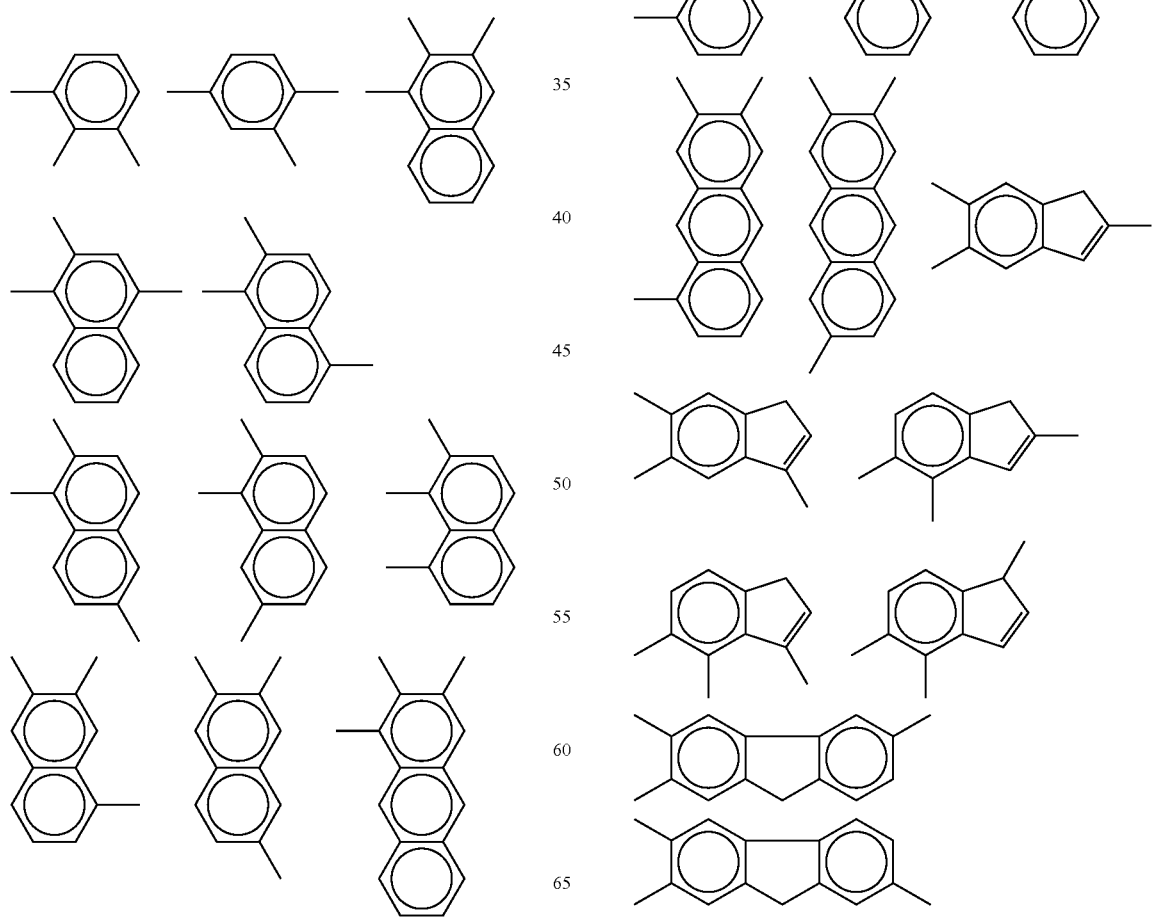

-continued

-continued

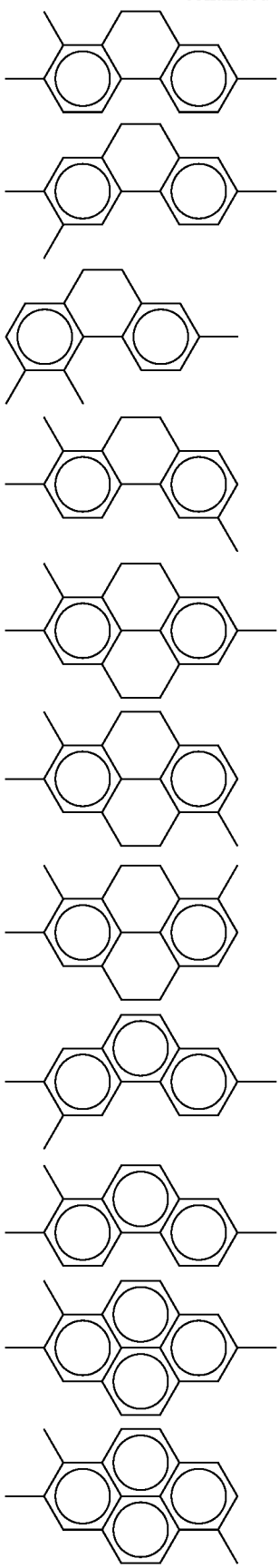

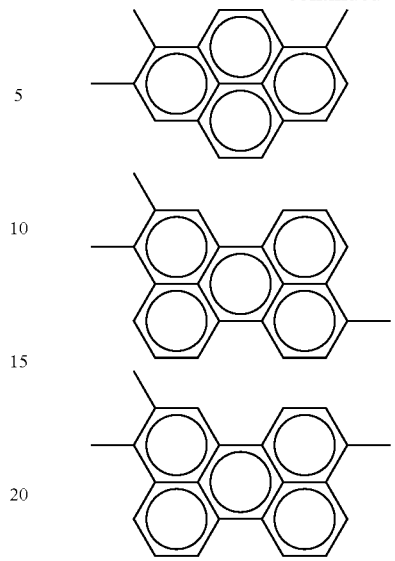

The trivalent aromatic hydrocarbon group may have a substituent on the aromatic hydrocarbon group. The number of carbon atoms of the substituent is not counted as the number of carbon atoms of the trivalent aromatic hydrocarbon group.

As the substituent which may be carried on the trivalent aromatic hydrocarbon group, exemplified are a halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, cyano group, etc.

The trivalent heterocyclic group is an atomic group in which three hydrogen atoms are removed from a heterocyclic compound, and the number of carbon atoms is usually 4-60, and preferably 4-20.

The heterocyclic compound means an organic compound having a cyclic structure in which at least one heteroatom such as oxygen, sulfur, nitrogen, phosphorus, boron, etc. is contained in the cyclic structure as the element other than carbon atoms.

Examples of the trivalent heterocyclic groups, shown as unsubstituted structure, include the followings.

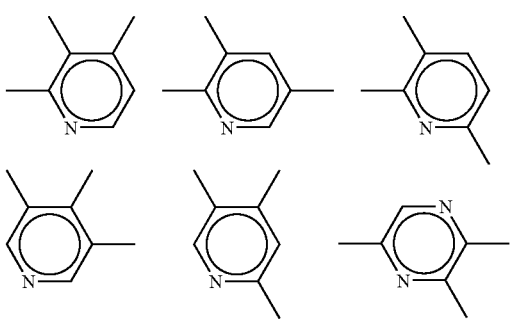

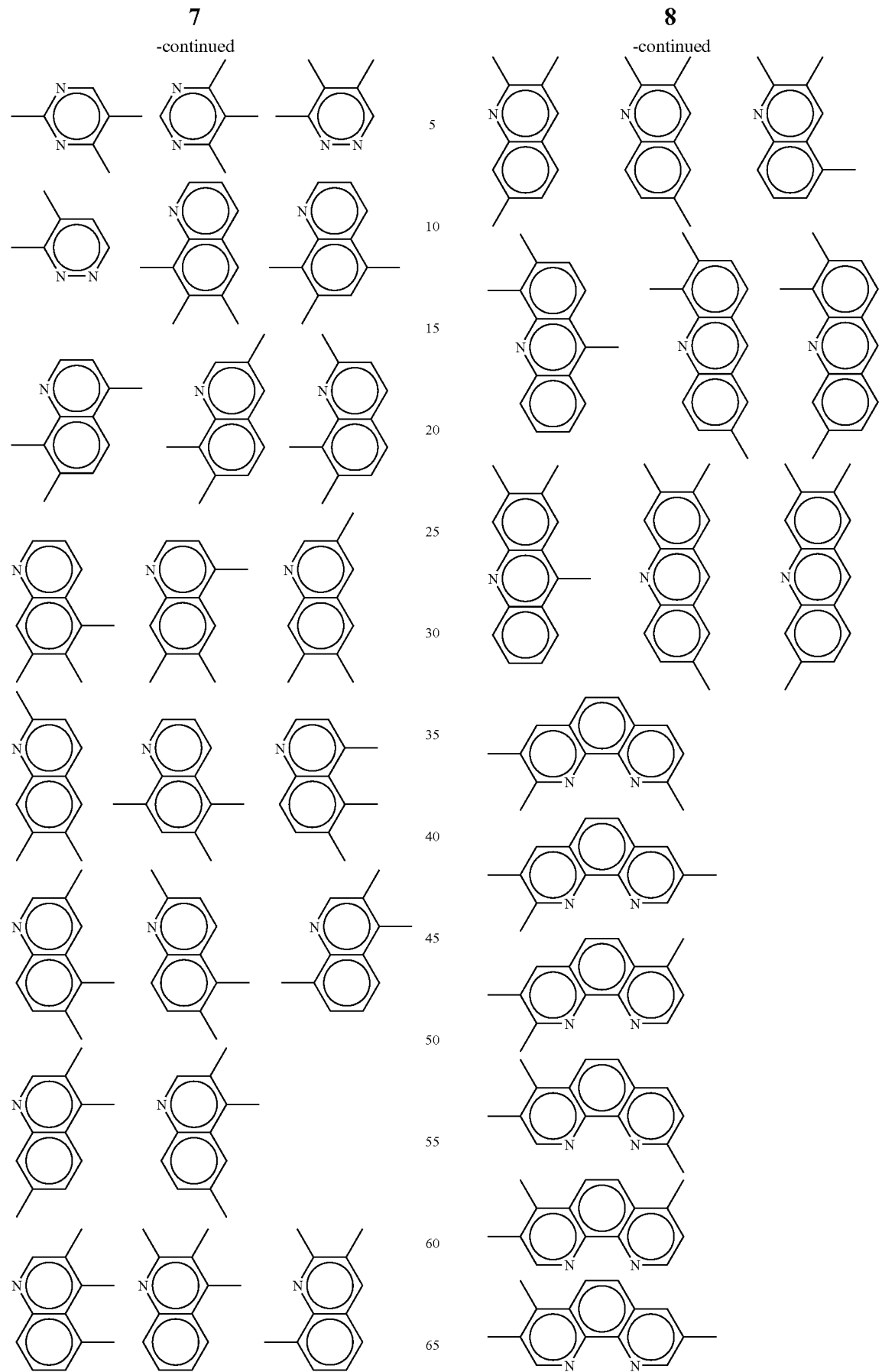

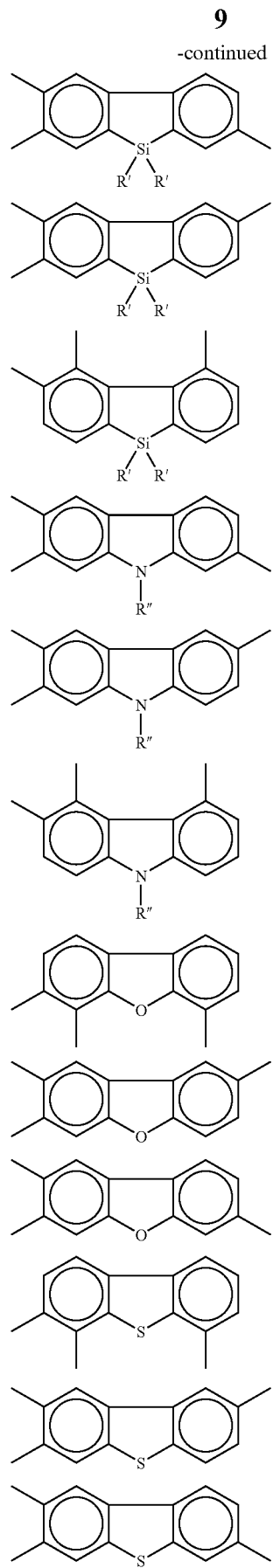
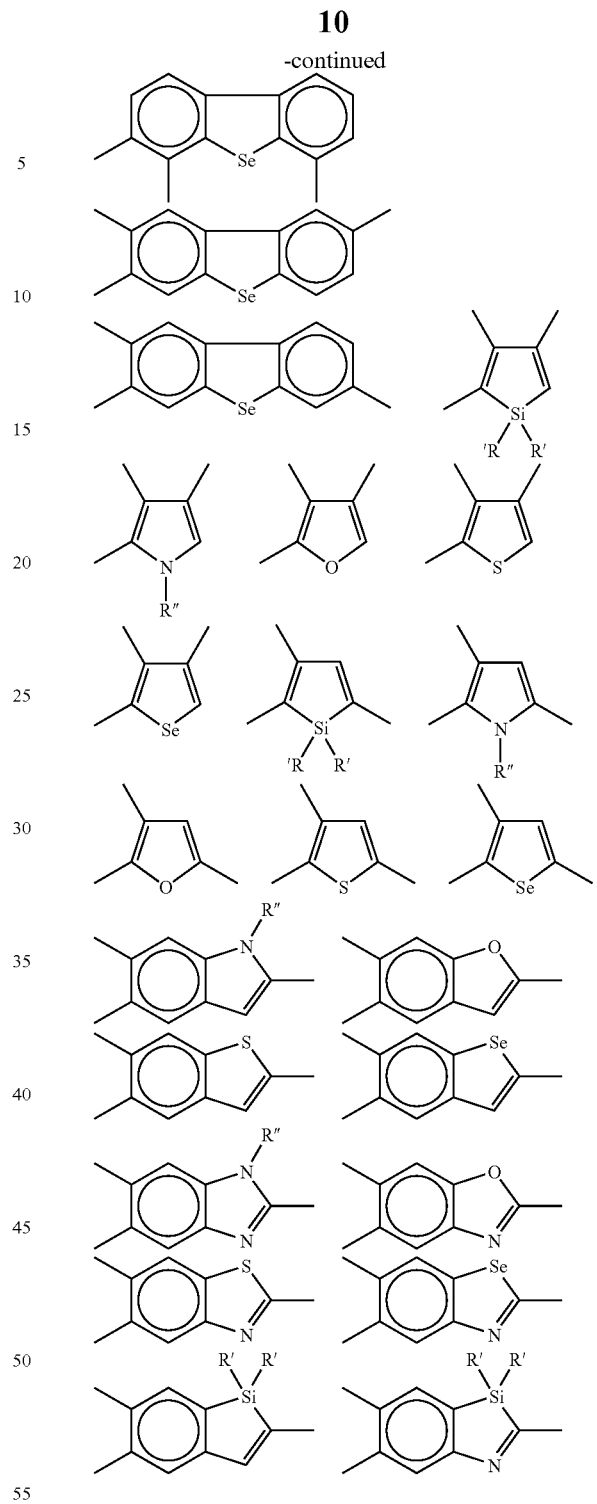

In the above formula, R' each independently represent a hydrogen atom, halogen atom, alkyl group, alkoxy group, alkylthio group, the alkylamino group, aryl group, aryloxy group, arylthio group, arylamino group, arylalkyl group, arylalkoxy group, arylalkylthio group, arylalkylamino group, acyloxy group, amide group, arylalkenyl group, arylalkynyl group, monovalent heterocyclic group, or cyano group.

R" each independently represent a hydrogen atom, alkyl group, aryl group, arylalkyl group, substituted silyl group, acyl group or monovalent heterocyclic group, hetero aryloxy group, and hetero arylthio group.

The trivalent heterocyclic group may have a substituent on the heterocyclic group, and the number of carbon atoms of the substituent is not counted as the number of carbon atoms of the heterocyclic group.

As the substituent which may be carried on the trivalent heterocyclic group, exemplified are a halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, hetero aryloxy group, hetero arylthio group arylalkenyl group, arylethynyl group, carboxyl group, and cyano group.

As the halogen atom in the substituent which may be carried on the trivalent aromatic hydrocarbon group and the trivalent heterocyclic group, fluorine, chlorine, bromine, and iodine are exemplified.

The alkyl group may be any of linear, branched or cyclic, and may have a substituent. The number of carbon atoms is usually about 1 to 20, and specific examples thereof include methyl group, ethyl group, propyl group, i-propyl group, butyl group, and i-butyl group, t-butyl group, pentyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group, etc.

The alkyloxy group may be any of linear, branched or cyclic, and may have a substituent. The number of carbon atoms is usually about 1 to 20, and specific examples thereof include methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyl octyloxy group, It exemplifies lauryloxy group, trifluoromethoxy group, pentafluoroethoxy group, perfluorobutoxy group, perfluorohexyl group, perfluoro octyl group, methoxymethyloxy group, 2-methoxy ethyloxy group, etc.

The alkylthio group may be any of linear, branched or cyclic, and may have a substituent. The number of carbon atoms is usually about 1 to 20, and specific examples thereof include methylthio group, ethylthio group, propylthio group, i-propylthio group, butylthio group, i-butylthio group, t-butylthio group, pentylthio group, hexylthio group, the cyclo hexylthio group, heptylthio group, octylthio group, 2-ethylhexylthio group, nonylthio group, decylthio group, 3,7-dimethyl octylthio group, laurylthio group, trifluoromethylthio group, etc.

The aryl group may have a substituent. The number of carbon atoms is usually about 3 to 60, and specific examples thereof include phenyl group, and $C_1$-$C_{12}$ alkoxyphenyl group ($C_1$-$C_{12}$ represents the number of carbon atoms 1-12. Hereafter the same), $C_1$-$C_{12}$ alkyl phenyl group, 1-naphtyl group, 2-naphtyl group, pentafluoro phenyl group, pyridyl group, pyridazinyl group, pyrimidyl group, pyrazyl group, triazyl group, etc.

The aryloxy group may have a substituent on the aromatic ring. The number of carbon atoms is usually about 3 to 60, and specific examples thereof include phenoxy group, $C_1$-$C_{12}$ alkoxy phenoxy group, $C_1$-$C_{12}$ alkylphenoxy group, 1-naphtyloxy group, 2-naphtyloxy group, pentafluorophenyloxy group, pyridyloxy group, pyridazinyloxy group, pyrimidyloxy group, pyrazyloxy group, triazyloxy group, etc.

The arylthio group may have a substituent on the aromatic ring. The number of carbon atoms is usually about 3 to 60, and specific examples thereof include phenylthio group, $C_1$-$C_{12}$ alkoxyphenylthio group, $C_1$-$C_{12}$ alkylphenylthio group, 1-naphthylthio group, 2-naphthylthio group, pentafluoro phenylthio group, pyridylthio group, pyridazinylthio group, pyrimidylthio group, pyrazylthio group, triazylthio group, etc.

The arylalkyl group may have a substituent, the number of carbon atoms is usually about 7 to 60, and specific examples thereof include phenyl-$C_1$-$C_{12}$ alkyl group, $C_1$-$C_{12}$ alkoxyphenyl-$C_1$-$C_{12}$ alkyl group, $C_1$-$C_{12}$ alkylphenyl-$C_1$-$C_{12}$ alkyl group, 1-naphtyl-$C_1$-$C_{12}$ alkyl group, 2-naphtyl-$C_1$-$C_{12}$ alkyl group, etc.

The arylalkyloxy group may have a substituent, the number of carbon atoms is usually about 7 to 60, and specific examples thereof include phenyl-$C_1$-$C_{12}$ alkoxy group, $C_1$-$C_{12}$ alkoxyphenyl-$C_1$-$C_{12}$ alkoxy group, $C_1$-$C_{12}$ alkylphenyl-$C_1$-$C_{12}$ alkoxy group, 1-naphtyl-$C_1$-$C_{12}$ alkoxy group, 2-naphtyl-$C_1$-$C_{12}$ alkoxy group, etc.

The arylalkylthio group may have a substituent, the number of carbon atoms is usually about 7 to 60, and specific examples thereof include phenyl-$C_1$-$C_{12}$ alkylthio group, $C_1$-$C_{12}$ alkoxy phenyl-$C_1$-$C_{12}$ alkylthio group, $C_1$-$C_{12}$ alkylphenyl-$C_1$-$C_{12}$ alkylthio group, 1-naphtyl-$C_1$-$C_{12}$ alkylthio group, 2-naphtyl-$C_1$-$C_{12}$ alkylthio group, etc.

The acyl group has usually about 2 to 20 carbon atoms, and specific examples thereof include acetyl group, propionyl group, butyryl group, isobutyryl group, pivaloyl group, benzoyl group, trifluoroacetyl group, pentafluorobenzoyl group, etc.

The acyloxy group has usually about 2 to 20 carbon atoms, and specific examples thereof include acetoxy group, propionyloxy group, butyryloxy group, isobutyryloxy group, pivaloyloxy group, benzoyloxy group, trifluoro acetyloxy group, pentafluorobenzoyloxy group, etc.

The amide group has usually about 2 to 20 carbon atoms, and specific examples thereof include formamide group, acetamide group, propioamide group, butyroamide group, benzamide group, trifluoroacetamide group, pentafluoro benzamide group, diformamide group, diacetoamide group, dipropioamide group, dibutyroamide group, dibenzamide group, ditrifluoro acetamide group, dipentafluorobenzamide group, etc.

Examples of the acid imide group include residual groups in which a hydrogen atom connected with nitrogen atom is removed, and have usually about 2 to 60 carbon atoms, preferably 2 to 48 carbon atoms. As the concrete examples of acid imide group, the following groups are exemplified.

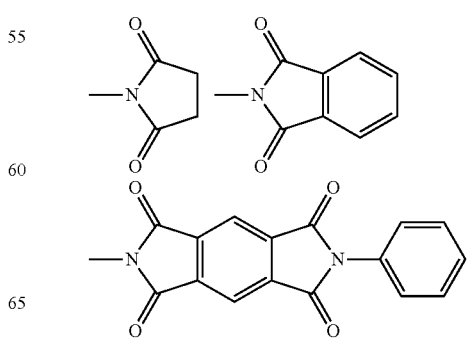

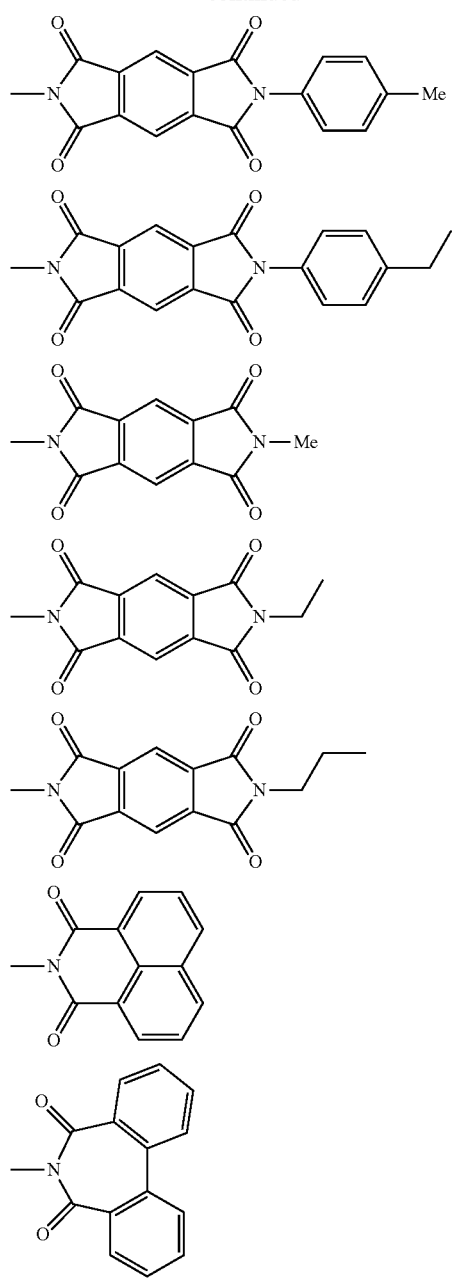

Imine residue is a residue in which a hydrogen atom is removed from an imine compound (an organic compound having —N=C— is in the molecule. Examples thereof include aldimine, ketimine, and compounds whose hydrogen atom on N is substituted with an alkyl group etc.), and usually has about 2 to 20 carbon atoms, preferably 2 to 18 carbon atoms. As the concrete examples, groups represented by below structural formulas are exemplified.

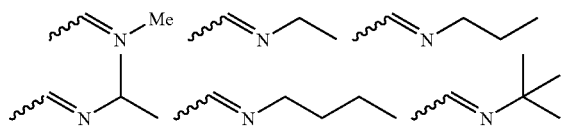

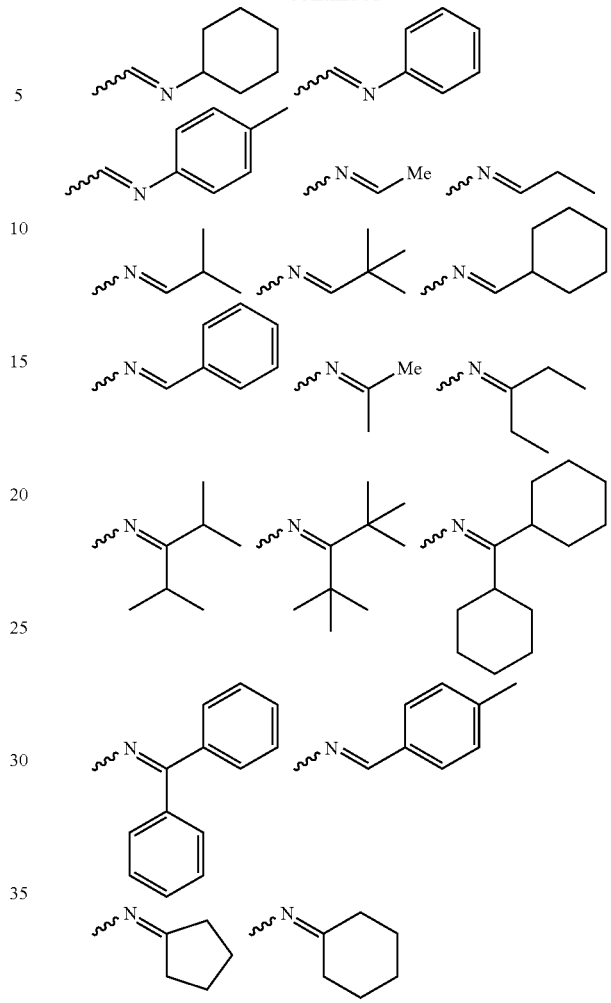

The substituted amino group includes an amino group substituted by 1 or 2 groups selected from an alkyl group, aryl group, arylalkyl group, or monovalent heterocyclic group. Said alkyl group, aryl group, arylalkyl group, or monovalent heterocyclic group may have a substituent.

The number of carbon atoms is usually about 1 to 40, and specific examples thereof include methylamino group, dimethylamino group, ethylamino group, diethylamino group, propylamino group, dipropylamino group, isopropylamino group, diisopropylamino group, butylamino group, isobutylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclo pentylamino group, cyclohexylamino group, dicyclohexylamino group, pyrrolidyl group, piperidyl group, ditrifluoromethylamino group, phenylamino group, diphenylamino group, $C_1$-$C_{12}$ alkoxy phenylamino group, di($C_1$-$C_{12}$ alkoxyphenyl) amino group, di($C_1$-$C_{12}$ alkylphenyl)amino group, 1-naphtylamino group, 2-naphtylamino group, pentafluorophenylamino group, pyridylamino group, pyridazinylamino group, pyrimidylamino group, pyrazylamino group, triazylamino group, phenyl-$C_1$-$C_{12}$ alkylamino group, $C_1$-$C_{12}$ alkoxyphenyl-$C_1$-$C_{12}$ alkylamino group, $C_1$-$C_{12}$ alkylphenyl-$C_1$-$C_{12}$ alkylamino group, di($C_1$-$C_{12}$ alkoxy phenyl-$C_1$-$C_{12}$ alkyl)

amino group, di($C_1$-$C_{12}$ alkylphenyl-$C_1$-$C_{12}$ alkyl)amino group, 1-naphtyl-$C_1$-$C_{12}$ alkylamino group, 2-naphtyl-$C_1$-$C_{12}$ alkylamino group, etc.

The substituted silyl group includes a silyl group substituted by 1, 2 or 3 groups selected from an alkyl group, aryl group, arylalkyl group, or monovalent heterocyclic group. The number of carbon atoms is usually about 1 to 60, and preferably 3 to 30. Said alkyl group, aryl group, arylalkyl group, or monovalent heterocyclic group may have a substituent.

Specific examples thereof include trimethylsilyl group, triethylsilyl group, tri-n-propylsilyl group, tri-1-propylsilyl group, t-butylsilyl dimethylsilyl group, triphenylsilyl group, tri-p-xylylsilyl group, tri benzylsilyl group, diphenylmethylsilyl group, t-butyldiphenylsilyl group, dimethylphenylsilyl group, etc.

The substituted silyloxy group includes a silyloxy group ($H_3SiO$—) silyl group substituted by 1, 2 or 3 groups selected from an alkyl group, aryl group, arylalkyl group, or monovalent heterocyclic group. The number of carbon atoms is usually about 1 to 60, and preferably 3 to 30. Said alkyl group, aryl group, arylalkyl group, or monovalent heterocyclic group may have a substituent.

Specific examples thereof include trimethylsilyloxy group, triethylsilyloxy group, tri-n-propylsilyloxy group, tri-1-propylsilyloxy group, t-butylsilyl dimethylsilyloxy group, triphenylsilyloxy group, tri-p-xylylsilyloxy group, tri benzylsilyloxy group, diphenyl methylsilyloxy group, t-butyl diphenylsilyloxy group, dimethylphenylsilyloxy group, etc.

The substituted silylthio group includes a silylthio group ($H^3SiS$—) substituted by 1, 2 or 3 groups selected from an alkyl group, aryl group, arylalkyl group, or monovalent heterocyclic group. The number of carbon atoms is usually about 1 to 60, and preferably 3 to 30. Said alkyl group, aryl group, arylalkyl group, or monovalent heterocyclic group may have a substituent.

Specific examples thereof include trimethylsilylthio group, triethylsilylthio group, tri-n-propylsilylthio group, tri-1-propylsilylthio group, t-butylsilyl dimethylsilylthio group, triphenylsilylthio group, tri-p-xylylsilylthio group, tribenzylsilylthio group, diphenylmethylsilylthio group, t-butyldiphenylsilylthio group, dimethylphenylsilylthio group, etc.

The substituted silylamino group has one or two Si atoms which bond to N, and examples of the groups which bond to Si include a silylamino group (H3SiNH— or (H3Si)2N—) which is substituted by 1 to 6 groups selected from an alkyl group, aryl group, arylalkyl group, or monovalent heterocyclic group. The number of carbon atoms is usually about 1 to 120, and preferably 3 to 60. Said alkyl group, aryl group, arylalkyl group, or monovalent heterocyclic group may have a substituent.

Specific examples thereof include trimethylsilylamino group, triethylsilylamino group, tri-n-propylsilylamino group, tri-1-propylsilylamino group, t-butylsilyl dimethylsilylamino group, triphenylsilylamino group, tri-p-xylylsilylamino group, tribenzylsilylamino group, diphenyl methylsilylamino group, t-butyl diphenylsilylamino group, Dimethylphenylsilylamino group, di(trimethylsilyl)amino group, di(triethylsilyl)amino group, di(tri-n-propylsilyl)amino group, di(tri-1-propylsilyl)amino group, di(t-butylsilyldimethylsilyl)amino group, di(triphenylsilyl)amino group, di(tri-p-xylylsilyl)amino group, di(tribenzylsilyl)amino group, di(diphenyl methylsilyl)amino group, di(t-butyldiphenylsilyl)amino group, di(dimethylphenylsilyl)amino group, etc.

The monovalent heterocyclic group means an atomic group in which a hydrogen atom is removed from a heterocyclic compound, the number of carbon atoms is usually about 4 to 60, and specific examples thereof include thienyl group, $C_1$-$C_{12}$ alkylthienyl group, pyroryl group, furyl group, pyridyl group, $C_1$-$C_{12}$ alkyl pyridyl group, imidazolyl group, pyrazolyl group, triazolyl group, oxazolyl group, thiazole group, thiadiazole group, etc.

Examples of the monovalent heterocyclic group in the hetero aryloxy group (the group represented by $Q^1$-O—, and $Q^1$ represents a monovalent heterocyclic group), hetero arylthio group (the group represented by $Q^2$-S—, and $Q^2$ represents a monovalent heterocyclic group), and hetero aryloxycarbonyl group (the group represented by $Q^3$-O (C=O)—, and $Q^3$ represents a monovalent heterocyclic group), include the groups exemplified as the above monovalent heterocyclic group.

Examples of the aryl groups in arylalkenyl group and arylethynyl group include the same group with the above aryl group.

The alkenyl group in arylalkenyl group has usually about 2 to 20 carbon atoms, and examples thereof include vinyl group, 1-propyrenyl group, 2-propyrenyl group, 3-propyrenyl group, butenyl group, pentenyl group, hexenyl group, heptenyl group, octenyl group, cyclohexenyl group, 1,3-butadienyl group, etc.

Examples of the alkoxy group in alkoxy carbonyl group include the groups exemplified as the above alkoxy group.

Examples of the aryloxy group in aryloxy carbonyl group include the groups exemplified as the above aryloxy group.

Examples of the alkyloxy group in arylalkyloxy carbonyl group include the groups exemplified as the above arylalkyloxy carbonyl group.

Examples of the hetero aryloxy group in hetero aryloxy carbonyl group include the groups exemplified as the above hetero aryloxy group.

The definition and the concrete examples of: the halogen atom, alkyl group, alkoxy group, alkylthio group, alkylamino group, aryl group, aryloxy group, arylthio group, arylamino group, arylalkyl group, arylalkoxy group, arylalkylthio group, arylalkylamino group, acyloxy group, amide group, arylalkenyl group, arylalkynyl group, monovalent heterocyclic group in the above R'; and the alkyl group, aryl group, arylalkyl group, substituted silyl group, acyl group or monovalent heterocyclic group, hetero aryloxy group, hetero arylthio group in R"; are respectively the same with the definition and the concrete examples of the substituents which may be carried on the above trivalent aromatic hydrocarbon group.

In the above formula (1), $X^1$ and $X^2$ each independently represent O, S, C(=O), S(=O), $SO_2$, C($R^1$)($R^2$), Si($R^3$)($R^4$), N($R^5$)B($R^6$), P($R^7$) or P(=O)($R^8$). However, $X^1$ and $X^2$ are not the same except the case where they are S or Si($R^3$)($R^4$).

Wherein, $R^1$-$R^8$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, hetero aryloxy group, hetero arylthio, arylalkenyl group, arylethynyl group, carboxyl group, or cyano group. $R^1$ and $R^2$, and $R^3$ and $R^4$ respectively may be connected to form a ring.

When $R^1$ and $R^2$ are mutually be conneceded to form a ring in C($R^1$)($R^2$), or when $R^3$ and $R^4$ are mutually be connecteded to form a ring in Si($R^3$)($R^4$), the ring structure portions are specifically exemplified as follows.

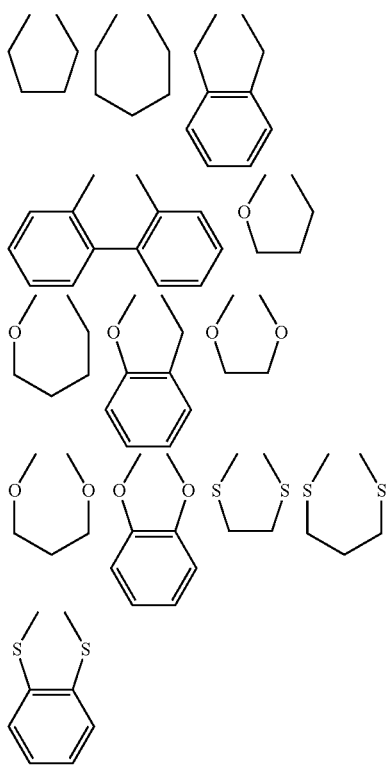

The definition and the concrete examples of the halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, hetero aryloxy group, hetero arylthio group, arylalkenyl group, and arylethynyl group in $R^1$-$R^8$ are respectively the same with the definition and the concrete examples of the substituents which may be carried on the above trivalent aromatic hydrocarbon group.

Among them, in view of high light emitting efficiency, $X^1$ of formula (1) is preferably $C(R^1)(R^2)$, $Si(R^3)(R^4)$, $N(R^5)$, $B(R^6)$, $P(R^7)$ or $P(=O)(R^8)$ (wherein, $R^1$-$R^8$ each independently represent the same meaning as the above), and more preferably $C(R^1)(R^2)$.

As —$X^1$—$X^2$—, the groups shown by the following (26), (27), and (28) below are exemplified.

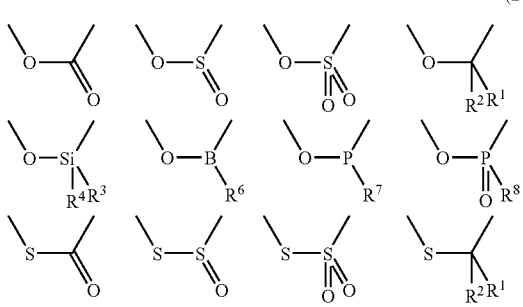
(26)

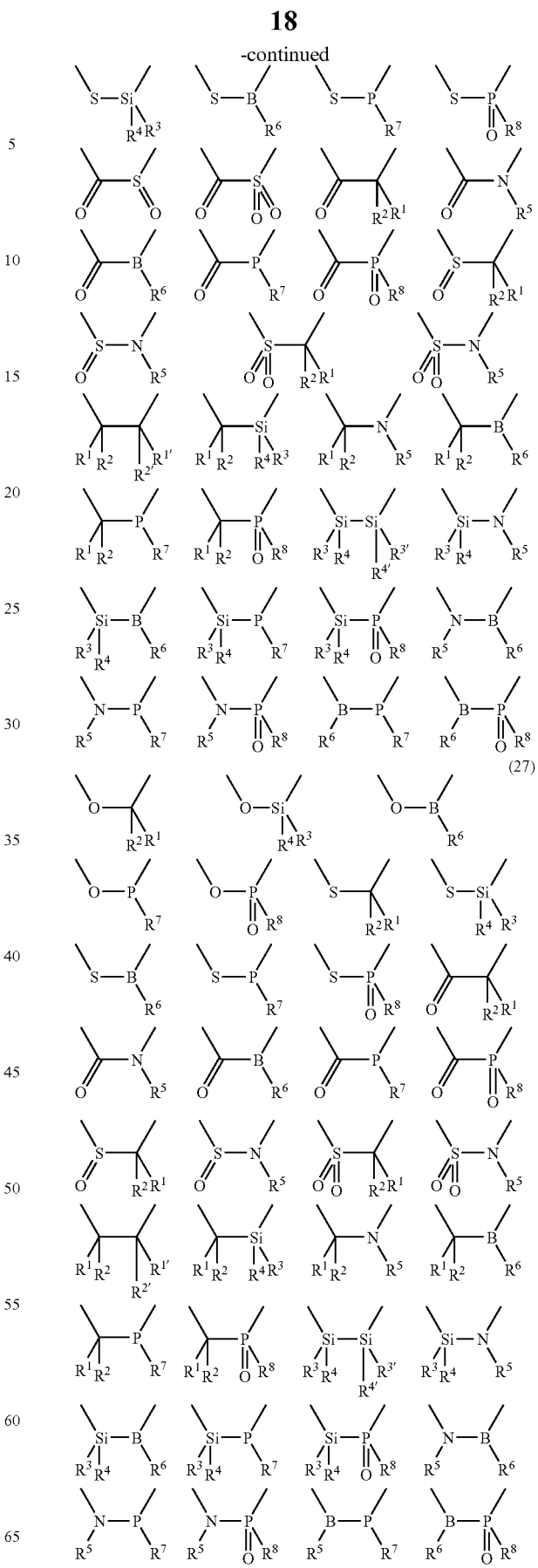
(27)

(28)
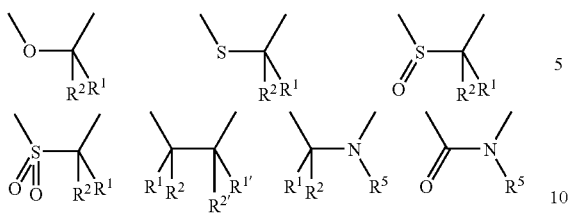
Among them, in view of stability of the compound, groups selected from (27) and (28) are preferable, and groups selected from (28) are more preferable.
Concrete Examples of the repeating units represented by formula (1) include groups represented by below formula (29)-(33), and groups carrying a substituent further on the aromatic hydrocarbon group or heterocycle rings.
(29)
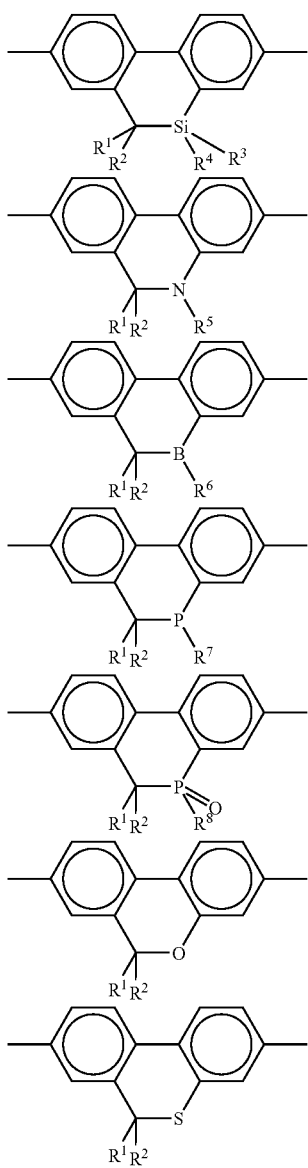
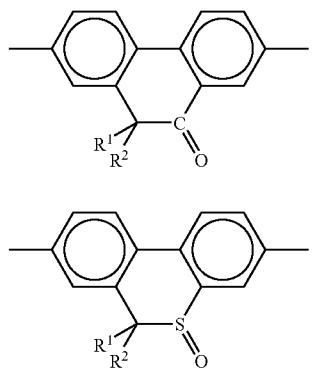
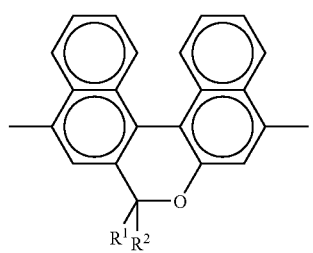
(30)

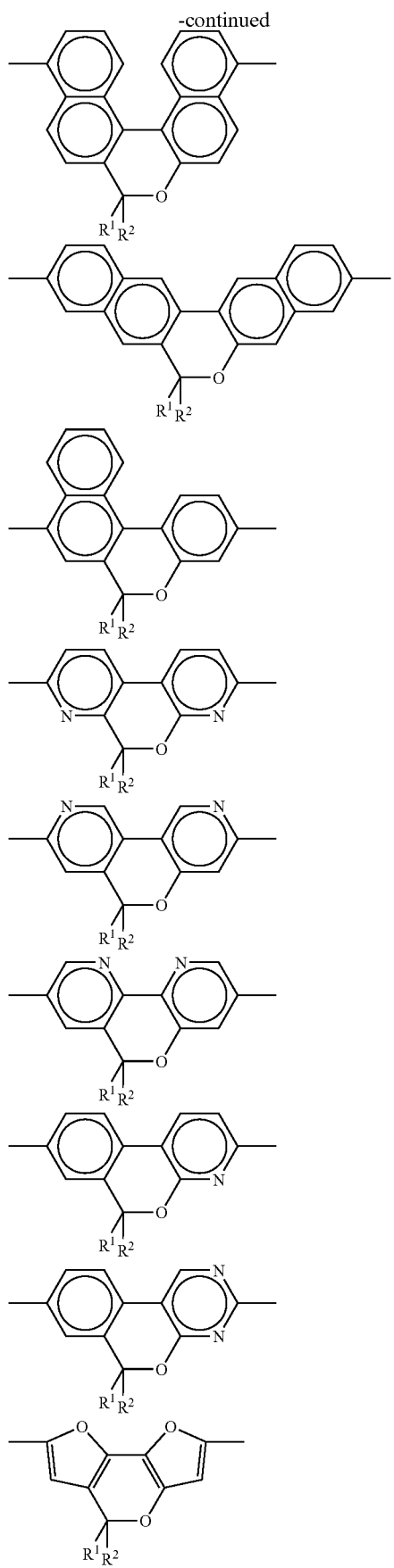
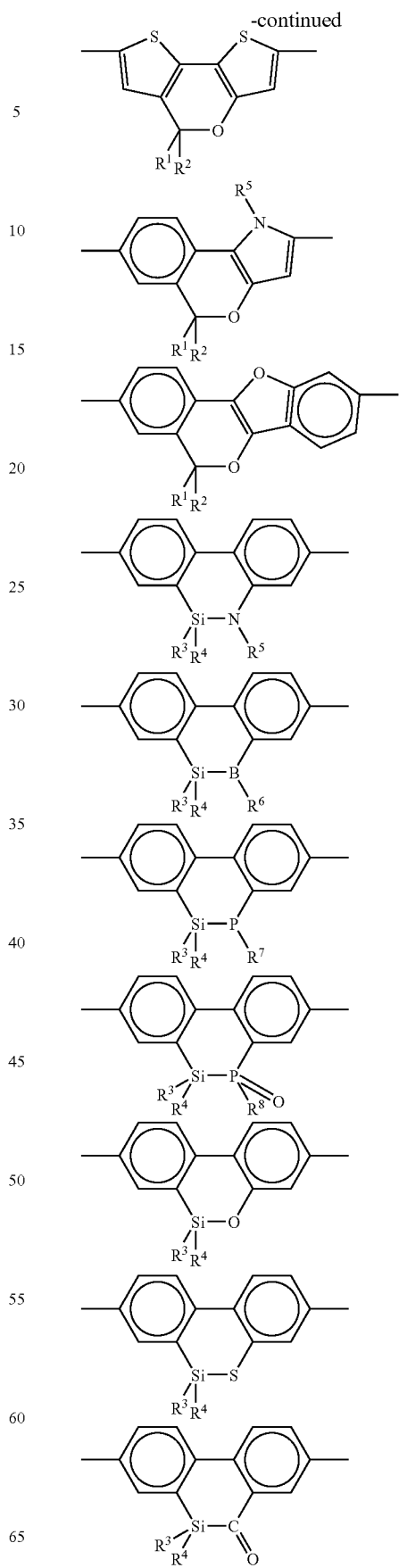

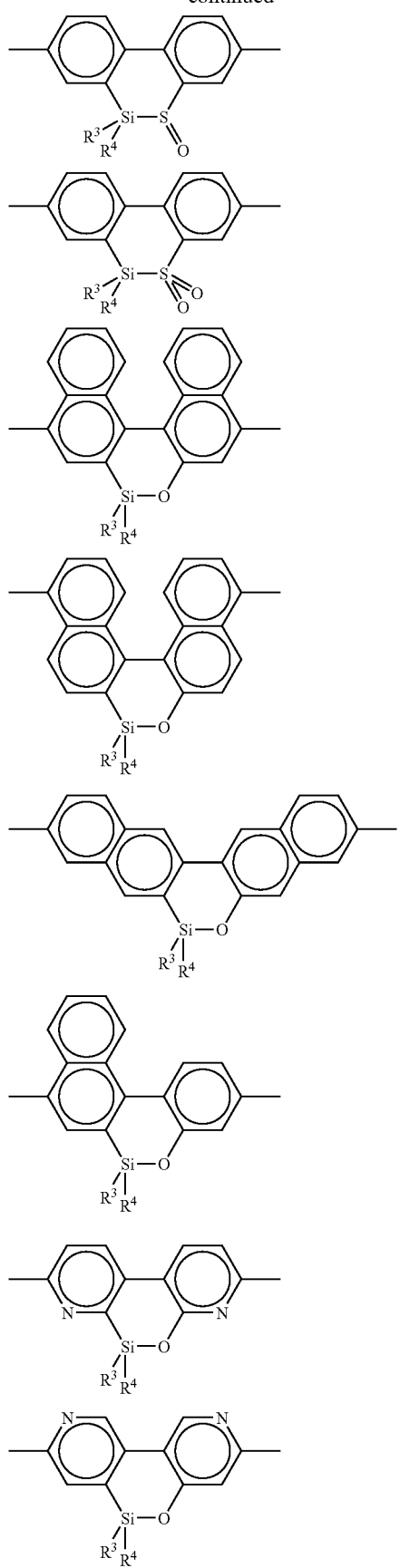
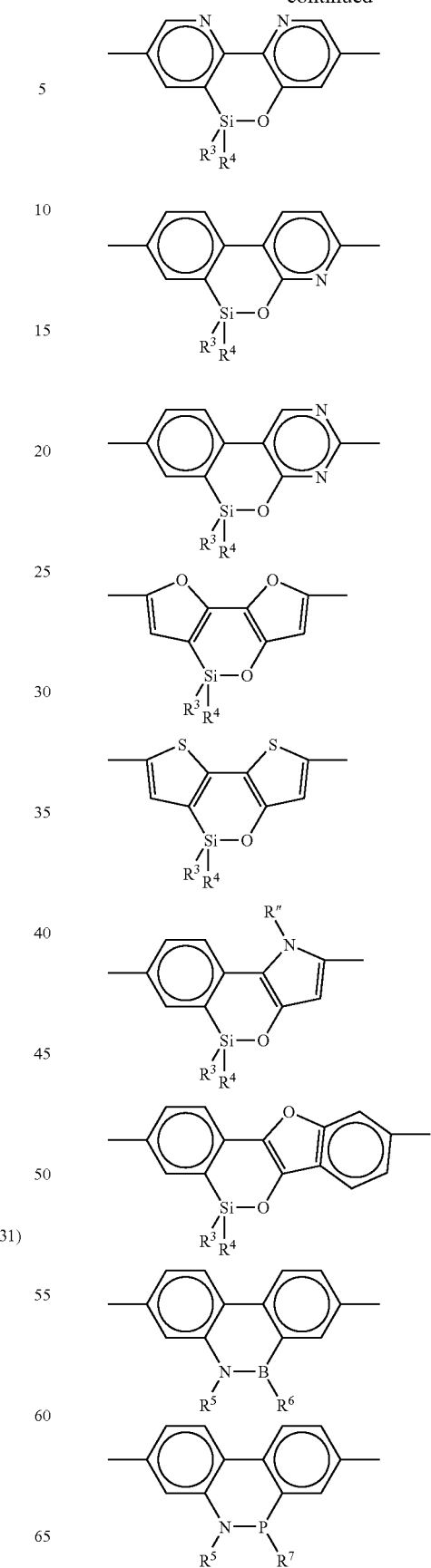

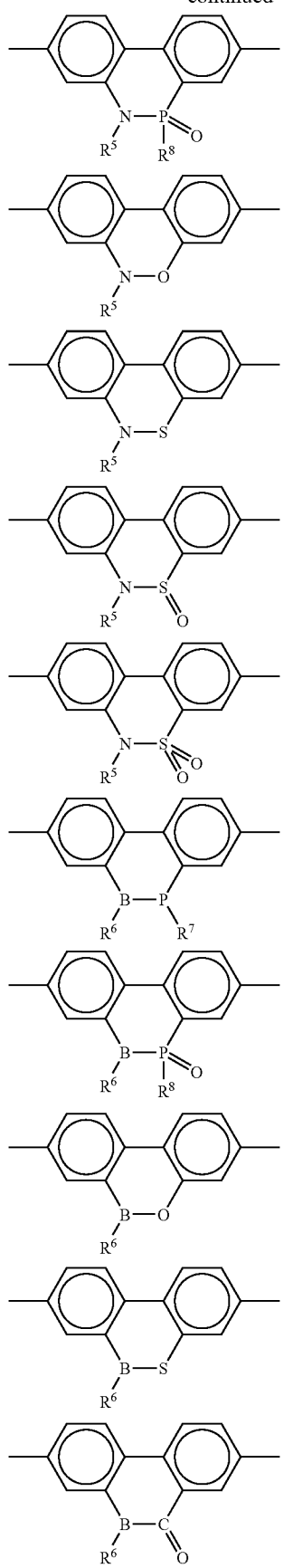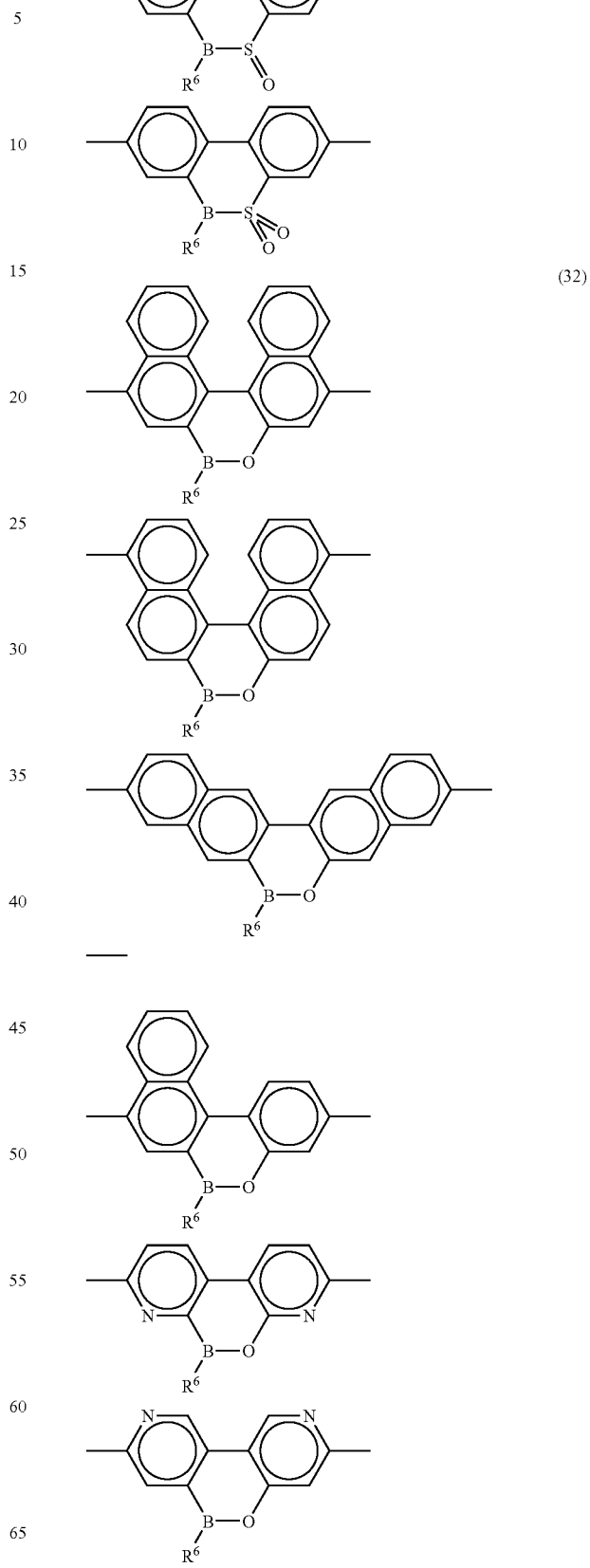

-continued
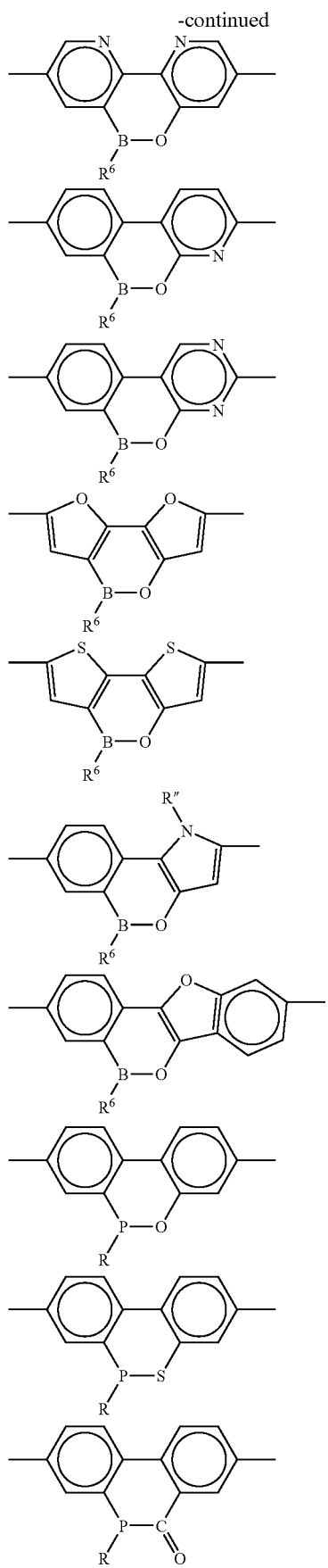
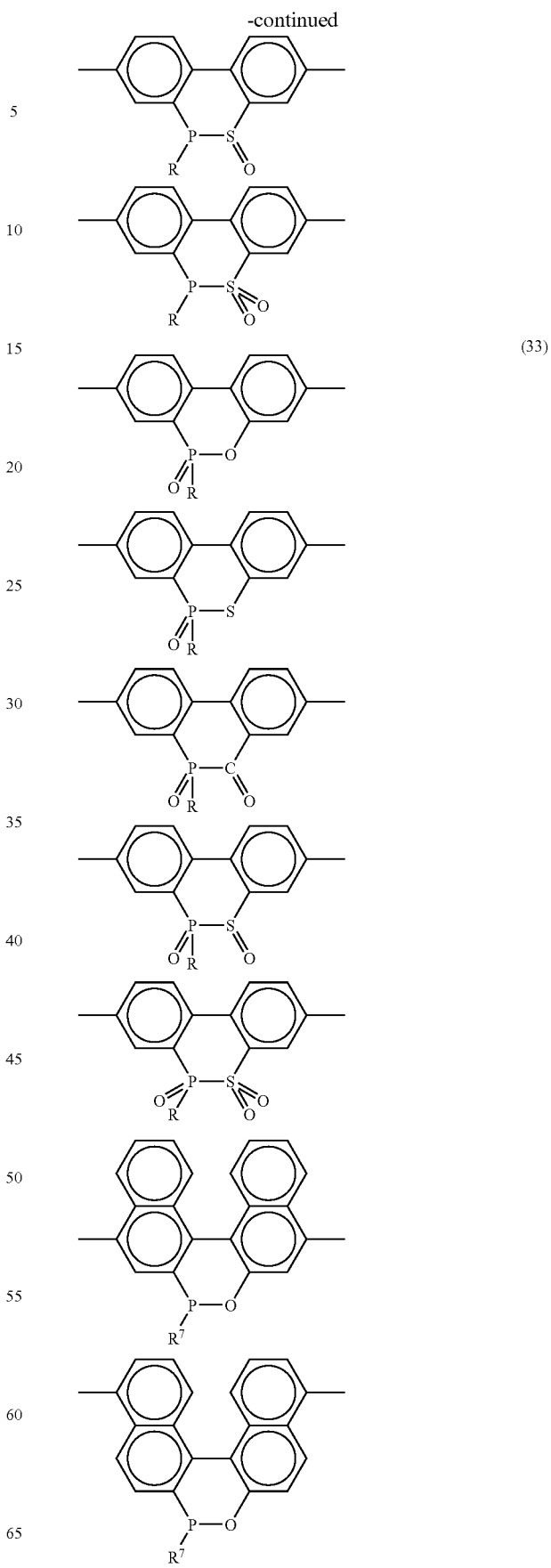
(33)

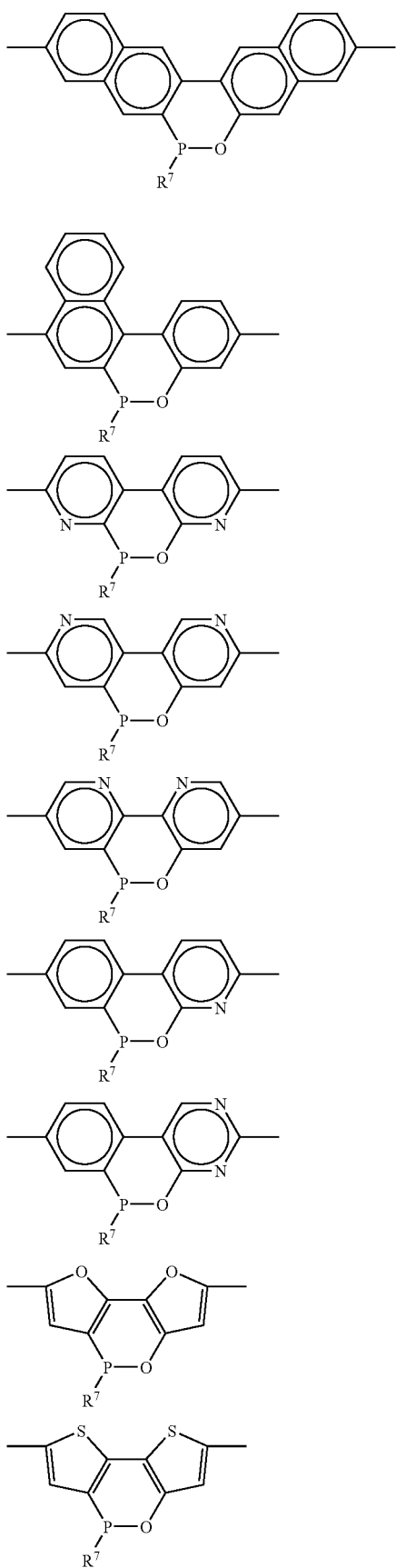

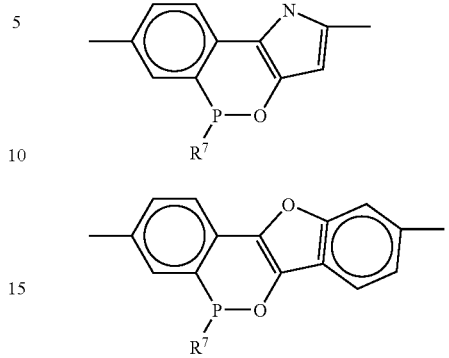

Among them, groups represented by formula (29)-(32), and groups carrying a substituent further on the aromatic hydrocarbon group or heterocycle rings are preferable, and groups represented by formula (29), and groups carrying a substituent further on the aromatic hydrocarbon group or heterocycle rings are more preferable. Examples of the substituent include halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, or cyano group, and they may be connected mutually to form a ring.

Among the repeating units represented by the above formula (1), repeating units represented by the below formula (3) is preferable in view of light emitting efficiency.

(3)

Wherein, $Ar^1$ and $Ar^2$ represent the same meaning as the above. $R^{11}$ and $R^{12}$ each independently represent a hydrogen atom, halogen atom, alkyl group, aryl group, arylalkyl group, or monovalent heterocyclic group, and they may be connected mutually to form a ring. $X^5$ represents O, S, C(=O), S(=O), $SO_2$, $Si(R^3)(R^4)$, $N(R^5)$, $B(R^6)$, $P(R^7)$ or P(=O)($R^8$). (Wherein, $R^3$, $R^4$, $R^5$, $R^6$, $R^7$, and $R^8$ represent the same meaning as the above.) Repeating units represented by the below formula (4) are further preferable.

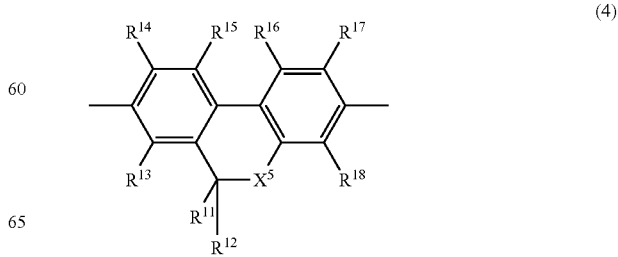

(4)

Wherein, $X^5$, $R^{11}$ and $R^{12}$ represent the same meaning as the above. $R^{13}$, $R^{14}$, $R^{15}$, $R^{16}$, $R^{17}$ and $R^{18}$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, alkoxy carbonyl group, aryloxy carbonyl group, arylalkyloxy carbonyl group, hetero aryloxy carbonyl group, or cyano group. $R^{14}$ and $R^{15}$, and $R^{16}$ and $R^{17}$ may be connected mutually to form a ring. When $R^{14}$ and $R^{15}$, and $R^{16}$ and $R^{17}$ are connected mutually to form a ring, the ring structure portions are specifically exemplified as follows.

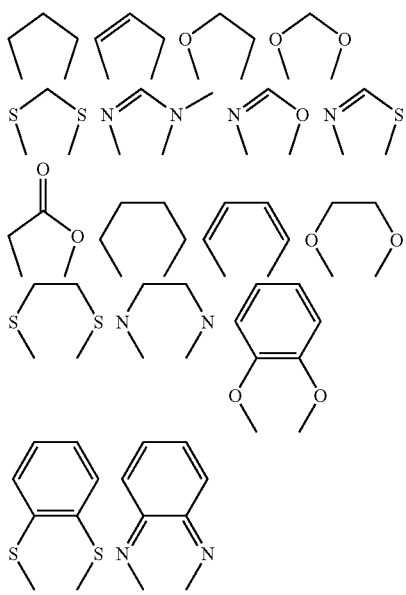

In view of easiness of the synthesis and light emitting efficiency, more preferable is the case where $X^5$ in the above formula (4) is oxygen atom.

Next, the repeating unit represented by the above formula (2) is explained.

$Ar^3$ and $Ar^4$ in the above formula (2) each independently represent a trivalent aromatic hydrocarbon group or a trivalent heterocyclic group.

The definition and the concrete examples of the trivalent aromatic hydrocarbon group and trivalent heterocyclic group are respectively the same with the definition and the concrete examples of those in formula (1).

$X^3$ and $X^4$ each independently represent N, B, P, $C(R^9)$ or $Si(R^{10})$. However, $X^3$ and $X^4$ are not the same.

Wherein, $R^9$ and $R^{10}$ each independently represent hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, alkoxy carbonyl group, aryloxy carbonyl group, arylalkyloxy carbonyl group, hetero aryloxy carbonyl group, or cyano group.

Among them, $X^3$ of formula (2) is preferably $C(R^9)$ or $Si(R^{10})$, and more preferably, $C(R^9)$. (Wherein, $R^9$ and $R^{10}$ each independently represent the same meaning as the above.)

Examples of $-X^3=X^4-$ in formula (2) include, for example, the groups represented by below formula (34), (35), or (36).

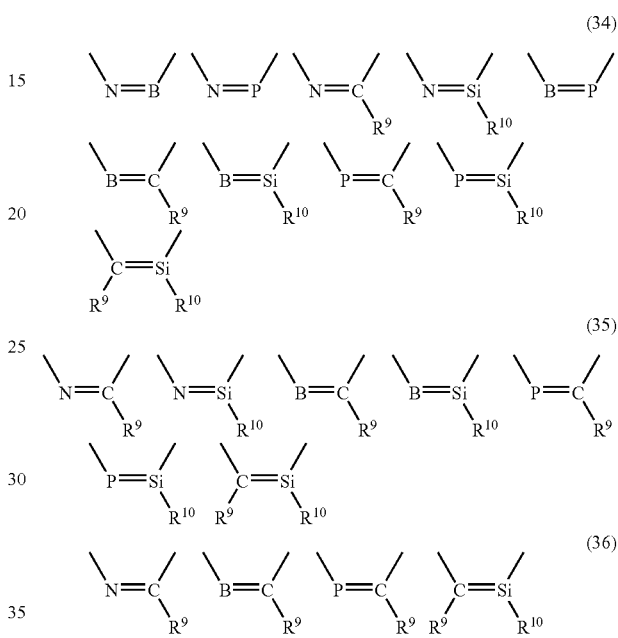

Among them, groups of (35) and (36) are preferable in view of the stability of those represented by formula (2), and groups of (36) are more preferable.

Concrete Examples of the repeating units represented by formula (2) include groups represented by below formula (37), (38) and (39), and groups carrying a substituent further on the aromatic hydrocarbon group or heterocycle rings.

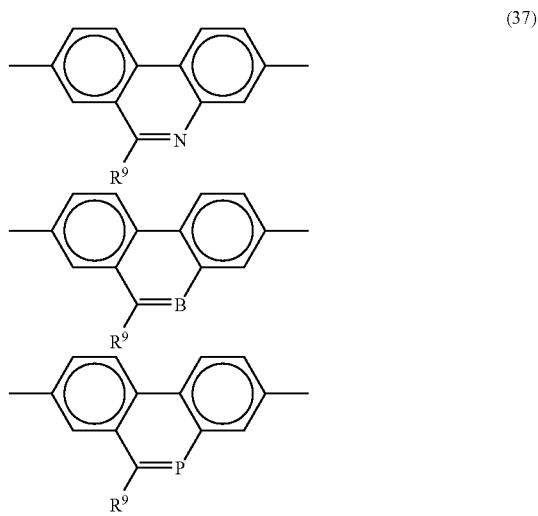

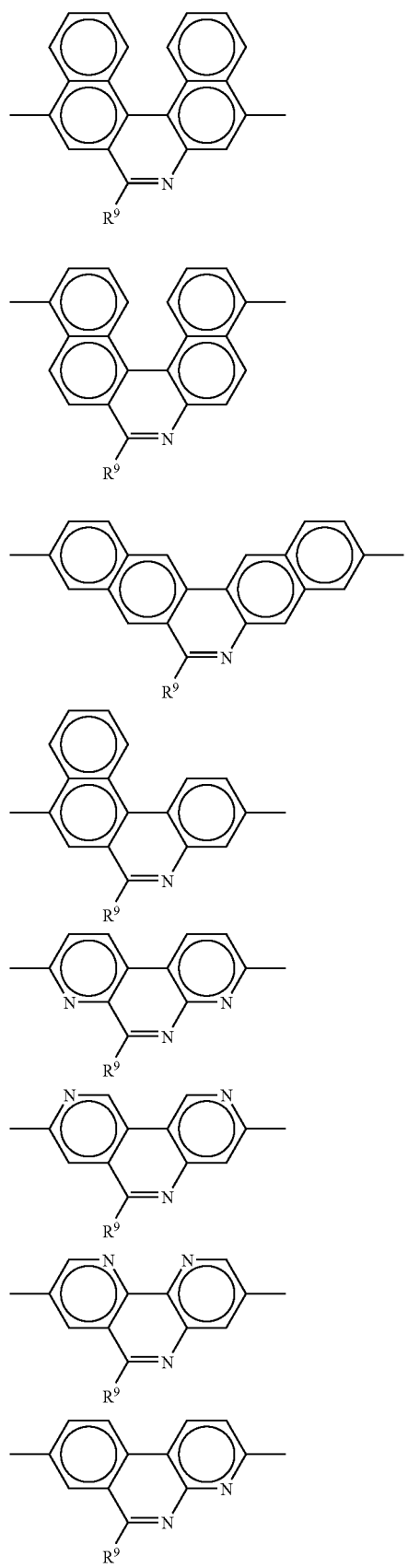
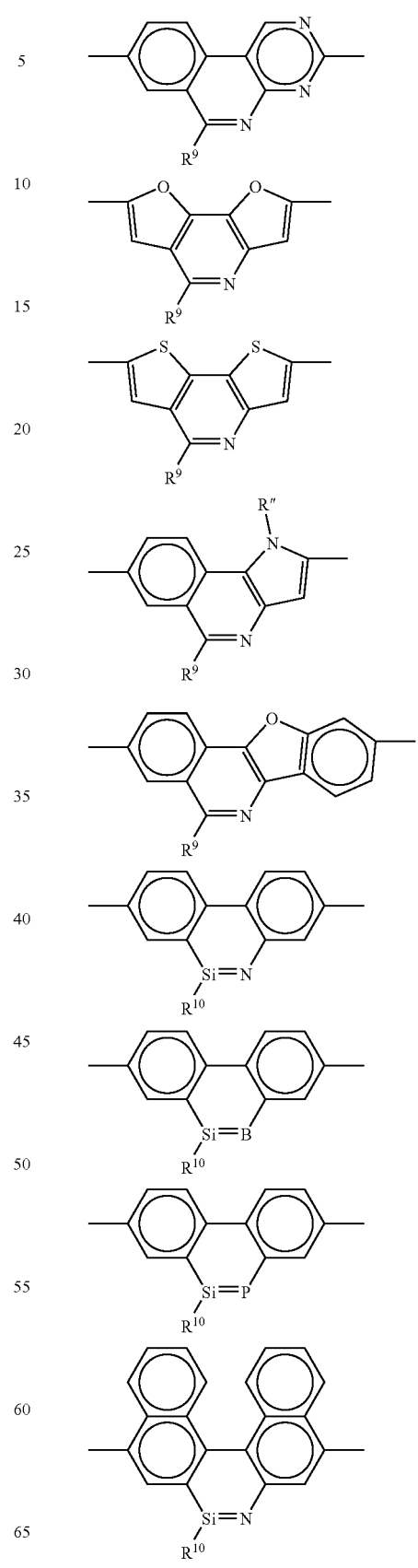

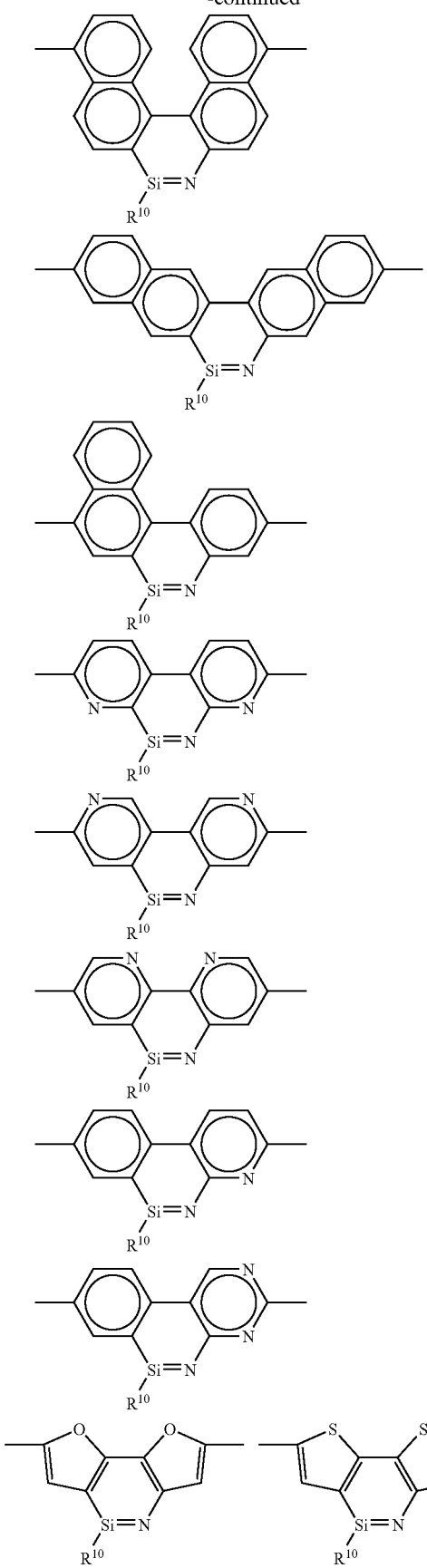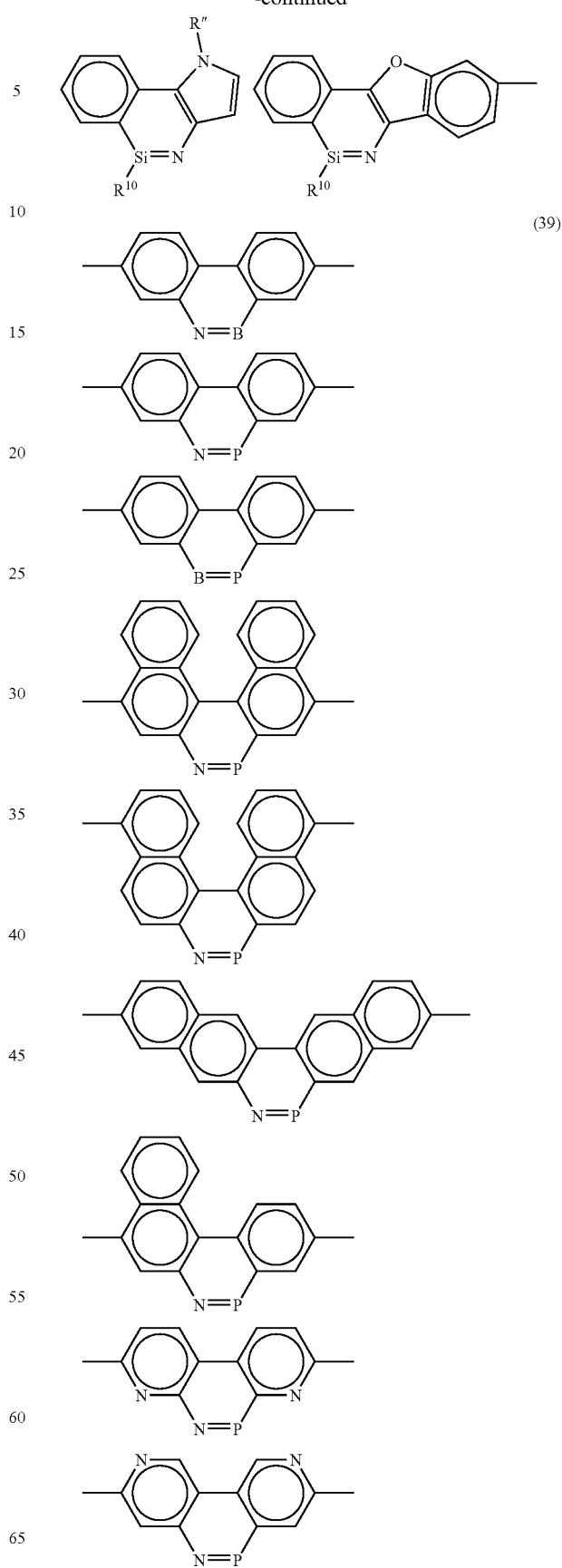

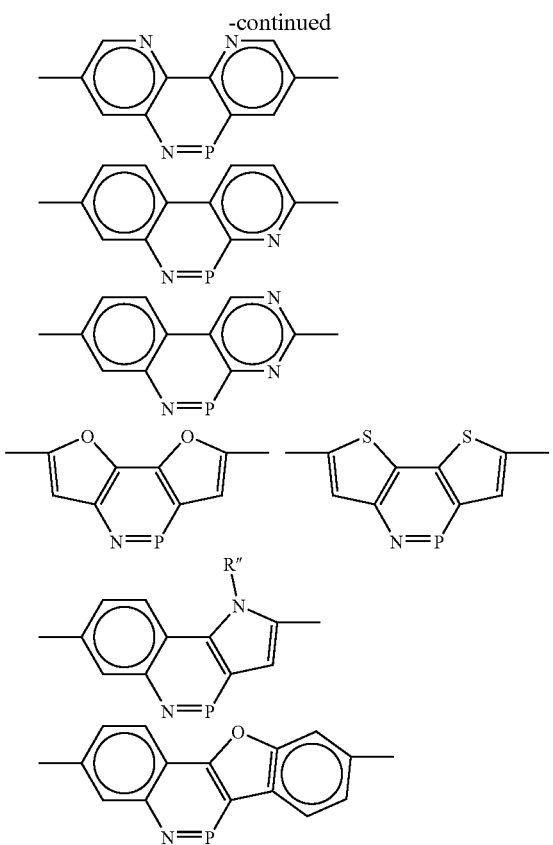

In case the groups represented by the above formulas (26)-formula (33) have substituents, examples of the substituents each independently include halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, or cyano group. They may be mutually be conneceted to form a ring.

The polymer compound used for the present invention may contain two or more kinds of repeating units represented by formula (1) and formula (2), respectively.

The polymer compound used for the present invention may contain repeating units other than the repeating unit represented by formula (1) and formula (2) within a range of not injuring the light-emitting characteristic or the charge transporting characteristic. Moreover, the total of the repeating units represented by formula (1) and formula (2) is preferably 10% by mole or more based on all the repeating units, more preferably 50% by mole or more, and further preferably 80% by mole or more.

As for the polymer compound used for the present invention, it is preferable that the repeating unit represented by the below formula (5), formula (6), formula (7) or formula (8) is contained in addition to the repeating unit represented by the formula (1) and (2), from the viewpoint of improving light emitting efficiency.

$$—Ar^5— \tag{5}$$

$$—Ar^5—X^6—(Ar^6—X^7)_a—Ar^7— \tag{6}$$

$$—Ar^5—X^7— \tag{7}$$

$$—X^7— \tag{8}$$

Wherein, $Ar^5$, $Ar^6$ and $Ar^7$ each independently represent an arylene group or a divalent heterocyclic group. $X^6$ represents —C≡C—, —N($R^{21}$)— or —(Si$R^{22}R^{23}$)$_{yb}$—. $X^7$ represents —C$R^{19}$=C$R^{20}$—, —N($R^{21}$)— or —(Si$R^{22}R^{23}$)$_{yb}$—. $R^{19}$ and $R^{20}$ each independently represent a hydrogen atom, alkyl group, aryl group, monovalent heterocyclic group, carboxyl group, substituted carboxyl group, or cyano group. $R^{21}$, $R^{22}$ and $R^{23}$ each independently represent a hydrogen atom, alkyl group, aryl group, monovalent heterocyclic group, or arylalkyl group. a represents an integer of 0 to 1. b represents an integer of 1 to 12.

The arylene group is an atomic group in which two hydrogen atoms of an aromatic hydrocarbon are removed, and usually, the number of carbon atoms is about 6 to 60, and preferably 6 to 20. The aromatic hydrocarbon includes those having a condensed ring, an independent benzene ring, or two or more condensed rings bonded through groups, such as a direct bond or a vinylene group.

Examples of the arylene group include phenylene group (for example, following formulas 1-3), naphthalenediyl group (following formulas 4-13), anthracenylene group (following formulas 14-19), biphenylene group (following formulas 20-25), fluorene-diyl group (following formulas 36-38), terphenyl-diyl group (following formulas 26-28), stilbene-diyl (following formulas A-D), distilbene-diyl (following formulas E,F), condensed ring compound group (following formulas 29-38), etc. Among them, phenylene group, biphenylene group, fluorene-diyl group and stilbene-diyl group are preferable.

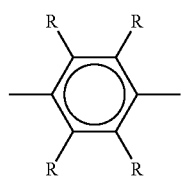

1

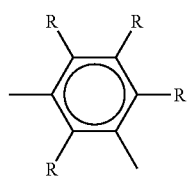

2

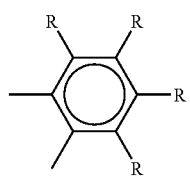

3

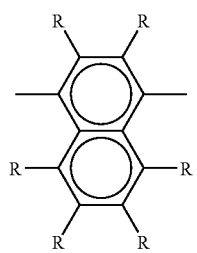

4

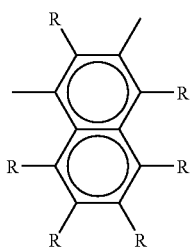
5
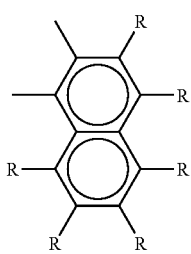
6
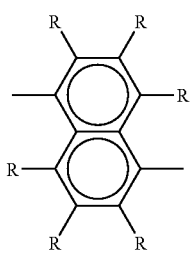
7
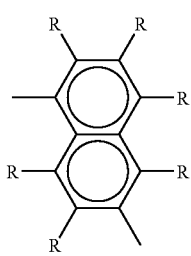
8
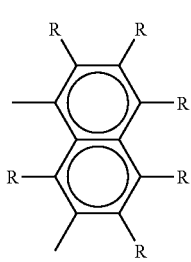
9
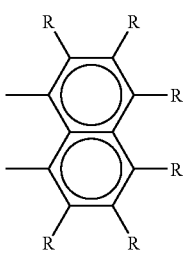
10
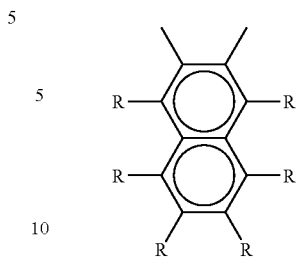
11
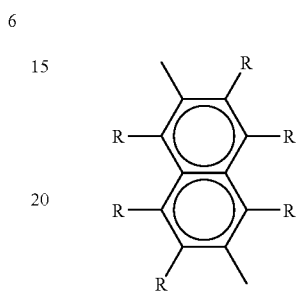
12
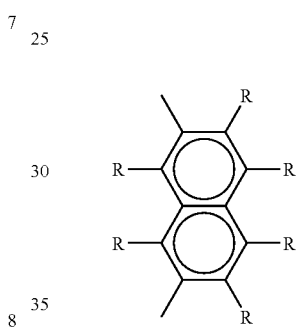
13
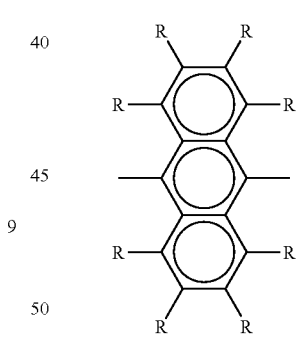
14
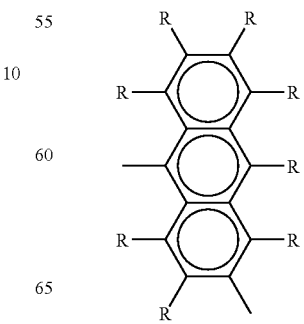
15

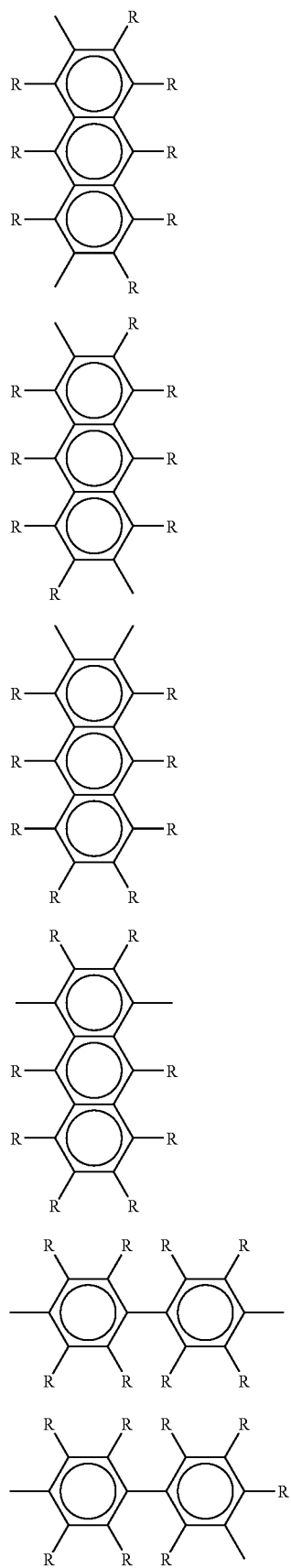
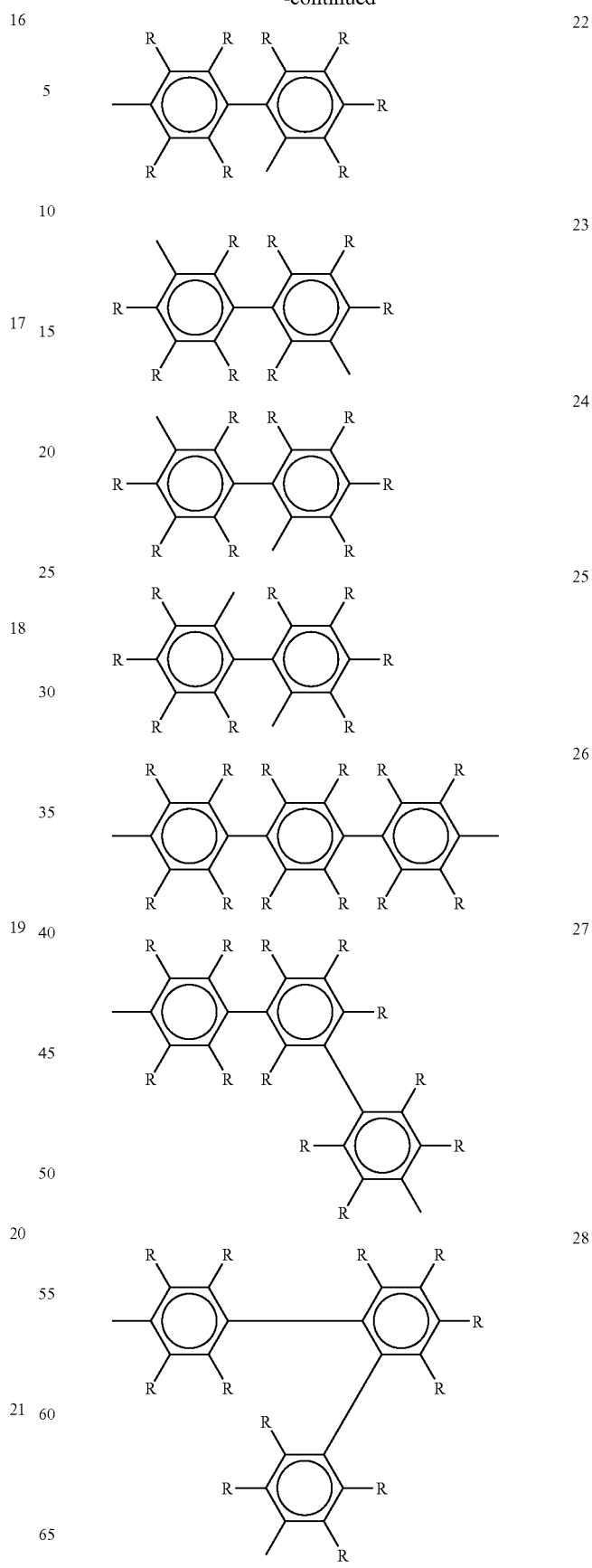

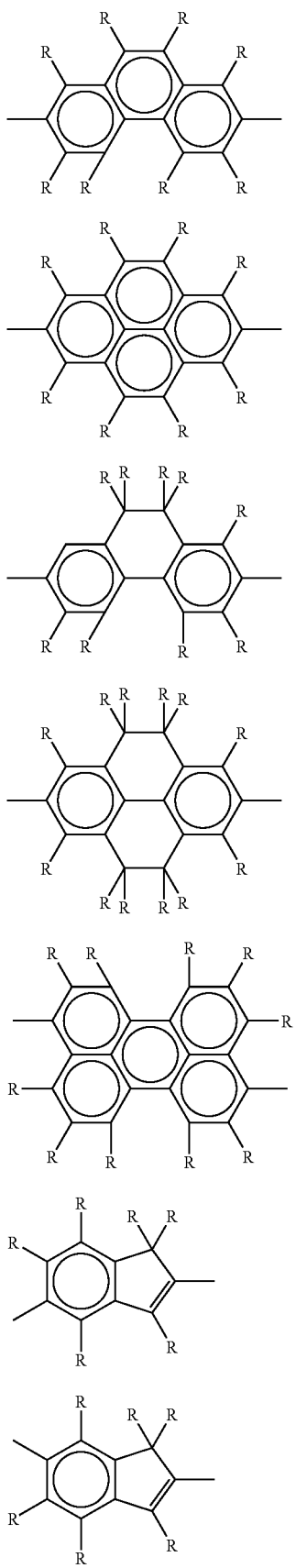
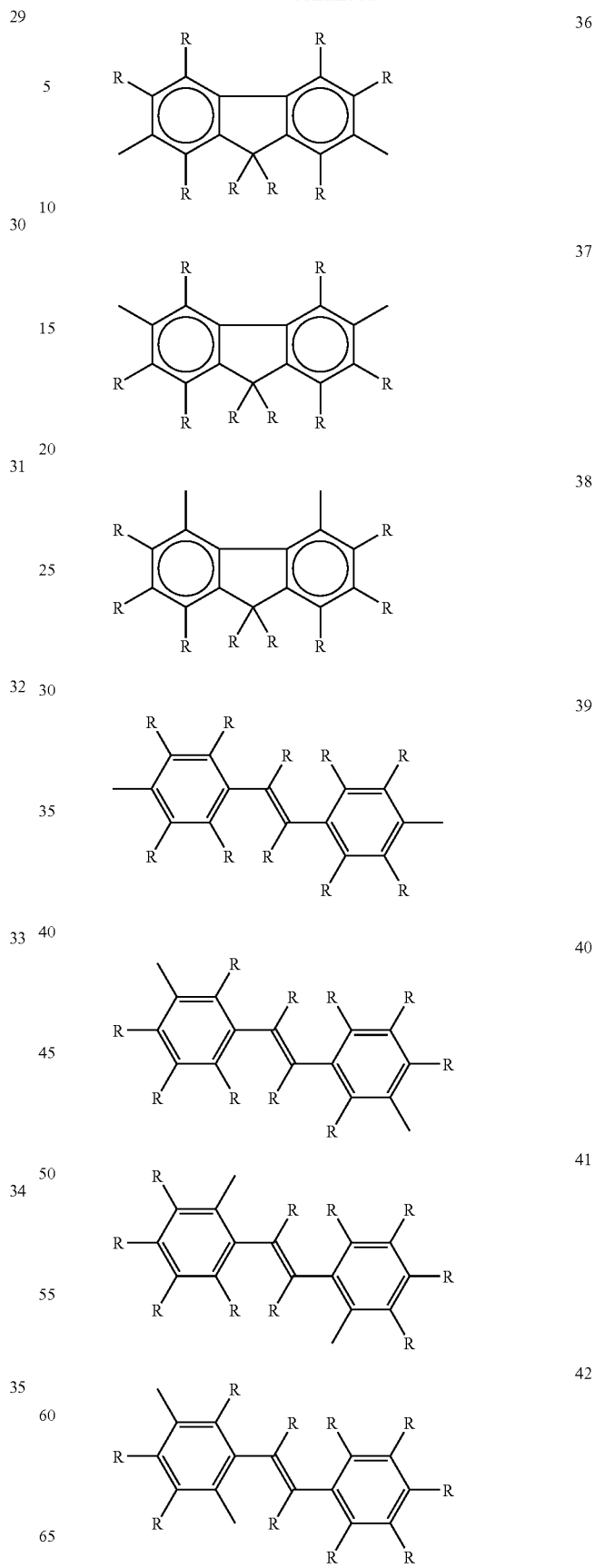

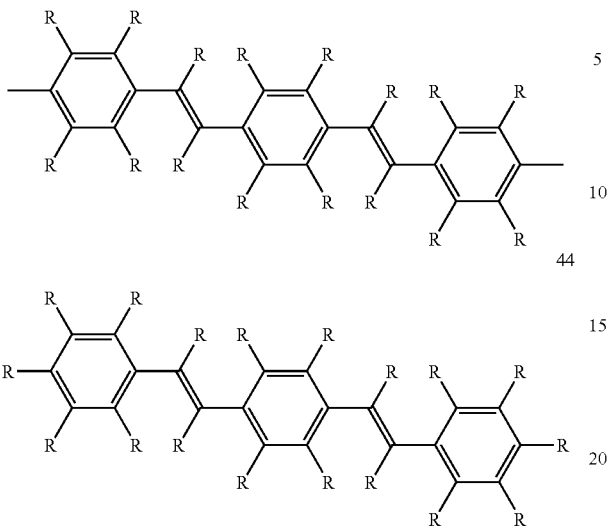

43

44

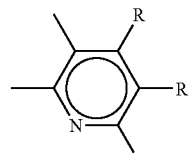
45

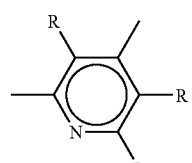
46

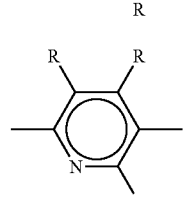
47

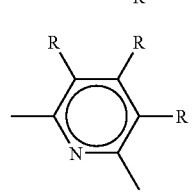
48

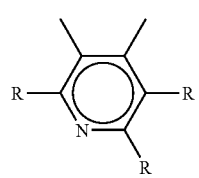
49

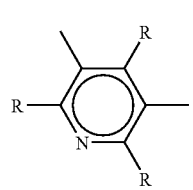
50

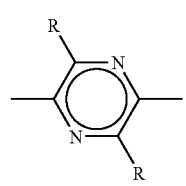
51

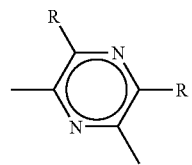
52

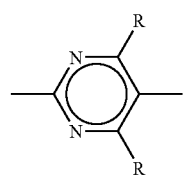
53

The divalent heterocyclic group means an atomic group in which two hydrogen atoms are removed from a heterocyclic compound, and the number of carbon atoms is usually about 3 to 60.

The heterocyclic compound means an organic compound having a cyclic structure in which at least one heteroatom such as oxygen, sulfur, nitrogen, phosphorus, boron, etc. is contained in the cyclic structure as the element other than carbon atoms.

Examples of the divalent heterocyclic groups include the followings.

Divalent heterocyclic groups containing nitrogen as a hetero atom; pyridine-diyl group (following formulas 45-50), diaza phenylene group (following formulas 51-54), quinolinediyl group (following formulas 55-69), quinoxalinediyl group (following formulas 70-74), acridinediyl group (following formulas 75-78), bipyridyldiyl group (following formulas 79-84), phenanthrolinediyl group (following formulas 82-84), etc.

Groups having a fluorene structure containing silicon, nitrogen, selenium, etc. as a hetero atom (following formulas 85-96).

5 membered heterocyclic groups containing silicon, nitrogen, sulfur, selenium, etc. as a hetero atom: (following formulas 97-101).

Condensed 5 membered heterocyclic groups containing silicon, nitrogen, selenium, etc. as a hetero atom: (following formulas 102-111), 5 membered heterocyclic groups containing silicon, nitrogen, sulfur, selenium, etc. as a hetero atom, which are connected at the a position of the hetero atom to form a dimer or an oligomer (following formulas 112-115);

5 membered ring heterocyclic groups containing silicon, nitrogen, sulfur, selenium, as a hetero atom is connected with a phenyl group at the a position of the hetero atom (following formulas 116-122); and Groups of 5 membered ring heterocyclic groups containing nitrogen, oxygen, sulfur, as a hetero atom ono which a phenyl group, furyl group, or thienyl group is substituted (following formulas 123-128).

54
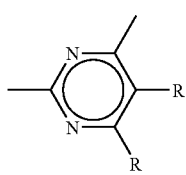
55
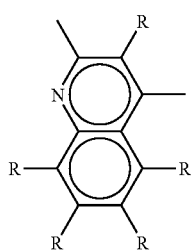
56
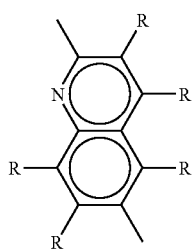
57
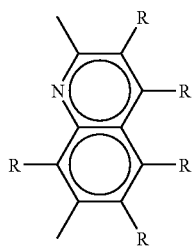
58
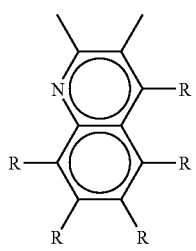
59
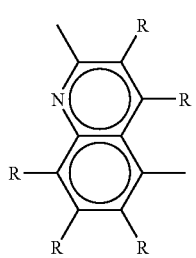
60
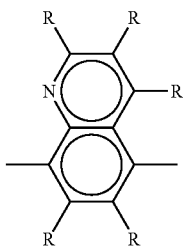
61
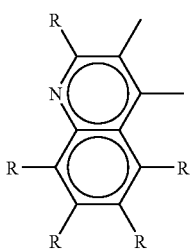
62
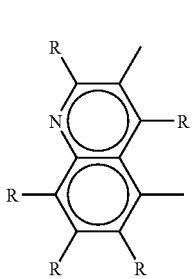
63
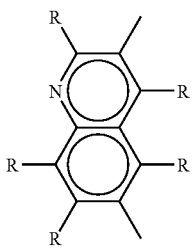
64
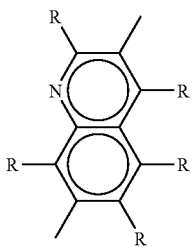
65
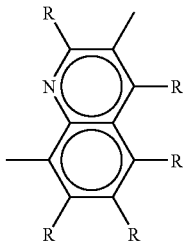

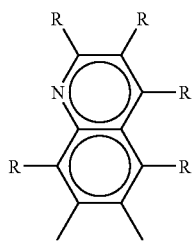
66
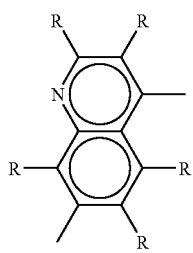
67
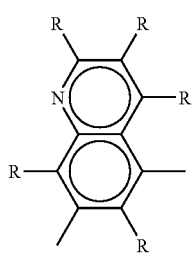
68
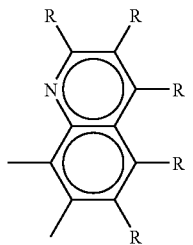
69
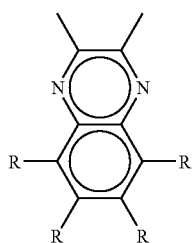
70
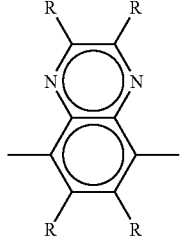
71
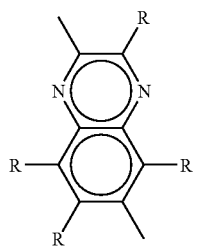
72
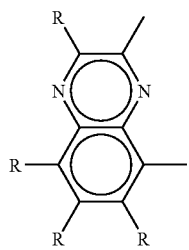
73
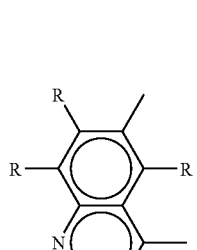
74
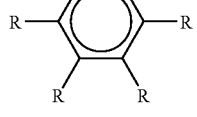
75
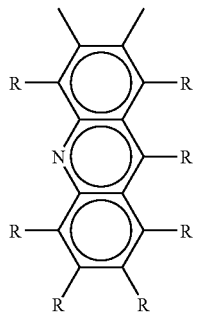
76

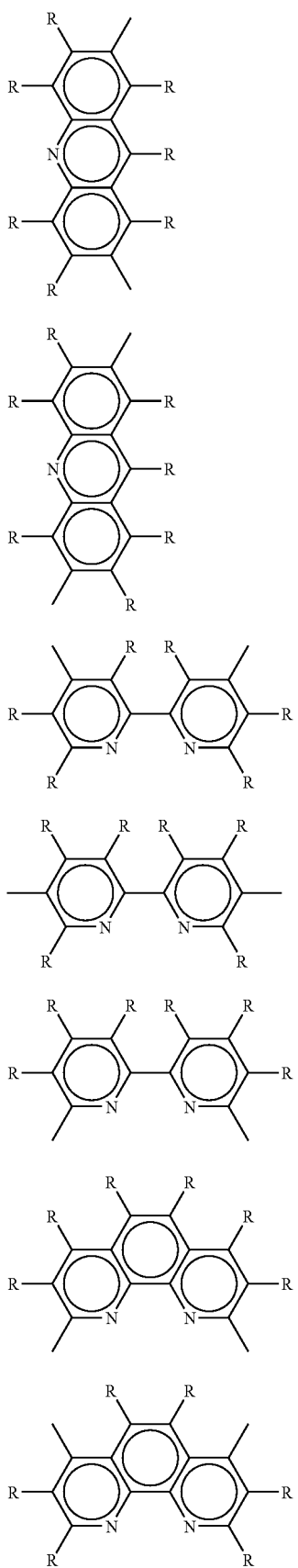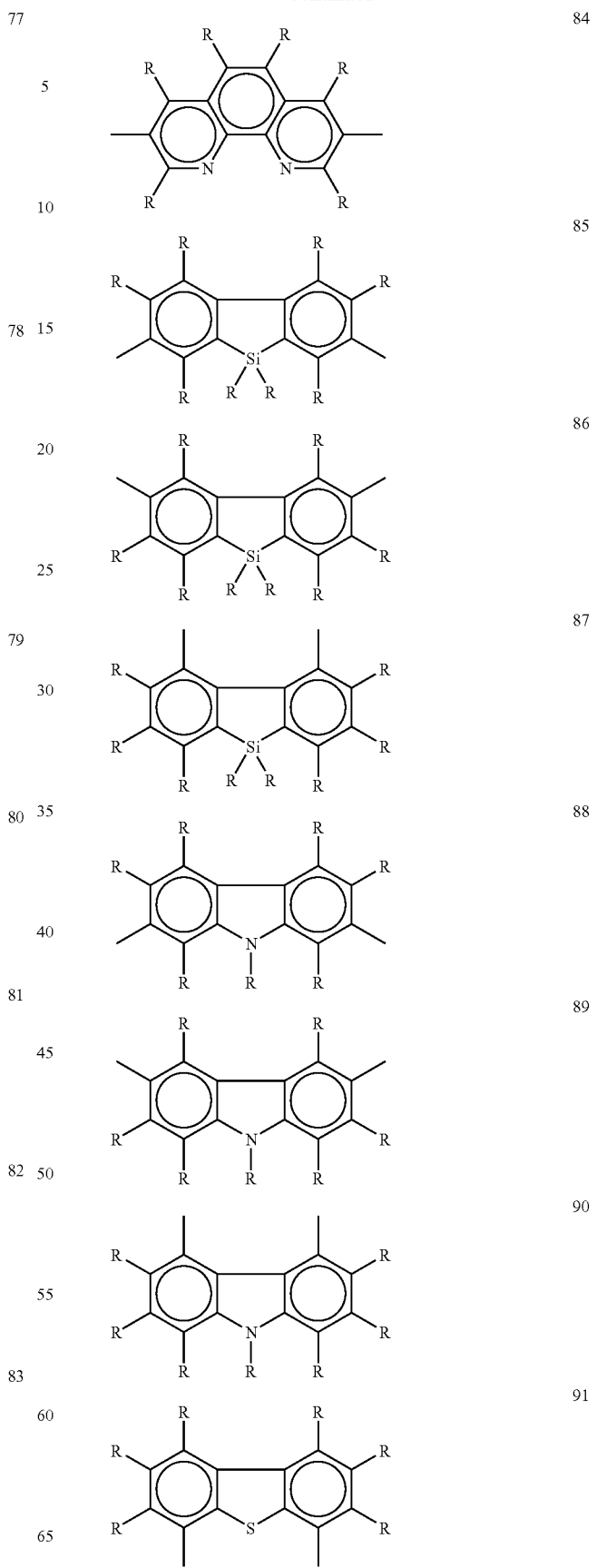

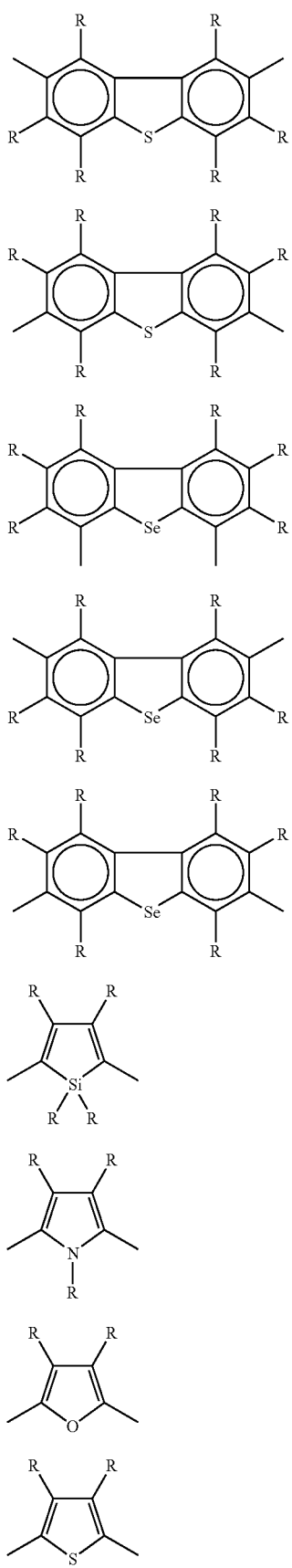
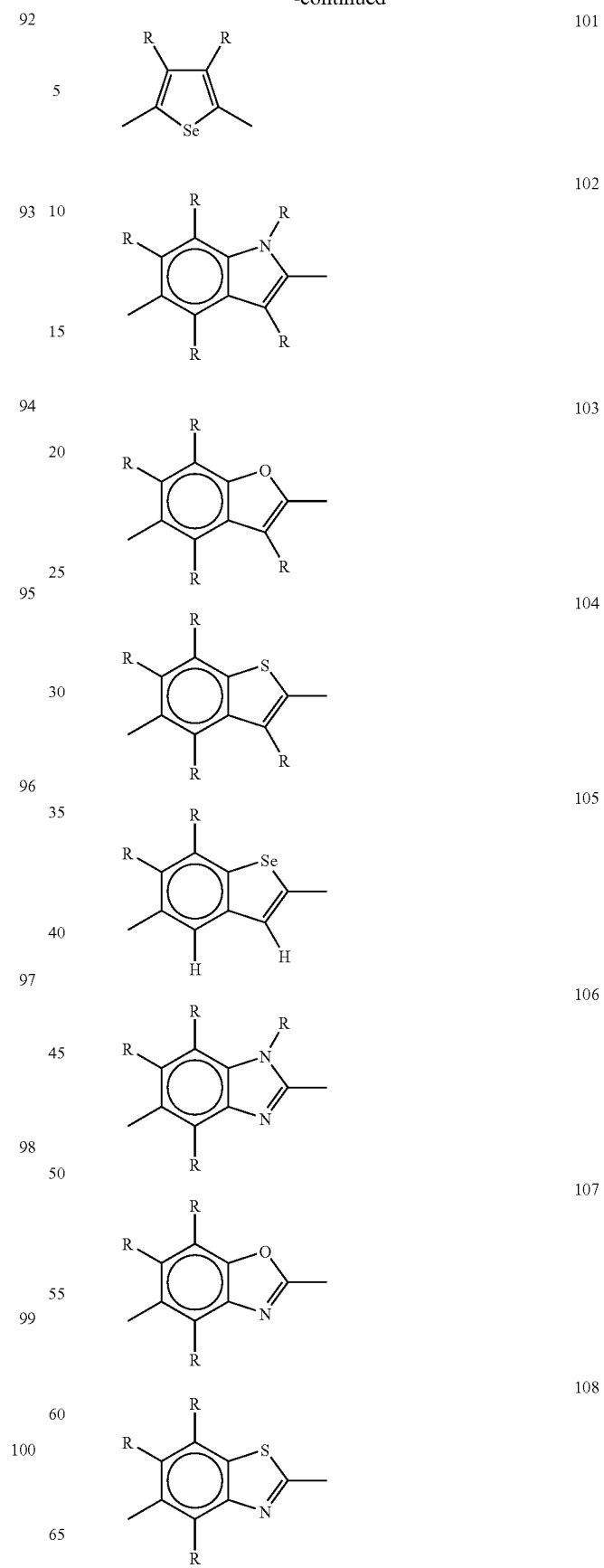

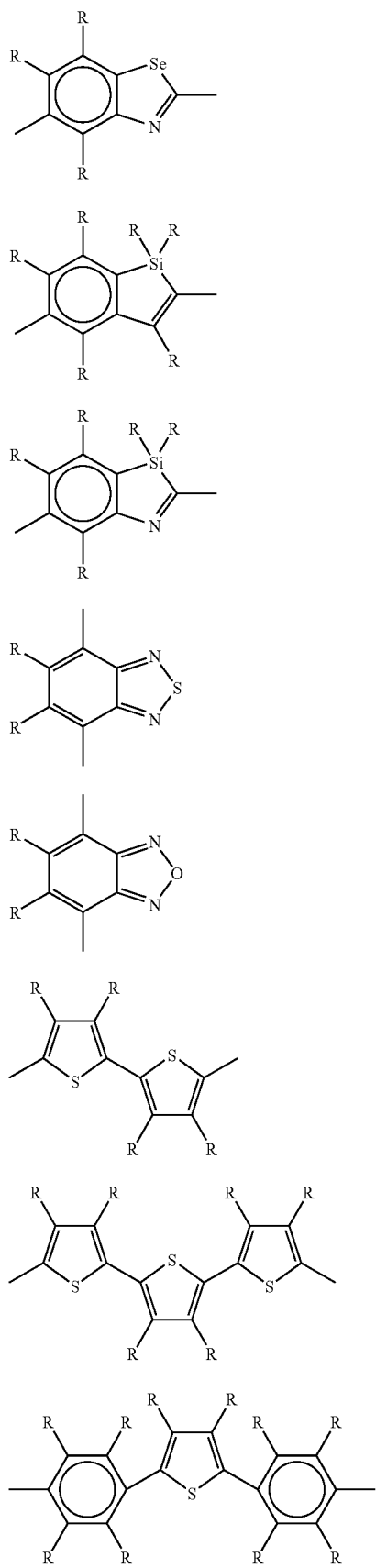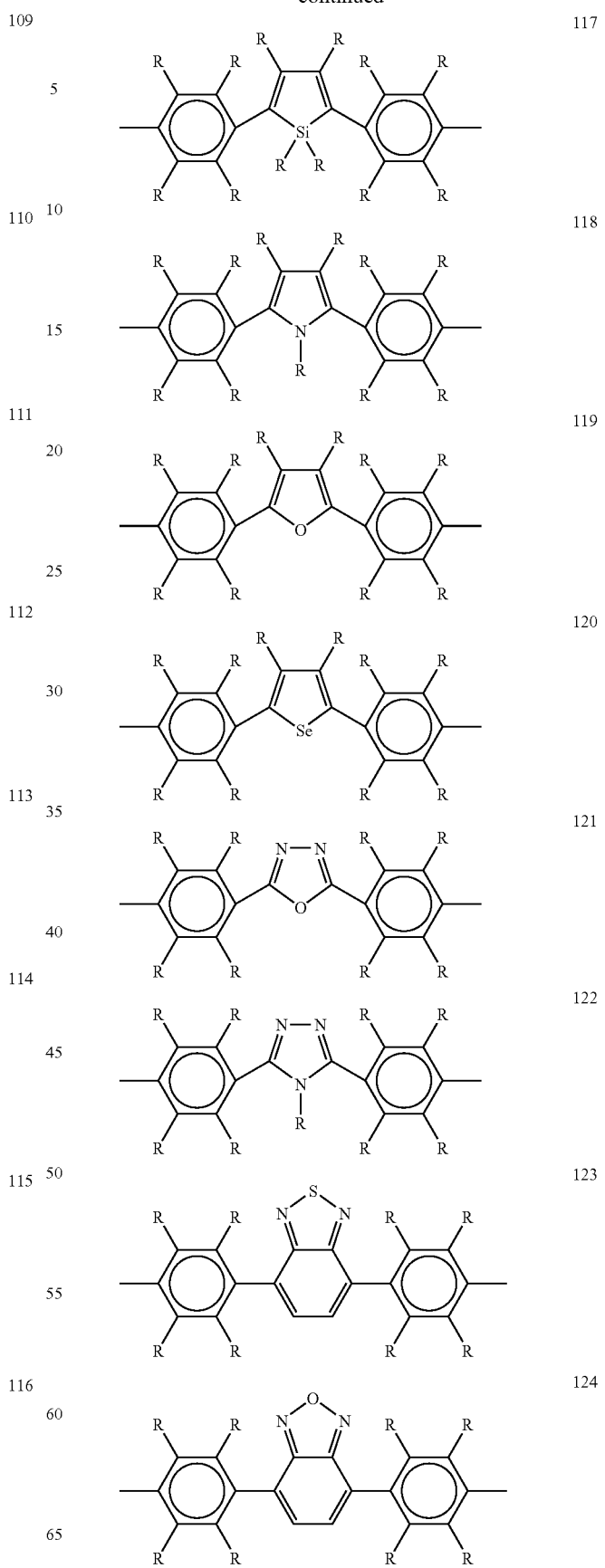

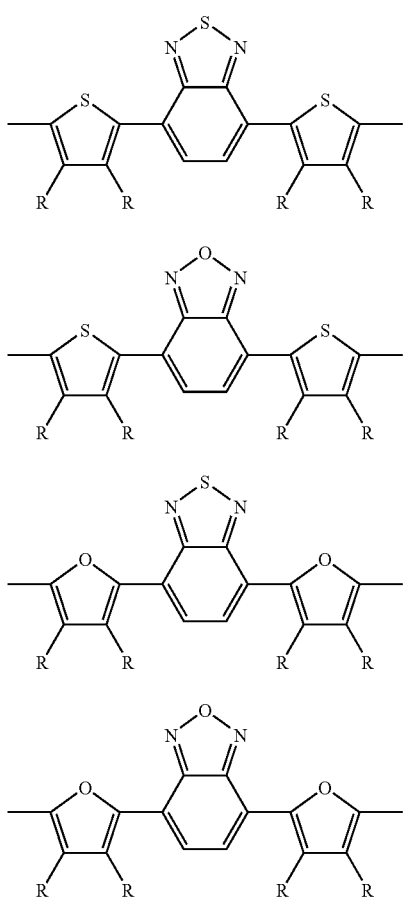

Among the repeating units represented by the above formula (5), the repeating units represented by the below formula (9), formula (10), formula (11), formula (12), formula (13) or formula (14) are preferable in view of light-emitting strength.

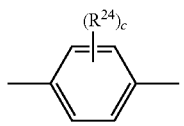 (9)

Wherein, $R^{24}$ represent halogen atom, alkyl group, alkyloxy group, alkylthio group, aryl group, aryloxy group, arylthio group, arylalkyl group, arylalkyloxy group, arylalkylthio group, acyl group, acyloxy group, Amide group, acid imide group, imino group, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, alkoxy carbonyl group, aryloxy carbonyl group, arylalkyloxy carbonyl group, hetero aryloxy carbonyl group, or cyano group. c represents an integer of 0 to 4.

Concrete examples of formula (9) include the following repeating units.

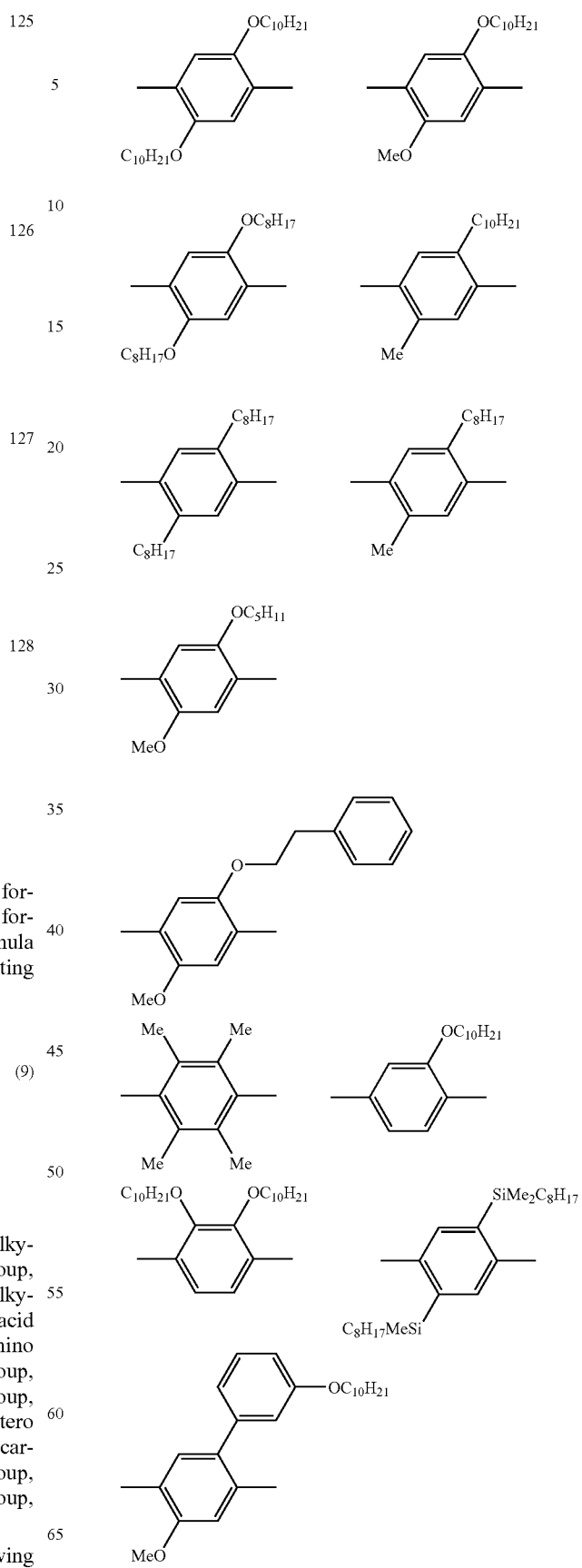

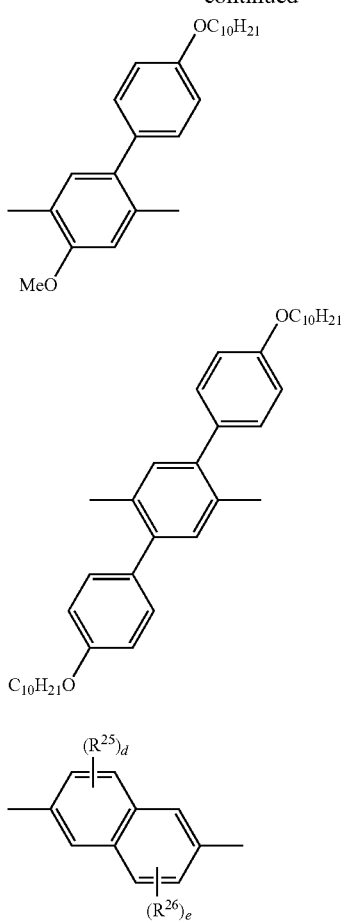

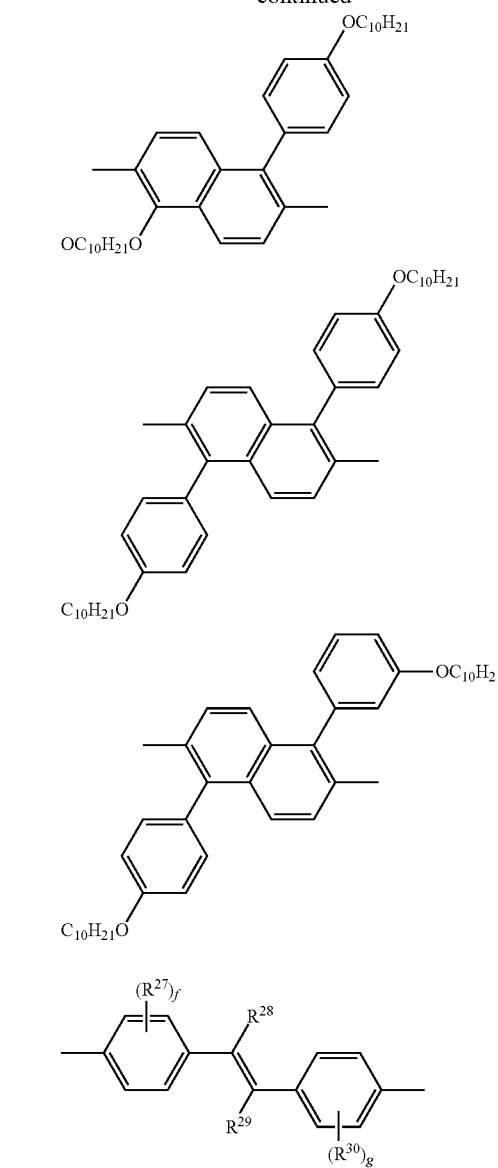

Wherein, $R^{25}$ and $R^{26}$ each independently represent halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imino group, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, alkoxy carbonyl group, aryloxy carbonyl group, arylalkyloxy carbonyl group, hetero aryloxy carbonyl group, or cyano group. d and e each independently represent an integer of 0 to 3.

Concrete examples of formula (10) include the following repeating units.

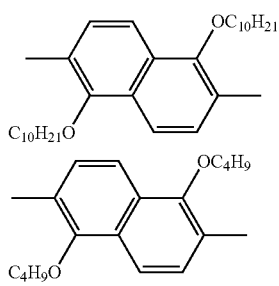

Wherein, $R^{27}$ and $R^{30}$ each independently represent halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, Imino group, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, alkoxy carbonyl group, aryloxy carbonyl group, arylalkyloxy carbonyl group, hetero aryloxy carbonyl group, or cyano group. $R^{28}$ and $R^{29}$ each independently represent a hydrogen atom, alkyl group, aryl group, monovalent heterocyclic group, carboxyl group, alkoxy carbonyl group, aryloxy carbonyl group, arylalkyloxy carbonyl group, hetero aryloxy carbonyl group, or cyano group.

Concrete examples of formula (11) include the following repeating units.

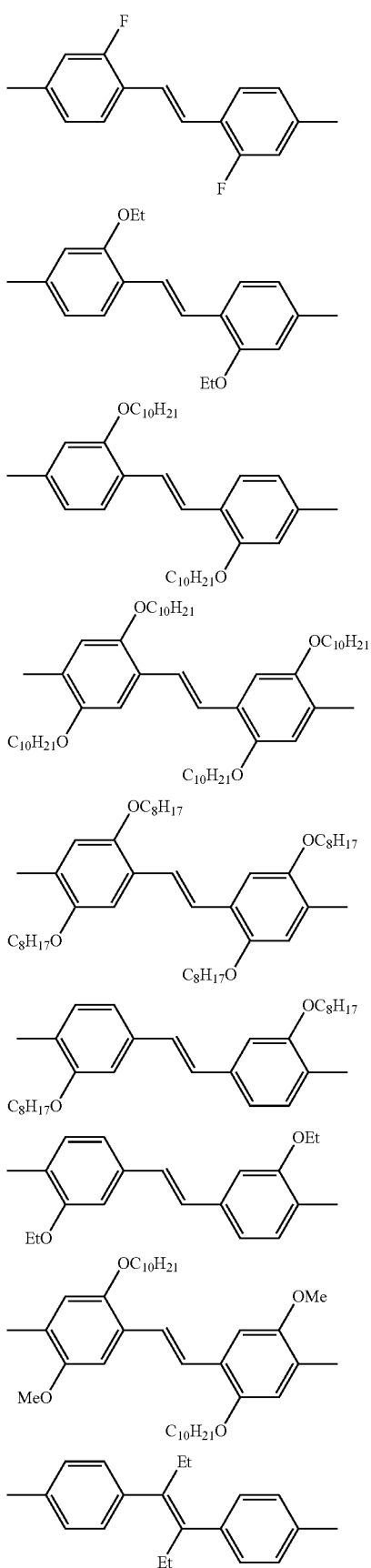
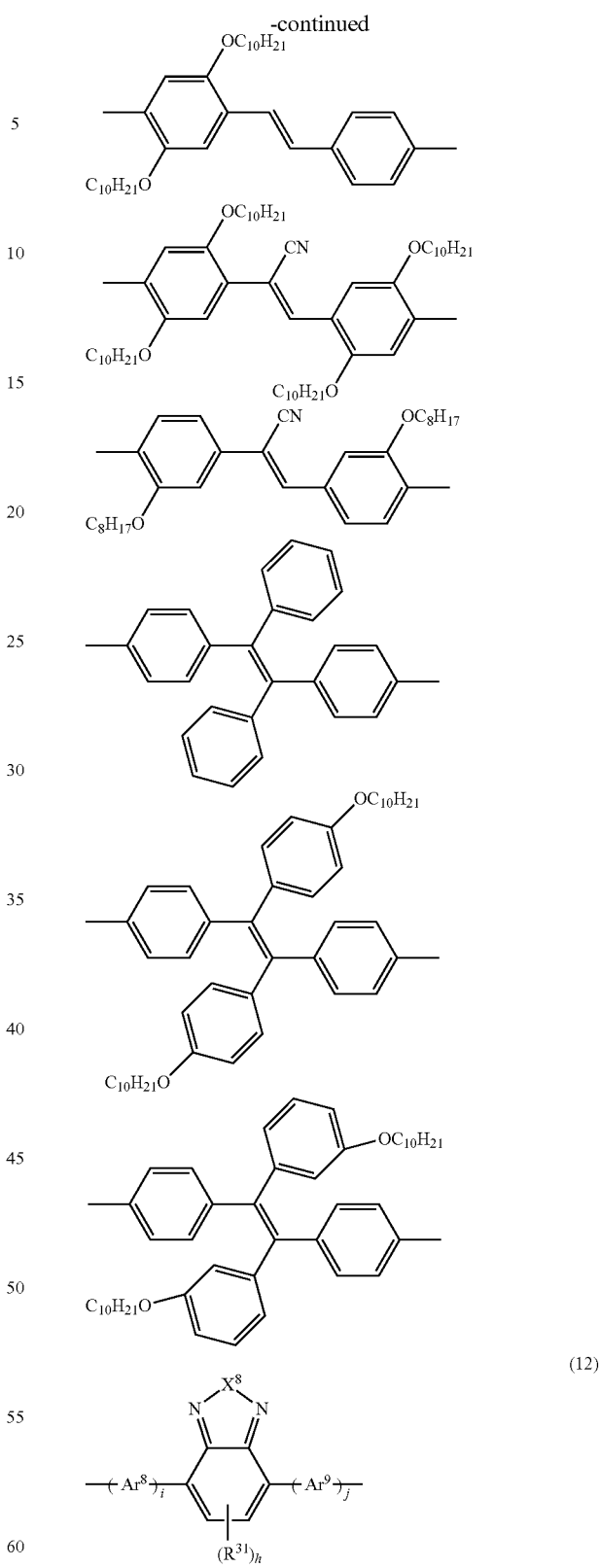
-continued
(12)
Wherein, $R^{31}$ represents halogen atom, alkyl group, alkyloxy group, alkylthio group, aryl group, aryloxy group, arylthio group, arylalkyl group, arylalkyloxy group, arylalkylthio group, acyl group, acyloxy group, Amide group, acid imide group, imino group, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, alkoxy carbonyl group, aryloxy carbonyl group, arylalkyloxy carbonyl group, hetero aryloxy carbonyl group, or cyano group. h represents an integer of 0 to 2. $Ar^8$ and $Ar^9$ each independently represent an arylene group or a divalent heterocyclic group. i and j each independently represent 0 or 1. $X^8$ represents O, S, SO, $SO_2$, Se or Te.

Concrete examples of formula (12) include the following repeating units.

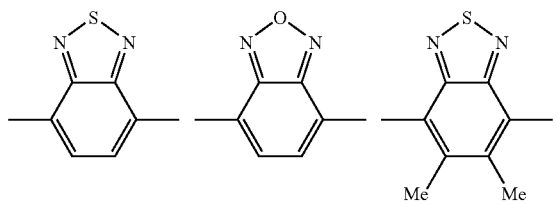
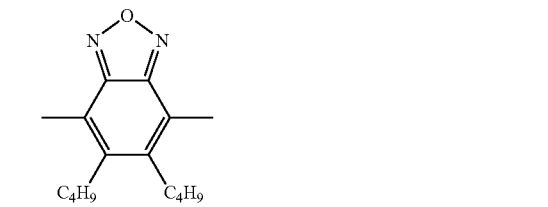
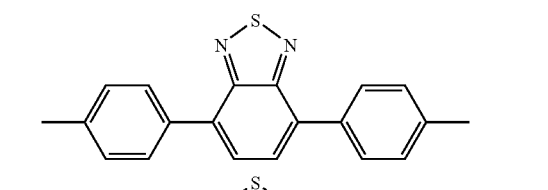
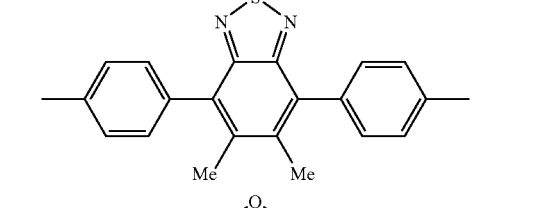
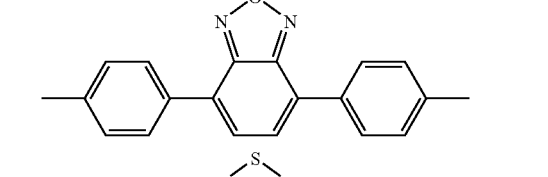
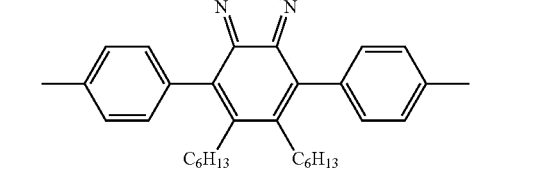
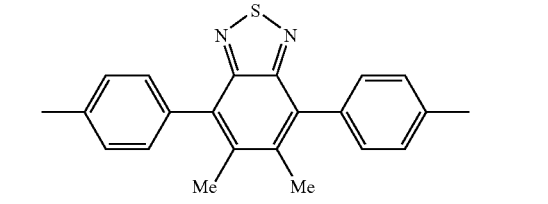

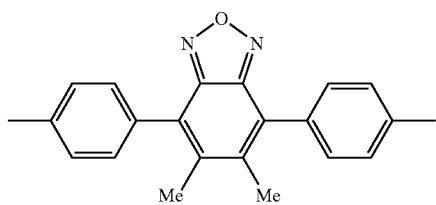
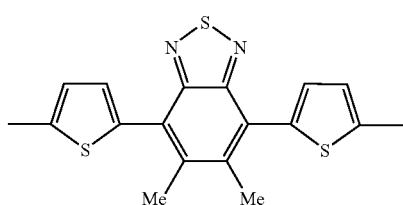
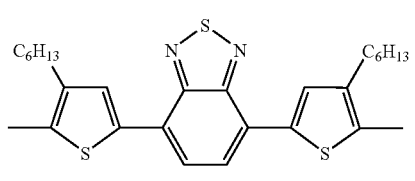
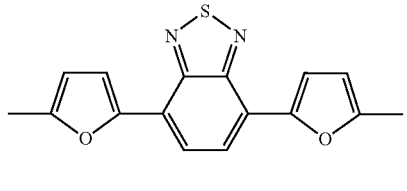

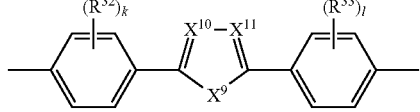

(13)

Wherein, $R^{32}$ and $R^{33}$ each independently represent halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, Imino group, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, alkoxy carbonyl group, aryloxy carbonyl group, arylalkyloxy carbonyl group, hetero aryloxy carbonyl group, or cyano group. k and l each independently represent an integer of 0 to 4. $X^9$ represents O, S, SO, $SO_2$, Se, Te, N—$R^{34}$ or $SiR^{35}R^{36}$. $X^{10}$ and $X^{11}$ each independently represent N or C—$R^{37}$. $R^{34}$, $R^{35}$, $R^{36}$ and $R^{37}$ each independently represent a hydrogen atom, alkyl group, aryl group, arylalkyl group, or monovalent heterocyclic group.

Concrete examples of formula (13) include the following repeating units.

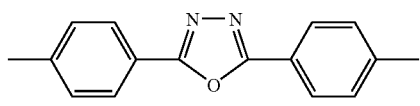

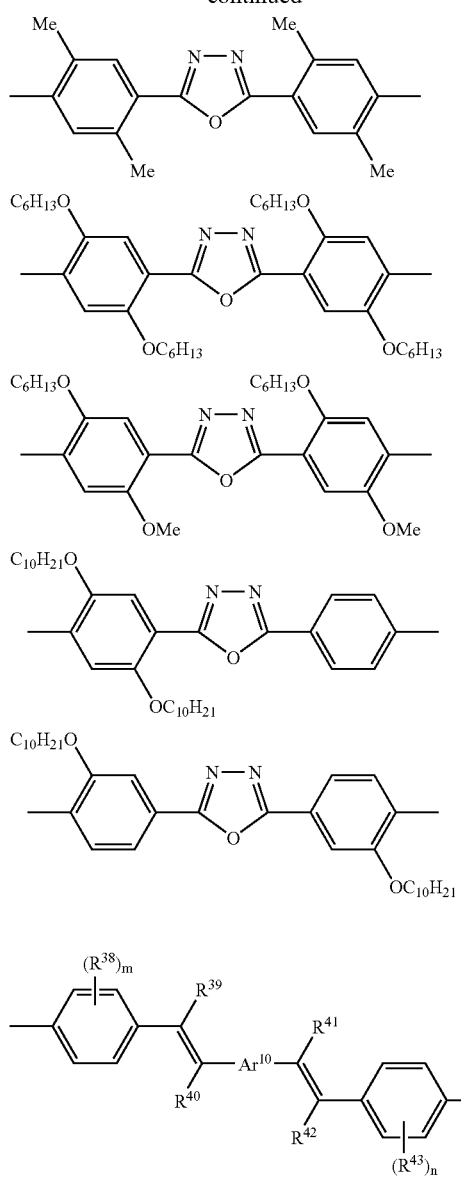

Concrete examples of formula (14) include the following repeating units.

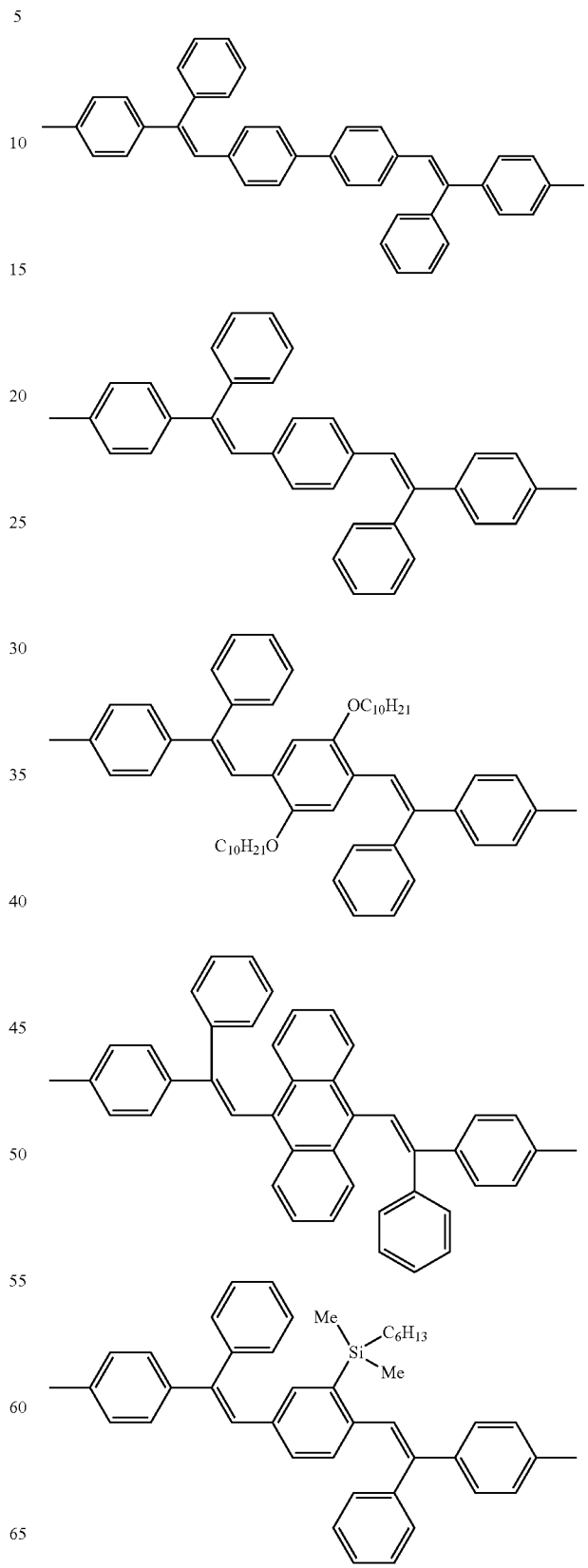

Wherein, $R^{38}$ and $R^{43}$ each independently represent halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, Imino group, amino group, substituted amino group, substituted silyl group, substituted silyloxy group, substituted silylthio group, substituted silylamino group, monovalent heterocyclic group, hetero aryloxy group, hetero arylthio group, arylalkenyl group, arylethynyl group, carboxyl group, alkoxy carbonyl group, aryloxy carbonyl group, arylalkyloxy carbonyl group, hetero aryloxy carbonyl group, or cyano group. m and n each independently represent an integer of 0 to 4. $R^{39}$, $R^{40}$, $R^{41}$ and $R^{42}$ each independently represent a hydrogen atom, alkyl group, aryl group, monovalent heterocyclic group, carboxyl group, alkoxy carbonyl group, aryloxy carbonyl group, arylalkyloxy carbonyl group, hetero aryloxy carbonyl group, or cyano group. $Ar^{10}$ represents an arylene group or a divalent heterocyclic group.

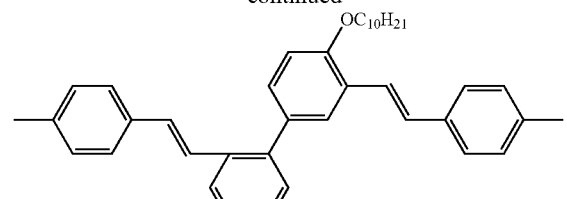
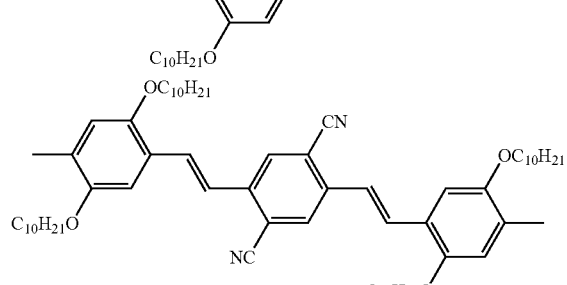
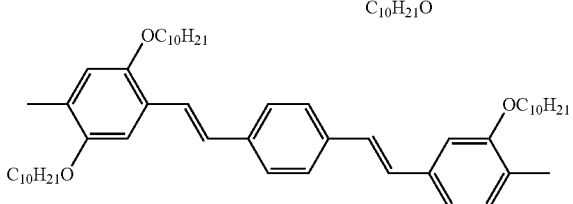
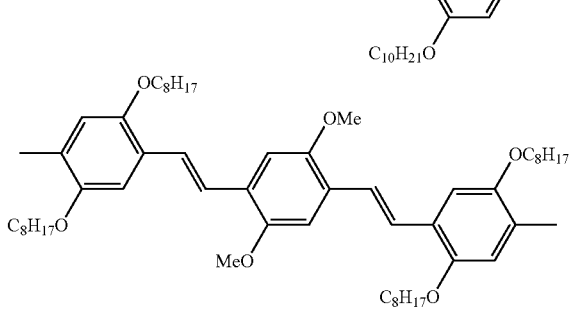
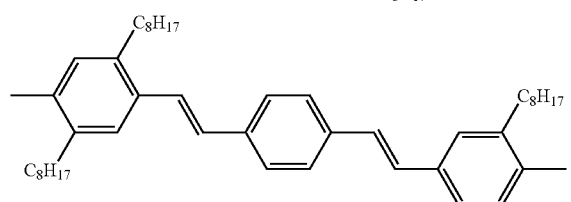
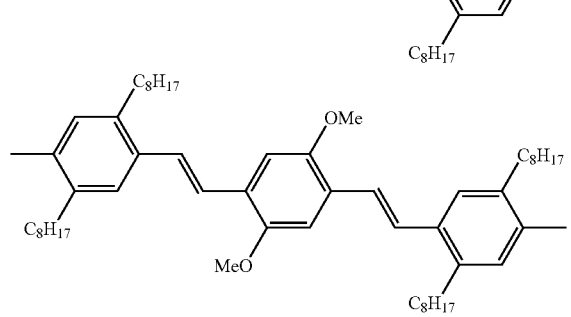
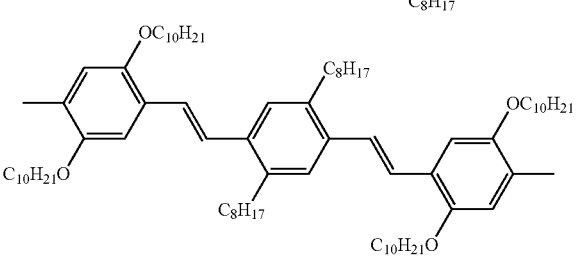

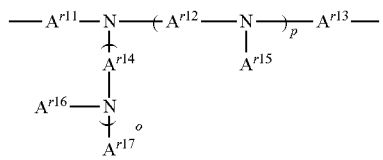

(15)

Wherein, $Ar^{11}$, $Ar^{12}$, $Ar^{13}$ and $Ar^{14}$ each independently represent an arylene group or a divalent heterocyclic group. $Ar^{15}$, $Ar^{16}$, and $Ar^{17}$ each independently represent an aryl group or monovalent heterocyclic group. o and p each independently represent 0 or 1, and are $0 <= o+p <= 1$.

Concrete example of the repeating units represented by the above formula (15) include the repeating units of the following formulas 129-136.

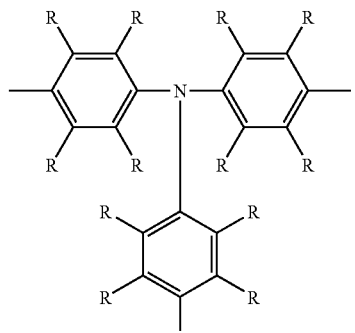

129

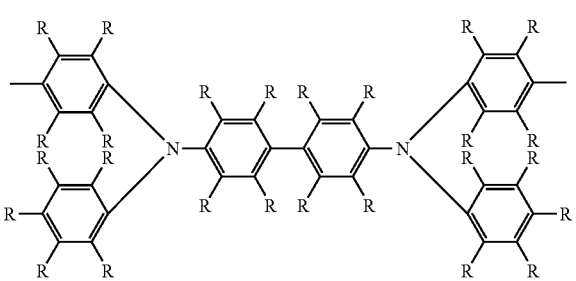

130

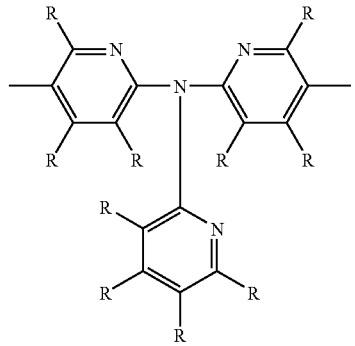

131

132

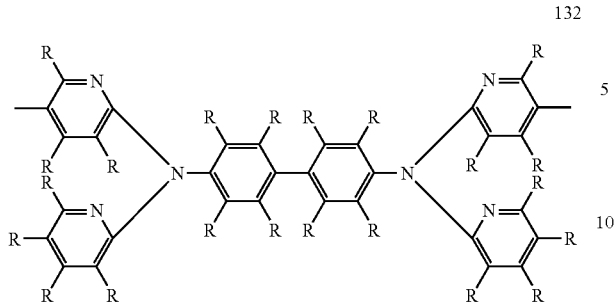

133

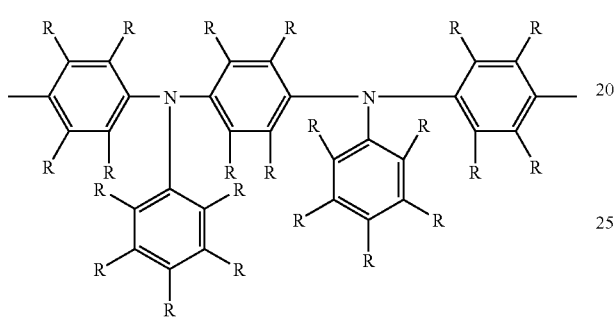

134

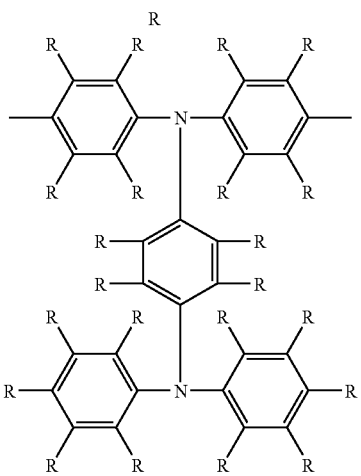

135

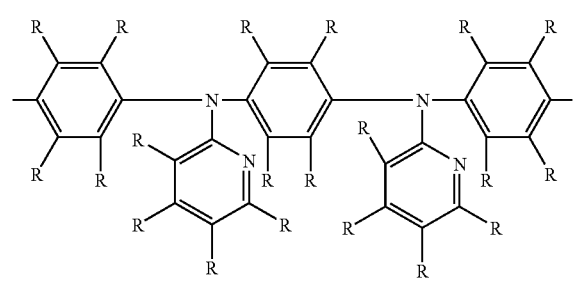

136

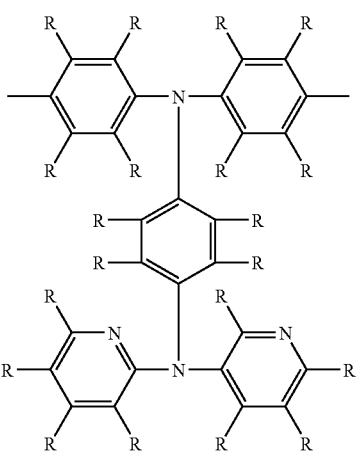

In the above formulas 129-136, R has the same definition as that of the above formulas 1-128. In the above examples, although a plurality of Rs are contained in one structural formula, they may be the same or different. In order to improve the solubility into a solvent, it is preferable to have one or more groups other than hydrogen atom, and it is also preferable that the repeating unit including substituent has a form of little symmetry.

Furthermore, when R contains an aryl group or a heterocyclic group as a part in the above formula, they may have one or more substituents.

When substituent R in the above formula contain alkyl chain, it may be linear, branched, cyclic, or may be combination thereof. As the case of not linear, isoamyl group, 2-ethylhexyl group, 3,7-dimethyloctyl group, cyclohexyl group, 4-$C_1$-$C_{12}$ alkylcyclohexyl group, etc., are exemplified. In order to improve the solubility of a polymer compound into a solvent, it is preferable that one or more of them contain a cyclic or branched alkyl chain.

Moreover, a plurality of Rs may be connected to form a ring. Furthermore, when R is a group containing an alkyl chain, said alkyl chain may be interrupted by a group containing a hetero atom. Here, as the hetero atom, an oxygen atom, a sulfur atom, a nitrogen atom, etc. are exemplified.

Of the repeating unit represented by the above (9)-(15), repeating units represented by the above formula (15) are more preferable. Among them, the repeating unit represented by the below formula (15-2) is preferable.

(15-2)

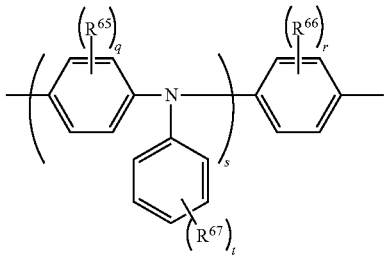

Wherein, $R^{65}$, $R^{66}$, and $R^{67}$ each independently represent a halogen atom, alkyl group, alkyloxy group, alkylthio group, the alkylamino group, aryl group, aryloxy group, arylthio group, arylamino group, arylalkyl group, arylalkyloxy group, arylalkylthio group, arylalkylamino group, acyl group, acyloxy group, amide group, imine residue, substituted silyl group, substituted silyloxy group, substituted silylthio group, the substituted silylamino group, a monovalent heterocyclic group, arylalkenyl group, arylethynyl group or cyano group. q and r each independently represent an integer of 0 to 4. s represents an integer of 1 to 2. t represents an integer of 0 to 5.

The definition and the concrete examples of: the alkyl group, alkoxy group, alkylthio group, aryl group, aryloxy group, arylthio group, arylalkyl group, arylalkoxy group, arylalkylthio group, arylalkenyl group, arylalkynyl group, substituted amino group, silyl group, substituted silyl group, halogen atom, The definition of acyl group, acyloxy group, imine residue, amide group, imide group, and monovalent heterocyclic group in formula (5)-(15); are the same with those which may be carried on the compounds exemplified as the above (29)-(33).

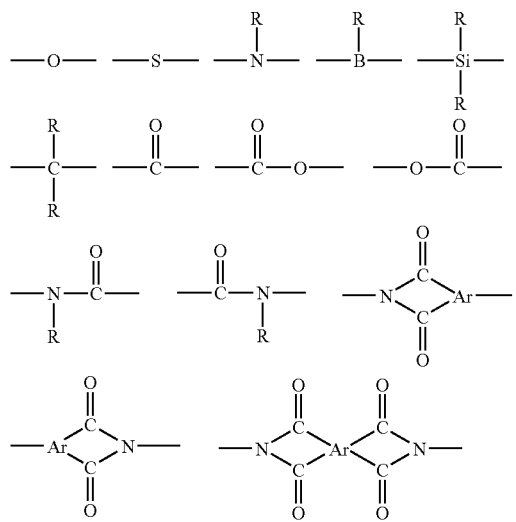

The polymer compound used for the polymer light-emitting material of the present invention is, in view of improving the solubility into an organic solvent, and the compatibility with other ingredients of light-emitting materials, for example, repeating units represented by formula (1), (2), (3) or (4), and having different structures may be copolymerized.

The polymer compound used for the present invention may also be a random, block or graft copolymer, or a polymer having an intermediate structure thereof, for example, a random copolymer having block property. Further, a polymer having a branched main chain and more than three terminals may also be included.

Furthermore, the end group of polymer compound used for the polymer light-emitting material of the present invention may also be protected with a stable group since if a polymerization active group remains intact, there is a possibility of reduction in light emitting property and life-time when made into an device. Those having a conjugated bond continuing to a conjugated structure of the main chain are preferable, and there are exemplified structures connected to an aryl group or heterocyclic compound group via a carbon-carbon bond. Specifically, substituents described as Chemical Formula 10 in JP-A-9-45478 are exemplified.

The polystyrene reduced number-average molecular weight of the polymer compound used for the polymer light-emitting material of the present invention is usually $10^3$ to $10^8$, and preferably $10^4$ to $10^6$. The polystyrene reduced weight-average molecular weight of the polymer compound is usually $10^3$ to $10^8$, and preferably $5\times10^4$ to $5\times10^6$.

As the good solvent to the polymer compound used for the polymer light-emitting material of the present invention, exemplified are chloroform, methylene chloride, dichloroethane, tetrahydrofuran, toluene, xylene, mesitylene, tetralin, decalin, n-butyl benzene, etc. Although it depends on the structure and the molecular weight of the polymer complex compound, usually the complex compound can be dissolved in these solvents in 0.1% by weight or more.

Next, the manufacture method of the polymer compound used for the polymer light-emitting material of the present invention is explained.

The polymer compound used for the present invention can be manufactured by conducting condensation polymerization of the compounds represented by the below formula (1-0) or (2-0), as one of the raw materials.

(Wherein, $Ar^1$, $Ar^2$, $X^1$ and $X^2$ are the same as those of the above. $Y^1$ and $Y^2$ each independently represent a halogen atom, alkylsulfonate group, arylsulfonate group, arylalkylsulfonate group, boric ester group, sulfonium-methyl group, phosphonium-methyl group, phosphonate-methyl group, monohalogenated-methyl group, boric-acid group, formyl group, or vinyl group.)

(Wherein, $Ar^3$, $Ar^4$, $X^3$ and $X^4$ are the same as those of the above. $Y^3$ and $Y^4$ each independently represent a halogen atom, alkylsulfonate group, arylsulfonate group, arylalkylsulfonate group, boric ester group, sulfonium-methyl group, phosphonium-methyl group, phosphonate-methyl group, monohalogenated-methyl group, boric-acid group, formyl group, or vinyl group.)

Among compounds represented by the above formula (1-0) or (2-0), in view of easiness of synthesis and functional group conversion, it is preferable that $Y^1$—$Y^4$ are each independently a halogen atom, alkylsulfonate group, arylsulfonate group, arylalkylsulfonate group, boric ester group, or boric-acid group, and halogen atom is more preferable.

Examples of the alkylsulfonate group include a methane sulfonate group, ethane sulfonate group, trifluoromethane sulfonate group, etc., examples of the arylsulfonate group include a benzene sulfonate group, p-toluene sulfonate group, etc., and examples of the arylalkylsulfonate group include a benzyl sulfonate group, etc.

As the boric ester group, the groups represented by the below formulae are exemplified.

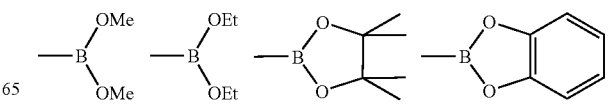

As the sulfonium-methyl group, the groups represented by the below formulae are exemplified.

—CH2SMe$_2$X and —CH2SPh$_2$X (X represents halogen atom.)

As the phosphonium-methyl group, the groups represented by the below formulae are exemplified.

—CH2PPh$_3$X (X represents halogen atom.)

As the phosphonate-methyl group, the groups represented by the below formulae are exemplified.

—CH2PO(OR')$_2$ (R' represents alkyl group, aryl group or arylalkyl group.)

As the monohalogenated-methyl group, chloromethyl group, bromomethyl group, and iodomethyl group are exemplified.

As the method of condensation polymerization, in case of having vinylene group in the main chain, it can be produced using other monomers according to requirements, for example, by a method described in JP-A-5-202355.

That is, exemplified are: [1] polymerization by Wittig reaction of a compound having aldehyde group and a compound having a phosphonium base, [2] polymerization by Wittig reaction of a compound having an aldehyde group and a phosphonium base, [3] polymerization by Heck reaction of a compound having a vinyl group and a compound having a halogen atom, [4] polymerization by Heck reaction of a compound having a vinyl group and a halogen atom, [5] polymerization by Horner-Wadsworth-Emmons method of a compound having an aldehyde group and a compound having an alkylphosphonate group, [6] polymerization by Horner-Wadsworth-Emmons method of a compound having an aldehyde group and an alkylphosphonate group, [7] polycondensation by dehydrohalogenation method of a compound having two or more of halogenated methyl groups, [8] polycondensation by sulfonium-salt decomposition method of a compound having two or more sulfonium-salt groups, [9] polymerization by Knoevenagel reaction of a compound having an aldehyde group and a compound having an acetonitrile group, [10] polymerization by Knoevenagel reaction of a compound having an aldehyde group and an acetonitrile group, and [11] polymerization by McMurry reaction of a compound having two or more aldehyde groups.

The polymerizations of the above [1]-[11] are schematically shown below.

[1]
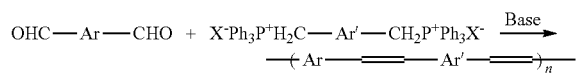

[2]
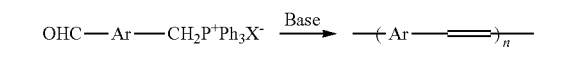

[3]
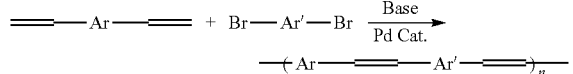

[4]
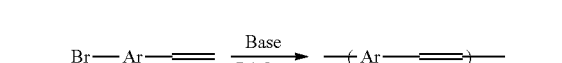

[5]
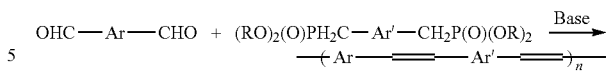

[6]
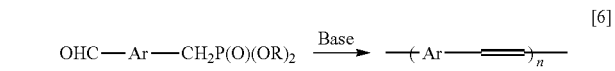

[7]

[8]
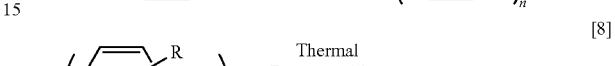

[9]
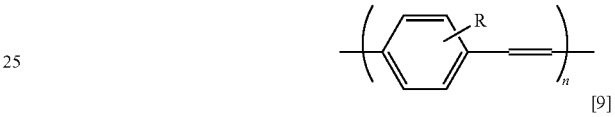

[10]
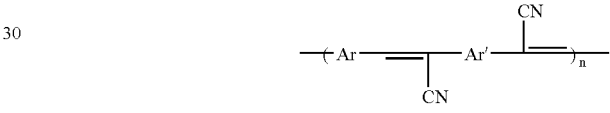

[11]
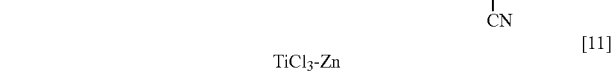

[9]
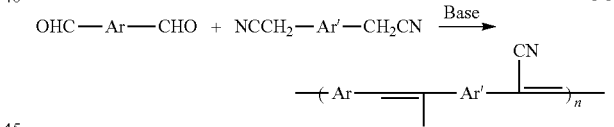

[10]
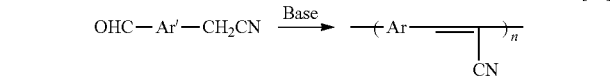

[11]
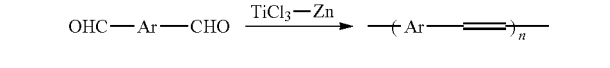

In case of not having vinylene group in the main chain, as the manufacture method of the polymer compound of the present invention, exemplified are: [12] a method of polymerization by Suzuki coupling reaction, [13] a method of polymerization by Grignard reaction, [14] a method of polymerization by Ni(0) catalyst, [15] a method of polymerization by an oxidizing agent such as FeCl$_3$, etc. and an electrochemical oxidization polymerization, [16] a method of decomposition of an intermediate polymer having an appropriate leaving group, etc.

The above polymerization methods [12]-[16] are schematically shown below.

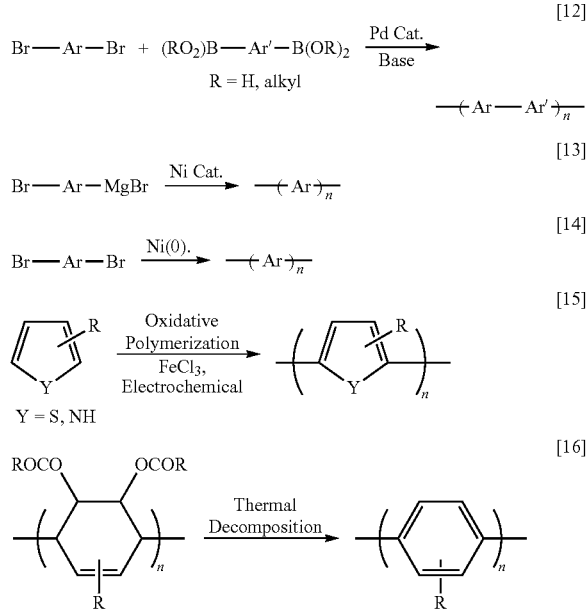

Among these, the polymerization by Wittig reaction, polymerization by Heck reaction, polymerization by Horner-Wadsworth-Emmons method, polymerization by Knoevenagel reaction, and Suzuki coupling reaction, method of polymerization by Grignard reaction, and method of polymerization by Ni(0) catalyst are preferable, since it is easy to control the structures. The method of polymerization by Suzuki coupling reaction, method of polymerization by Grignard reaction, and method of polymerization by Ni(0) catalyst are more preferable, in view of availability of raw materials, and easiness of polymerization reaction operation.

A monomer is dissolved in an organic solvent according to necessity, and can be reacted using alkali or appropriate catalyst, at a temperature between the boiling point and the melting point of the organic solvent.

Known methods which can be used are described in, for example: Organic Reactions, Volume 14, page 270-490, John Wiley & Sons, Inc., 1965; Organic Reactions, Volume 27, page 345-390, John Wiley & Sons, Inc., 1982; Organic Syntheses, Collective Volume VI, page 407-411, John Wiley & Sons, Inc., 1988; Chemical Review (Chem. Rev.), Volume 95, page 2457 (1995); Journal of Organometallic Chemistry (J. Organomet. Chem.), Volume 576, page 147 (1999); Journal of Praktical Chemistry (J. Prakt. Chem.), Volume 336, page 247 (1994); and Macromolecular Chemistry, Macromolecular Symposium (Makromol. Chem., Macromol. Symp.), Volume 12th, page 229 (1987).

It is preferable that the organic solvent used is subjected to a deoxygenation treatment sufficiently and the reaction is progressed under an inert atmosphere, generally for suppressing a side reaction, though the treatment differs depending on compounds and reactions used. Further, it is preferable to conduct a dehydration treatment likewise. (However, this is not applicable in the case of a reaction in a two-phase system with water, such as a Suzuki coupling reaction.)

For the reaction, alkali or a suitable catalyst is added. It can be selected according to the reaction to be used. It is preferable that the alkali or the catalyst can be dissolved in a solvent used for a reaction. Example of the method for mixing the alkali or the catalyst, include a method of adding a solution of alkali or a catalyst slowly, to the reaction solution with stirring under an inert atmosphere of argon, nitrogen, etc. or conversely, a method of adding the reaction solution to the solution of alkali or a catalyst slowly.

When the polymer compound of the present invention is used as a light-emitting material of polymer LED, the purity thereof exerts an influence on light emitting property, therefore, it is preferable that a monomer is purified by a method such as distillation, sublimation purification, re-crystallization and the like before being polymerized. Further, it is preferable to conduct a purification treatment such as re-precipitation purification, chromatographic separation and the like after the synthesis.

In the manufacture method of the polymer compound of the present invention, each of monomers may be mixed together, or may be mixed dividedly, if necessary, to react.

The reaction conditions are described, more specifically. In case of Wittig reaction, Horner reaction, Knoevengel reaction, etc., the reaction is carried out using alkali in an equivalent amount to the functional groups of the monomer, preferably 1 to 3 equivalent amounts. As the alkali, without being limited especially, can be used are: metal alcoholates, such as potassium-t-butoxide, sodium-t-butoxide, sodium ethylate, and lithium methylate; hydride reagents, such as sodium hydride; amides, such as and sodium amide; etc. As the solvent, N,N-dimethylformamide, tetrahydrofuran, dioxane, toluene, etc. are used. As the reaction temperature, usually it can be conducted at from room temperature to about 150° C. The reaction time is, for example, from 5 minutes to 40 hours, which is just necessary to conduct the polymerization sufficiently. And since it is not necessary to be left for a long time after the end of the reaction, it is preferably from 10 minutes to 24 hours. In the reaction, if the concentration is too small, the efficiency of the reaction will become difficult, and if it is too large, the reaction control will become difficult, accordingly, it is appropriately selected in the range of about 0.01 wt % and the maximum dissolvable concentration. Usually, it is in the range of 0.1 wt % to 20 wt %.

In the case of Heck reaction, monomers are reacted in existence of a base, such as triethyl amine, using a palladium catalyst. Using a solvent having comparatively high boiling point, such as N,N-dimethylformamide or N-methylpyrrolidone, the reaction temperature is about 80 to 160° C., and the reaction time is about 1 hour to 100 hours.

In case of Suzuki coupling reaction, it is conducted with using, for example, palladium [tetrakis(triphenyl phosphine)], or palladium acetate, as a catalyst; and adding an inorganic base, such as potassium carbonate, sodium carbonate, and barium hydroxide, and an organic base, such as triethyl amine, and inorganic salt, such as cesium fluoride, in an amount equivalent to the monomers, preferably 1 to 10 equivalent. The reaction may be conducted in a two-phase system using an inorganic salt as a solution. As the solvent, N,N-dimethylformamide, toluene, dimethoxy ethane, tetrahydrofuran, etc., are exemplified. Although it depends also on a solvent, the temperature is preferably about 50 to 160° C., and may be raised to the boiling point of the solvent and refluxed. The reaction time is about from 1 hour to 200 hours.

In the case of Grignard reaction, exemplified is a reaction in which a Grignard reagent solution is prepared by reacting a halogenated compound with metal Mg in an ether solvent, such as tetrahydrofuran, diethyl ether, and dimethoxy ethane, and a monomer solution prepared separately are mixed, and after adding a nickel or a palladium catalyst with taking care of violent reaction, the reaction is conducted with raising the temperature and refluxing. Grignard reagent is used in an amount of equivalent to the monomers, preferably 1 to 1.5 equivalents, more preferably, 1 to 1.2 equivalents. In cases of polymerizing by other methods, the reactions can be conducted according to known methods.

Among the polymer compounds containing the repeating unit represented by the above formula (1), for example, the polymer compound containing repeating units represented by the below formula (3) and (4) can be manufactured respectively by conducting condensation polymerization of the compounds represented by the below formula (17) and (18), as one of the raw materials.

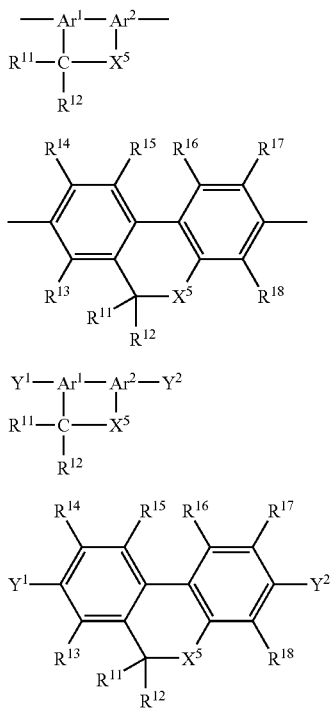

Wherein, $Ar^1$ and $Ar^2$ each independently represent a trivalent aromatic hydrocarbon group or a trivalent heterocyclic group. R and $R^{12}$ each independently represent a hydrogen atom, halogen atom, alkyl group, aryl group, arylalkyl group, or monovalent heterocyclic group. $X^5$ represents O, S, C(=O), S(=O), $SO_2$, $Si(R^3)(R^4)$, $N(R^5)$, $B(R^6)$, $P(R^7)$ or $P(=O)(R^8)$, $R^{13}$, $R^{14}$, $R^{15}$, $R^{16}$, $R^{17}$ and $R^{18}$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, arylalkenyl group, arylethynyl group, carboxyl group, or cyano group. $R^{14}$ and $R^5$, and $R^{16}$ and $R^{17}$ may be connected mutually to form a ring. $Y^1$ and $Y^2$ each independently represent a halogen atom, alkylsulfonate group, arylsulfonate group, arylalkylsulfonate group, boric ester group, sulfonium-methyl group, phosphonium-methyl group, phosphonate-methyl group, monohalogenated-methyl group, boric-acid group, formyl group, or vinyl group.

Among compounds represented by the above formulas (17) and (18), in view of easiness of synthesis and functional group conversion, it is preferable that $Y^1$ and $Y^2$ are each independently a halogen atom, alkylsulfonate group, arylsulfonate group, arylalkylsulfonate group, boric ester group, or boric-acid group.

Among the compounds represented by the above formula (18), the compound represented by the below formula (18-1) can be prepared by reacting the compound represented by the below formula (19) in existence of acid.

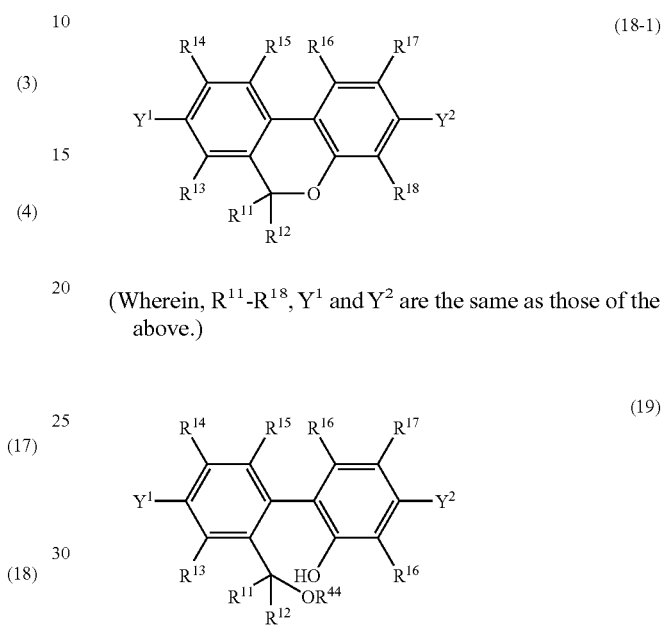

(Wherein, $R^{11}$-$R^{18}$, $Y^1$ and $Y^2$ are the same as those of the above.)

(Wherein, $R^{11}$-$R^{18}$, $Y^1$ and $Y^2$ are the same as those of the above. $R^{44}$ represents a hydrogen atom, alkyl group, aryl group, arylalkyl group, or monovalent heterocyclic group.)

As the acid used for the synthesis of the above (18-1), either of Lewis acid or Bronsted acid may be used, and examples there of include hydrogen chloride, hydrogen bromide, hydrofluoric acid, sulfuric acid, nitric acid, formic acid, acetic acid, propionic acid, oxalic acid, benzoic acid, boron fluoride, aluminum chloride, tin chloride (IV), iron chloride (II), titanium tetrachloride, or mixtures thereof.

The method of the reaction is not limited, and it can be carried out in existence of a solvent. The reaction temperature is preferably between −80° C. and the boiling point of the solvent.

As the solvent used for the reaction, exemplified are: saturated hydrocarbons, such as pentane, hexane, heptane, octane, and cyclohexane; unsaturated hydrocarbons, such as benzene, toluene, ethylbenzene, and xylene; halogenated saturated hydrocarbons, such as carbon tetrachloride, chloroform, dichloromethane, chloro butane, bromobutane, chloropentane, bromopentane, chlorohexane, bromohexane, chlorocyclohexane, and bromo cyclohexane; halogenated unsaturated hydrocarbons, such as chlorobenzene, dichloro benzene, and trichlorobenzene; alcohols, such as methanol, ethanol, propanol, isopropanol, butanol, t-butyl alcohol; carboxylic acids, such as, formic acid, acetic acid, and propionic acid; ethers, such as, dimethyl ether, diethyl ether, methyl-t-butyl ether, tetrahydrofuran, tetrahydropyran, and dioxane; and inorganic acids, such as hydrogen chloride, hydrogen bromide, hydrofluoric acid, sulfuric acid, and nitric acid, etc. These may be used as a single solvent or a mixed solvent thereof.

After the reaction, it can be obtained by usual post-treatment, for example, by extraction with an organic solvent after quenching with water, and distilling off the solvent. After the isolation of the product, purification can be conducted by a method, such as fractionation by chromatography, and recrystallization.

Among the compounds represented by the above formula (19), it is preferable that $X^1$ and $X^2$ are each independently a halogen atom, alkylsulfonate group, arylsulfonate group, arylalkylsulfonate group, boric ester group, or boric acid group, in view of easiness of synthesis and functional-group conversion.

The compound represented by the above formula (19) can be synthesized by reacting the compound represented by the below formula (20), with a Grignard reagent, or an organo Li compound.

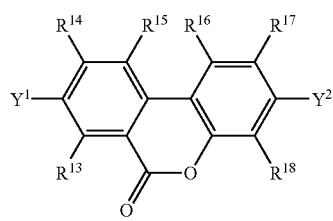
(20)

(Wherein, $R^{13}$-$R^{18}$, $Y^1$ and $Y^2$ represent the same meaning as the above.)

As the Grignard reagent used for the above reaction, exemplified are: methyl magnesium chloride, methyl magnesium bromide, ethyl magnesium chloride, ethyl magnesium bromide, propyl magnesium chloride, propyl magnesium bromide, butyl magnesium chloride, butyl magnesium bromide, hexyl magnesium bromide, octyl magnesium bromide, decyl magnesium bromide, allyl magnesium chloride, allyl magnesium bromide, benzyl magnesium chloride, phenyl magnesium bromide, naphtyl magnesium bromide, tolyl magnesium bromide, etc.

As the organo Li compound, exemplified are: methyl lithium, ethyl lithium, propyl lithium, butyl lithium, phenyl lithium, naphtyl lithium, benzyl lithium, tolyl lithium, etc.

The method of the reaction is not limited, and it can be carried out in the existence of a solvent under inert gas atmosphere, such as nitrogen and argon. The reaction temperature is preferably from −80° C. to the boiling point of the solvent.

As the solvent used for the reaction, exemplified are: saturated hydrocarbons, such as pentane, hexane, heptane, octane, and cyclohexane; unsaturated hydrocarbon, such as benzene, toluene, ethyl benzene, and xylene; and ethers, such as dimethyl ether, diethyl ether, methyl-t-butyl ether, tetrahydrofuran, tetrahydropyran, and dioxane. These may be used as a single solvent or a mixed solvent thereof.

After the reaction, it can be obtained by usual post-treatment, for example, such as, after quenching with water, it is extracted by an organic solvent, and the solvent is distilled off. After the isolation of the product, purification can be conducted by a method, such as fractionation by chromatography, and recrystallization.

Moreover, in the present invention, among the compounds represented by the above formula (20), the compound represented by the below formula (22) can be produced by reacting the compound represented by a below formula (21) with sodium perborate.

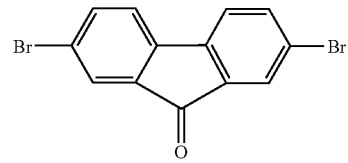
(21)

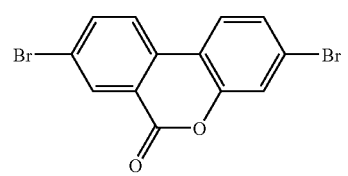
(22)

The method of reaction can be conducted in existence of carboxylic acid solvents, such as acetic acid, trifluoro acetic acid, propionic acid, and butyric acid. In order to improve the solubility, it is preferable to carry out in mixed solvent, such as, with carbon tetrachloride, chloroform, dichloromethane, benzene, and toluene. The reaction temperature is preferably 0° C. to a boiling point of the solvent.

After the reaction, it can be obtained by usual post-treatment, for example, such as, after quenching with water, it is extracted by an organic solvent, and the solvent is distilled off. After the isolation of the product, purification can be conducted by a method, such as fractionation by chromatography, and recrystallization.

The polymer compound containing repeating units represented by the below formula (20-1), (23-1), (24-1) and (25-1) can be manufactured by conducting condensation polymerization of the compounds represented by the above formula (20), below formulas (23), (24) and (25), as one of the raw materials, respectively.

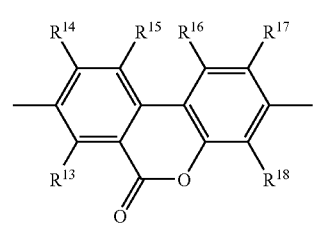
(20-1)

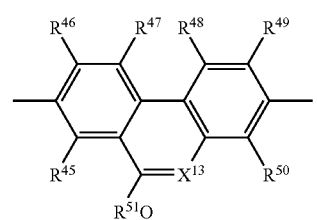
(23-1)

Wherein, $X^{13}$ represents a boron atom, a nitrogen atom, or a phosphorus atom. $R^{45}$, $R^{46}$, $R^{47}$, $R^{48}$, $R^{49}$, $R^{50}$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, imide group, imine residue, amino group, substituted amino group, substituted silyl group, substituted silyloxy group, substituted silylthio group, substituted silylamino group, monovalent heterocyclic group, arylalkenyl group, arylethynyl group, carboxyl group, or cyano group is represented. $R^{46}$ and R$^{47}$, and R$^{48}$ and R$^{49}$ may be connected mutually to form a ring. R$^{51}$ represents an alkyl group, aryl group, arylalkyl group, or monovalent heterocyclic group.

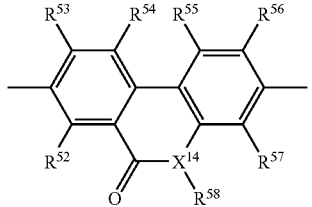

(24-1)

Wherein, X$^{14}$ represents a boron atom, a nitrogen atom, or a phosphorus atom. R$^{52}$, R$^{53}$, R$^{54}$, R$^{55}$, R$^{56}$, and R$^{57}$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, imide group, imine residue, amino group, substituted amino group, substituted silyl group, substituted silyloxy group, substituted silylthio group, substituted silylamino group, monovalent heterocyclic group, arylalkenyl group, arylethynyl group, carboxyl group, or cyano group. R$^{53}$ and R$^{54}$, and R$^{55}$ and R$^{56}$ may be connected mutually to form a ring. R$^{58}$ represents an alkyl group, aryl group, arylalkyl group, or monovalent heterocyclic group.

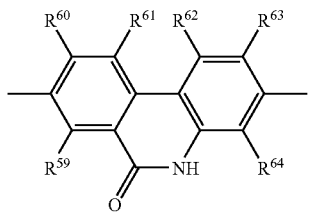

(25-1)

Wherein, R$^{59}$, R$^{60}$, R$^{61}$, R$^{62}$, R$^{63}$ and R$^{64}$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, imide group, imine residue, amino group, substituted amino group, substituted silyl group, substituted silyloxy group, substituted silylthio group, substituted silylamino group, monovalent heterocyclic group, arylalkenyl group, arylethynyl group, carboxyl group, or cyano group. R$^{60}$ and R$^{61}$, and R$^{62}$ and R$^{63}$ may be connected mutually to form a ring.

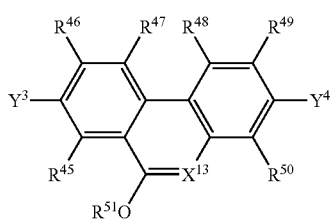

(23)

Wherein, X$^{13}$, R$^{45}$, R$^{46}$, R$^{47}$, R$^{48}$, R$^{49}$, R$^{50}$ and R$^{51}$ are the same as those of the above. Y$^{3}$ and Y$^{4}$ each independently represent a halogen atom, alkylsulfonate group, arylsulfonate group, arylalkylsulfonate group, boric ester group, sulfonium-methyl group, phosphonium-methyl group, phosphonate-methyl group, monohalogenated-methyl group, boric-acid group, formyl group or vinyl group.

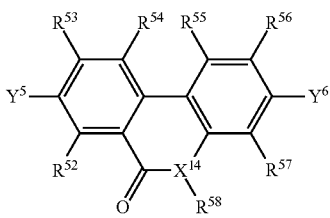

(24)

Wherein, X$^{14}$, R$^{52}$, R$^{53}$, R$^{54}$, R$^{55}$, R$^{56}$, R$^{57}$ and R$^{58}$ are the same as those of the above. Y$^{5}$ and Y$^{6}$ each independently represent a halogen atom, alkylsulfonate group, arylsulfonate group, arylalkylsulfonate group, boric ester group, sulfonium-methyl group, phosphonium-methyl group, phosphonate-methyl group, monohalogenated-methyl group, boric-acid group, formyl group, or vinyl group.

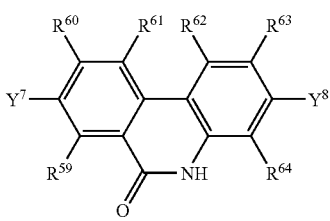

(25)

Wherein, R$^{59}$, R$^{60}$, R$^{61}$, R$^{62}$, R$^{63}$ and R$^{64}$ are the same as those of the above. Y$^{7}$ and Y$^{8}$ each independently represent a halogen atom, alkylsulfonate group, arylsulfonate group, arylalkylsulfonate group, boric ester group, sulfonium-methyl group, phosphonium-methyl group, phosphonate-methyl group, monohalogenated-methyl group, boric-acid group, formyl group, or vinyl group.

The compound represented by the above formulas (23) and (24) can be manufactured by reacting the compound represented by an above formula (25) with a halogenated compound in existence of base.

Examples of the base include: metal hydrides, such as hydrogenation lithium, sodium and potassium hydride; organic lithium reagents, such as methyl lithium, n-butyl lithium, sec-butyl lithium, t-butyl lithium, and phenyl lithium; Grignard reagents, such as methyl magnesium bromide, methyl magnesium chloride, ethyl magnesium bromide, ethyl magnesium chloride, allyl magnesium bromide, allyl magnesium chloride, phenyl magnesium bromide, benzyl magnesium chloride; alkali metal amides, such as lithium diisopropylamide, lithium hexamethyldisilazide, sodium hexamethyldisilazide, potassium hexamethyl disilazide; inorganic-salt groups, such as lithium hydroxide, sodium hydroxide, potassium hydroxide, lithium carbonate, sodium carbonate, and potassium carbonate; or the mixtures thereof.

Examples of the halogenated compounds include methyl chloride, methyl bromide, methyl iodide, ethyl chloride, ethyl bromide, ethyl iodide, propyl chloride, propyl bromide, propyl iodide, butyl chloride, butyl bromide, butyl iodide, hexyl chloride, hexyl bromide, octyl chloride, octyl bromide, decyl chloride, allyl chloride, allyl bromide, benzyl chloride, benzyl bromide, benzyl chloride, benzyl bromide, tolyl chloride, tolyl bromide, tolyl iodide, anisyl chloride, anisyl bromide, iodation anisyl, etc.

The reaction can be carried out in existence of a solvent under inert-gas atmosphere, such as nitrogen and argon. at a The temperature is preferably between the boiling point and the melting point of the solvent.

Examples of the solvent used for the reaction include: saturated hydrocarbons, such as pentane, hexane, heptane, octane, cyclohexane, etc.; unsaturated hydrocarbons, such as benzene, toluene, ethylbenzene, xylene, etc.; ethers, such as dimethyl ether, diethyl ether, methyl-t-butyl ether, tetrahydrofuran, tetrahydropyran, dioxane, etc; amines, such as trimethylamine, triethyl amine, N,N,N',N'-tetramethylethylenediamine, pyridine, etc.; amides, such as N,N-dimethylformamide, N,N-dimethylacetamide, N,N-diethylacetamide, N-methylmorpholine oxide, N-methyl-2-pyrrolidone, etc; and a single solvent or a mixed solvent thereof can be used.

After the reaction, it can be obtained by usual post-treatment, for example, by extraction with an organic solvent after quenching with water, and distilling off the solvent. After the isolation of the product, purification can be conducted by a method, such as fractionation by chromatography, and recrystallization.

The polymer light-emitting material showing light-emission from triplet excited state (triplet light-emitting material) used for the present invention is explained. Here, the polymer light-emitting material include a material in which phosphorescence light-emission is observed, and a material in which fluorescence light-emission is observed in addition to the phosphorescence light-emission.

In case of using a triplet light-emitting material for a light emitting layer, a composition comprising a polymer compound as matrix and a low molecular weight triplet light-emitting compound may be used as said material. Also, a polymer complex compound having a structure of triplet light-emitting compound at the side chain, main chain or terminal of the polymer may be used. Furthermore, a composition comprising a polymer compound as matrix and a polymer complex compound may be used.

As the triplet light-emitting compound used as an ingredient of a composition for polymer light-emitting material, a metal complex compound (triplet light-emitting complex compound) which has been used as a low molecular weight EL light-emission material from the former is exemplified.

These are disclosed by, for example, Nature, (1998) 395, 151; Appl. Phys. Lett. (1999), 75(1), 4; Proc. SPIE-Int. Soc. Opt. Eng. (2001), 4105 (Organic Light-Emitting Materials and Devices IV, 119; J. Am. Chem. Soc., (2001), 123, 4304; Appl. Phys. Lett., (1997), 71(18), 2596; Syn. Met., (1998), 94(1), 103; Syn. Met., (1999), 99(2), 1361; Adv. Mater., (1999), 11 (10), 852, etc.

The center metal of a triplet light-emitting complex compound is usually a metal having an atomic number of 50 or more, manifesting a spin-orbital mutual action on this complex and showing a possibility of the intersystem crossing between the singlet state and the triplet state.

Examples of the central metal of the triplet light-emitting complex compound include rhenium, iridium, osmium, scandium, yttrium, platinum, gold, and lanthanoids such as europium, terbium, thulium, dysprosium, samarium, praseodymium, gadolinium, etc. Rhenium, iridium, platinum, gold, and europium are preferable, and rhenium, iridium, platinum, and gold are especially preferable.

Examples of the ligand of triplet light-emitting complex compound include, 8-quinolinol and derivatives thereof, benzoquinolinol and derivatives thereof, 2-phenyl-pyridine and derivatives thereof, 2-phenyl-benzothiazole and derivatives thereof, 2-phenyl-benzoxazole and derivatives thereof, porphyrin and derivatives thereof, etc.

As the triplet light-emitting complex compound, for example, followings (PL-1-PL-37) are exemplified.

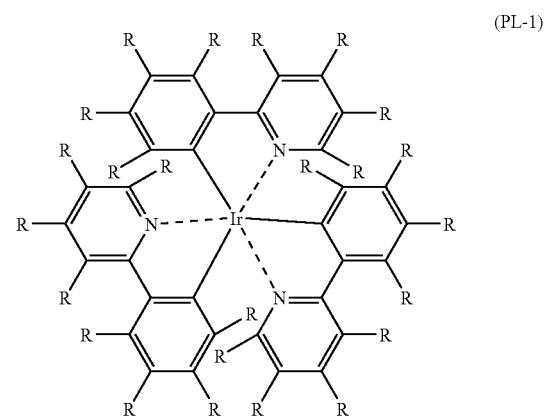

(PL-1)

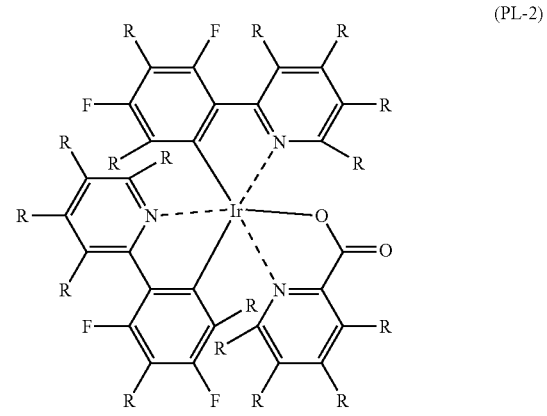

(PL-2)

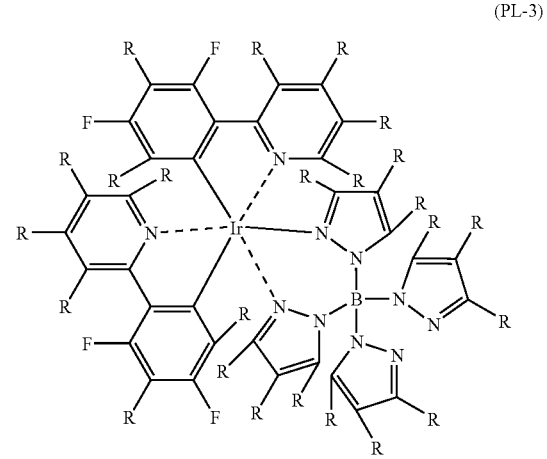

(PL-3)

(PL-4)
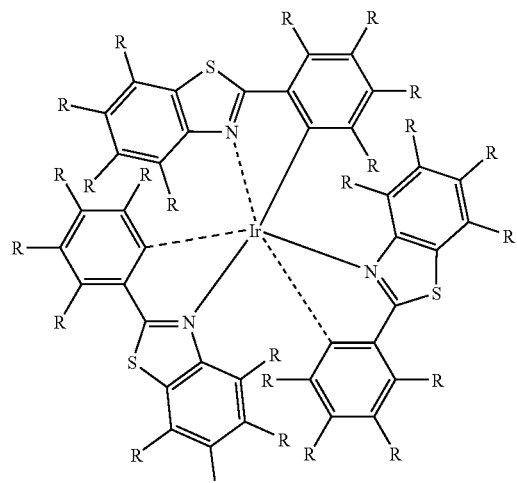
(PL-5)
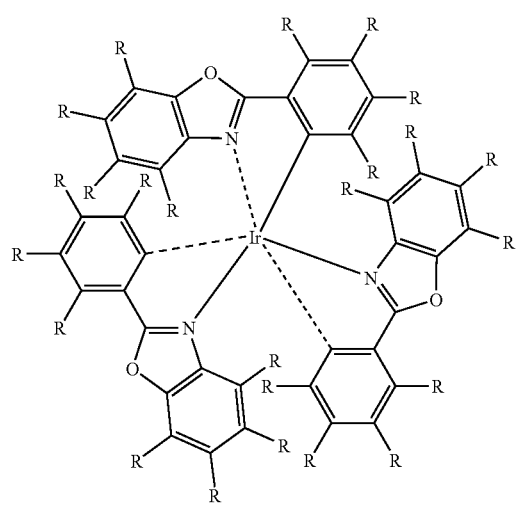
(PL-6)
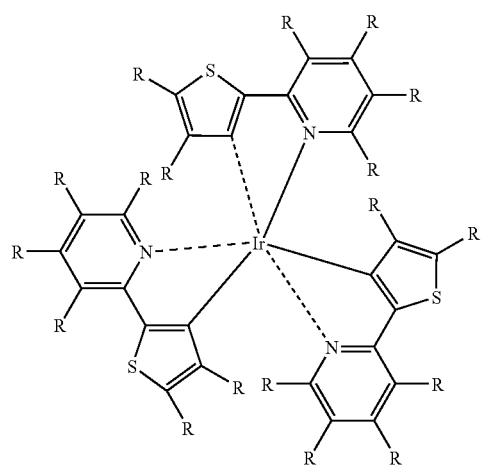
(PL-7)
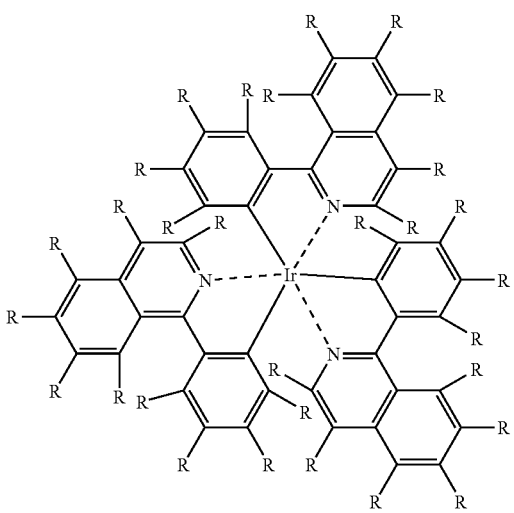
(PL-8)
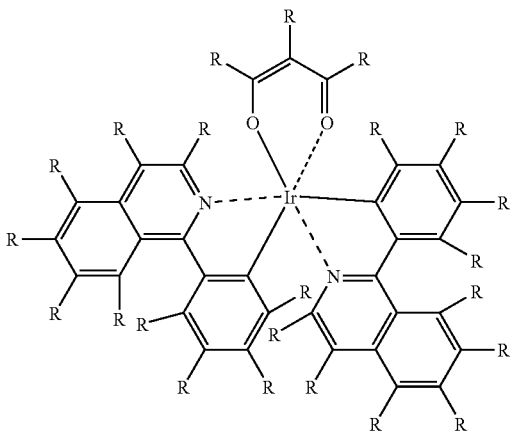
(PL-9)
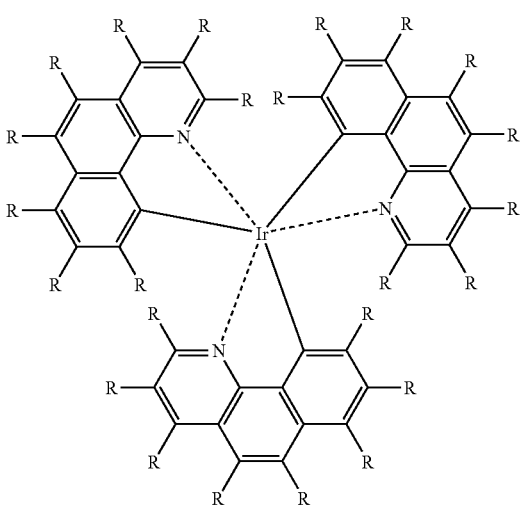

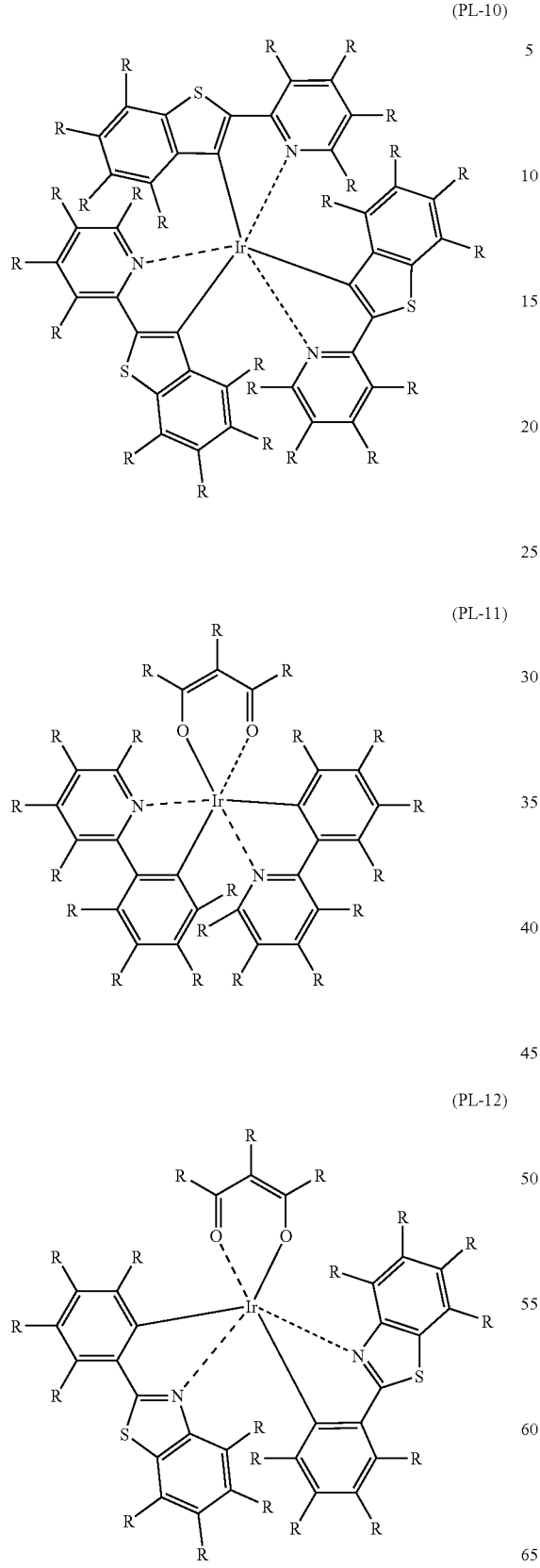
(PL-10)
(PL-11)
(PL-12)
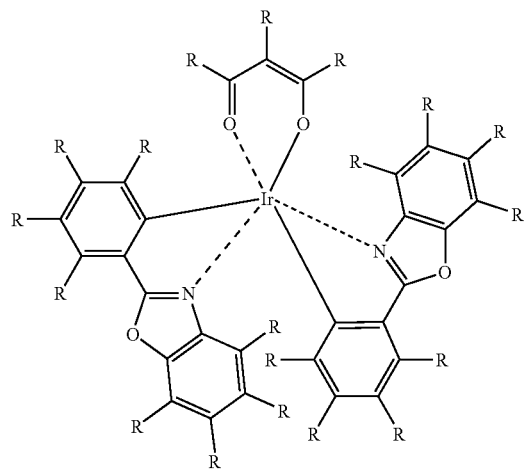
(PL-13)
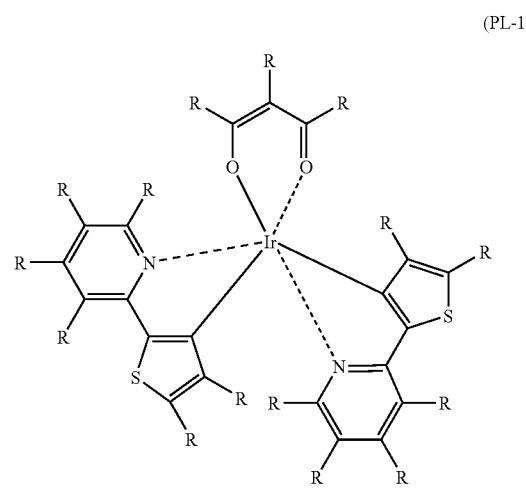
(PL-14)
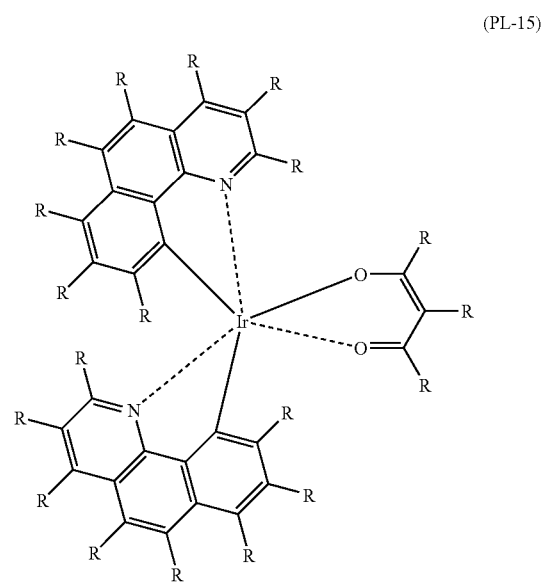
(PL-15)

(PL-16)
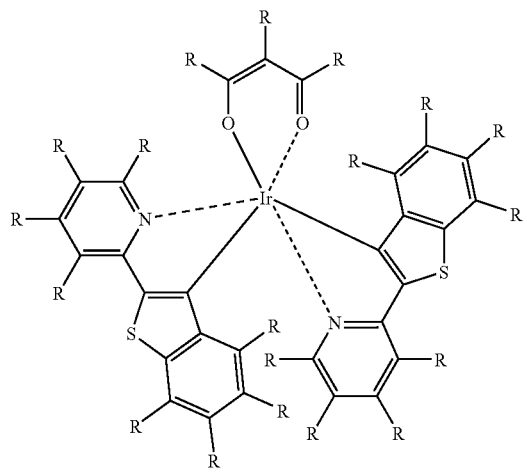
(PL-17)
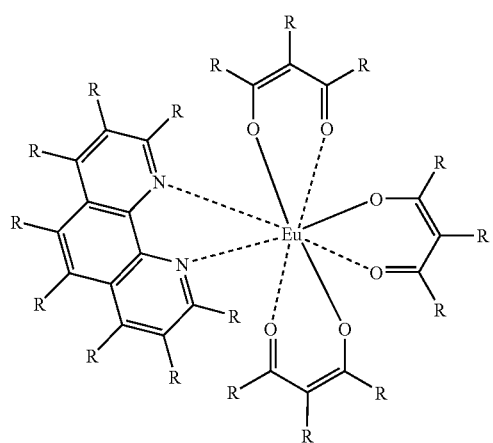
(PL-18)
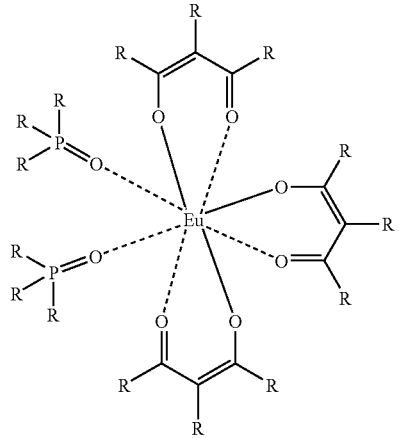
(PL-19)
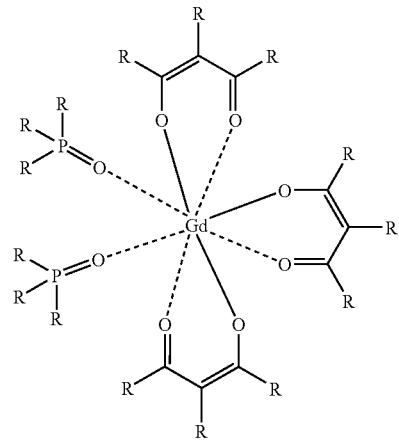
(PL-20)
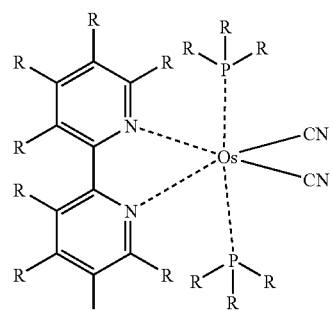
(PL-21)
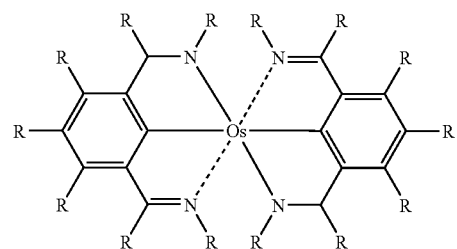
(PL-22)
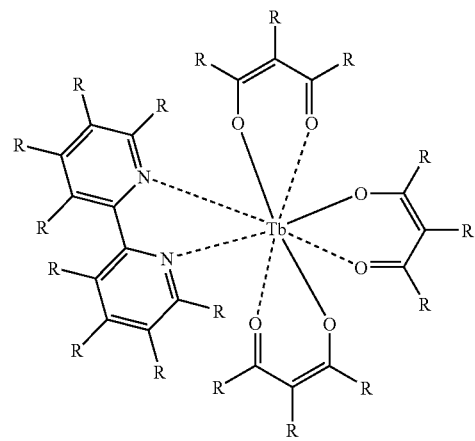

(PL-23)
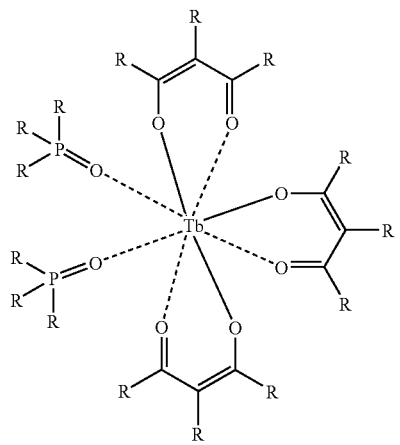
(PL-24)
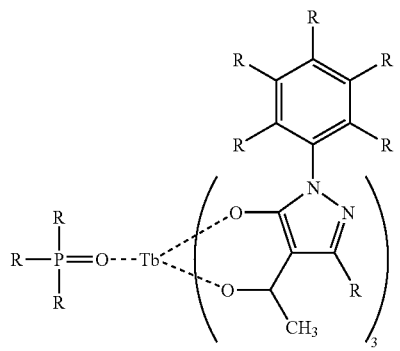
(PL-25)
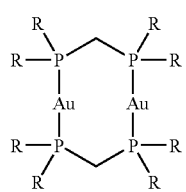
(PL-26)
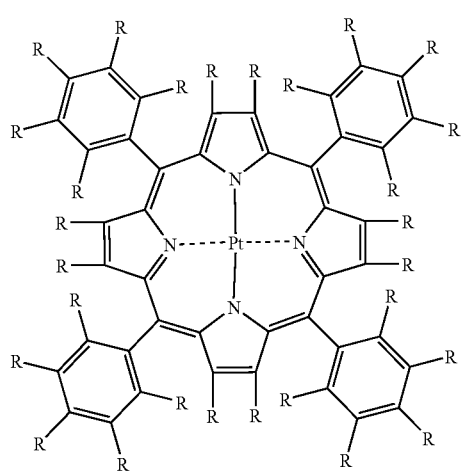
(PL-27)
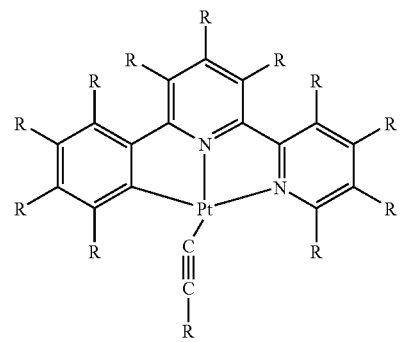
(PL-28)
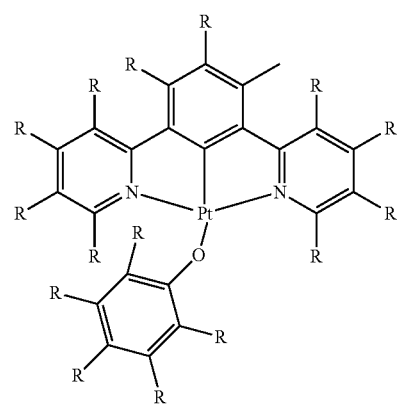
(PL-29)
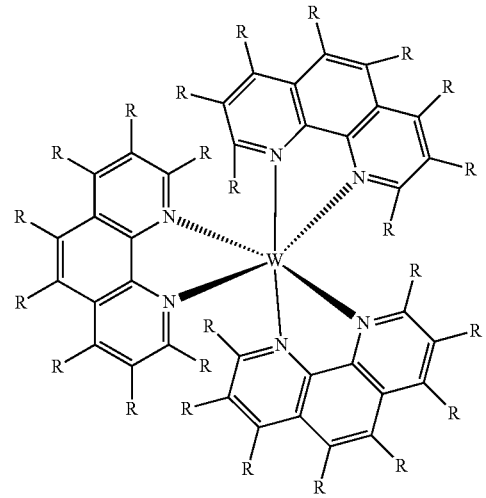
(PL-30)
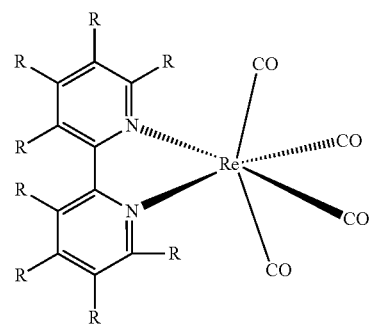

(PL-31) 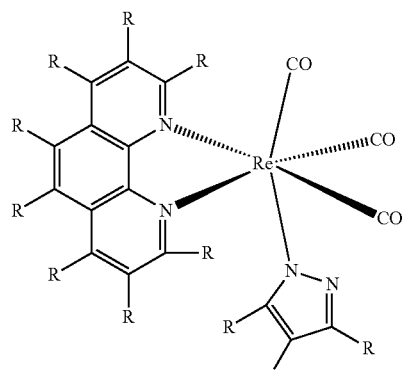

(PL-32) 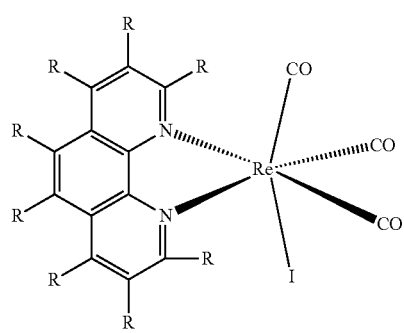

(PL-33) 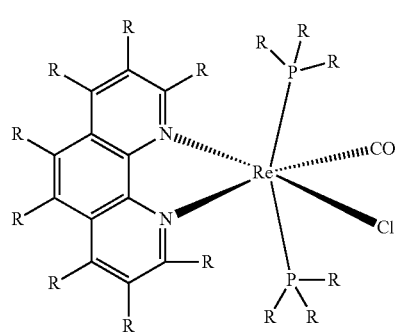

(PL-34) 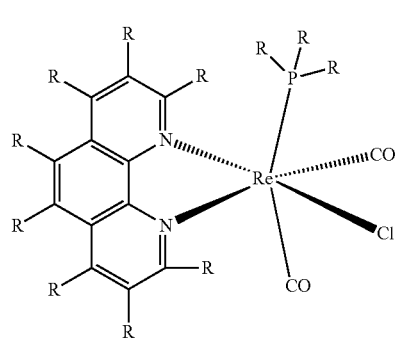

(PL-35) 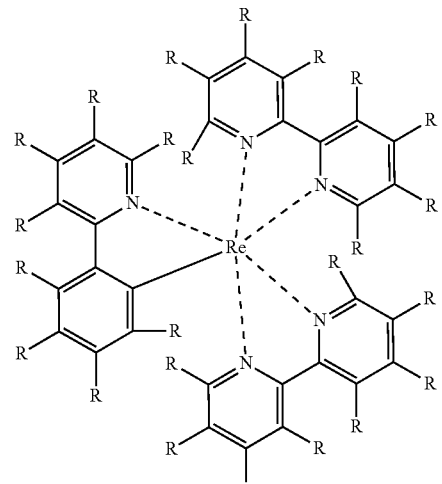

(PL-36) 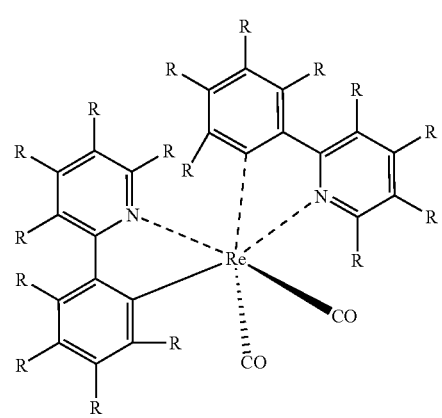

(PL-37) 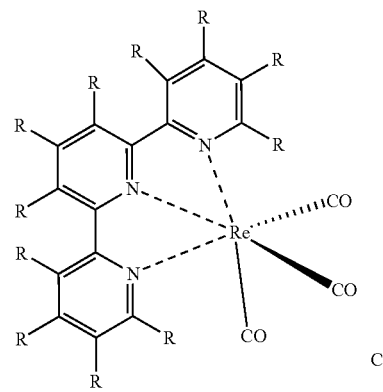

Wherein, R each independently represent a group selected from the group consisting of hydrogen atom, alkyl group, alkoxy group, alkylthio group, alkylsilyl group, alkylamino group, aryl group, aryloxy group, arylalkyl group, arylalkoxy group, arylalkenyl group, arylalkynyl group, arylamino group, monovalent heterocyclic group, and cyano group. In order to improve the solubility in a solvent, alkyl group and alkoxy group are preferable, and it is preferable that the repeating unit including substituent has a form of little symmetry.

Examples of the triplet light-emitting complex, shown in further detail, include a structure represented by the below formula (26).

$$(H)_h\text{-}M\text{-}(K)_k \tag{26}$$

In the formula, K represents a ligand containing one or more atoms, as an atom which bonds to M, selected from a nitrogen atom, oxygen atom, carbon atom, sulfur atom, and phosphorus atom; a halogen atom, or a hydrogen atom. h represents an integer of 0 to 5, k represents an integer of 1 to 5 and h+k represents an integer of 1 to 5.

Examples of the ligand containing one or more atoms, as an atom which bonds to M, selected from a nitrogen atom, oxygen atom, carbon atom, sulfur atom, and phosphorus atom include an alkyl group, alkyloxy group, acyloxy group, alkylthio group, aryl group, aryloxy group, arylthio group, arylalkyl group, arylalkyloxy group, arylalkylthio group, substituted amino group, sulfonate group, cyano group, monovalent heterocyclic group, a carbonyl compound, ether, amine, imine, phosphine, phosphite, sulfide, alkene ligand, alkyne ligand, isonitril ligand, phosphineoxide ligand, phosphite, sulfone ligand, sulfoxide ligand, and carboxyl group. The bond of this ligand with M may be a coordinate bond or a covalent bond. Moreover, the bond may be a multidentate ligand derived by combination thereof.

Alkyl group, alkyloxy group, acyloxy group, alkylthio group, aryl group, aryloxy group, arylthio group, arylalkyl group, arylalkyloxy group, arylalkylthio group, substituted amino group, and monovalent heterocyclic group are the same as those explained in $R^1$-$R^8$.

The sulfonate group has preferably 2-20 carbon atoms, and examples thereof include benzene sulfonate group, p-toluene sulfonate group, methane sulfonate group, ethane sulfonate group, and trifluoromethane sulfonate group.

The carbonyl compound has a coordinate bond to M at oxygen atom, and has preferably 2-20 carbon atoms, and examples thereof include ketones, such as carbon monoxide, and acetone, benzophenone, and diketones, such as acetyl acetone, and acenaphtho quinone.

The ether has a coordinate bond to M at oxygen atom, and has preferably 2-40 carbon atoms, and examples thereof include dimethyl ether, diethyl ether, tetrahydrofuran, 1,2-dimethoxy ethane, etc.

The amine has a coordinate bond to M at nitrogen atom, and has preferably 2-60 carbon atoms, and examples thereof include mono amines, such as trimethylamine, triethyl amine, tributyl amine, tribenzyl amine, triphenyl amine, dimethylphenyl amine, and methyl diphenyl amine, and diamines, such as 1,1,2,2-tetramethylethylenediamine, 1,1,2,2-tetraphenyl ethylenediamine, and 1,1,2,2-tetramethyl-o-phenylene diamine.

The imine has a coordinate bond to M at nitrogen atom, and has preferably 2-30 carbon atoms, and examples thereof include mono imines, such as benzylidene aniline, benzylidene benzyl amine, and benzylidene methylamine, diimines, such as dibenzylidine ethylenediamine, dibenzylidine-o-phenylene diamine, and 2,3-bis(anilino)butane.

The phosphine has a coordinate bond to M at phosphorus atom, and has preferably 2-60 carbon atoms, and examples thereof include triphenyl phosphine, diphenyl phosphinoethane, and diphenyl phosphinopropane.

The phosphite has a coordinate bond to M at phosphorus atom, and has preferably 2-60 carbon atoms, and examples thereof include trimethyl phosphite, triethyl phosphite, and triphenyl phosphite.

The sulfide has a coordinate bond to M at sulfur atom, and has preferably 2-40 carbon atoms, and examples thereof include dimethyl sulfide, diethyl sulfide, diphenyl sulfide, and thioanisole.

The alkene ligand, without being limited especially, has preferably 2-20 carbon atoms, and examples thereof include ethylene, propylene, butene, hexene and decene.

The alkyne ligand, without being limited especially, has preferably 2-20 carbon atoms, and examples thereof include acetylene, phenyl acetylene, and diphenyl acetylene.

The isonitril ligand, without being limited especially, has preferably 2-30 carbon atoms, and examples thereof include t-butyl isonitril and phenyl isonitril.

The phosphine oxide ligand, without being limited especially, has preferably 2-30 carbon atoms, and examples thereof include tributylphosphine oxide and triphenylphosphine oxide.

The phosphite has a coordinate bond to M at phosphorus atom, and has preferably 2-60 carbon atoms, and examples thereof include trimethyl phosphite, triethyl phosphite, triphenyl phosphite, and tribenzyl phosphite.

The sulfone ligand, without being limited especially, has preferably 2-40 carbon atoms, and examples thereof include dimethyl sulfone and dibutyl sulfone.

The sulfoxide ligand, without being limited especially, has preferably 2-40 carbon atoms, and examples thereof include dimethyl sulfoxide and dibutyl sulfoxide.

The carboxyl group, without being limited especially, has preferably 2-20 carbon atoms, and examples thereof include acetoxy group, naphthenate group, and 2-ethylhexanoate group.

The multidentate ligand derived by combination thereof (group of bi-dentate or more), has preferably 2-60 carbon atoms, and examples thereof include: groups in which a heterocycle and a benzene ring are bonded, such as phenylpyridine, 2-(paraphenylphenyl)pyridine, 2-phenylbenzoxazole, 2-(paraphenylphenyl)benzoxazole, 2-phenylbenzothiazole, 2-(paraphenylphenyl)benzothiazole, etc.; groups in which two or more heterocycles are bonded, such as, 2-(4-thiophene-2-yl)pyridine, 2-(4-phenyl thiophene-2-yl)pyridine, 2-(benzothiophene-2-yl)pyridine, 2,3,7,8,12,13,17,18-octaethyl-21H,23H-porphyrin; and acetonates, such as acetylacetonate, dibenzomethylate and thenoyl trifluoro acetonate.

M is a metal having an atomic number of 50 or more, and showing a possibility of the intersystem crossing between the singlet state and the triplet state by spin-orbital mutual action on this complex.

Examples of represented by M include a rhenium atom, iridium atom, osmium atom, scandium atom, yttrium atom, platinum atom, gold atom, and lanthanoids such as an europium atom, terbium atom, thulium atom, dysprosium atom, samarium atom, and praseodymium atom. Rhenium atom, iridium atom, platinum atom, gold atom, and europium atom are preferable, and in view of light-emitting efficiency, rhenium atom, iridium atom, platinum atom, and gold atom are more preferable.

H represents a ligand containing one or more atoms selected from a nitrogen atom, oxygen atom, carbon atom, a sulfur atom, and a phosphorus atom, as an atom which bonds to M.

The ligands containing one or more atoms selected from a nitrogen atom, oxygen atom, carbon atom, sulfur atom, and phosphorus atom as the atom which bonds to M, are the same as those exemplified about K.

As H, followings are exemplified. In the formula, * represents an atom which bonds to M.

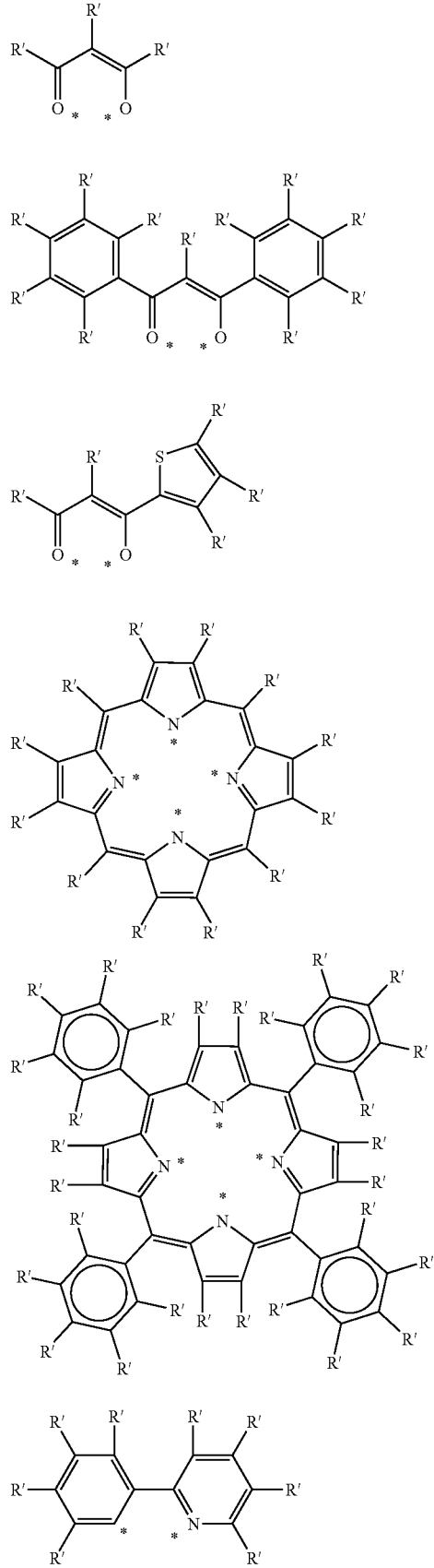
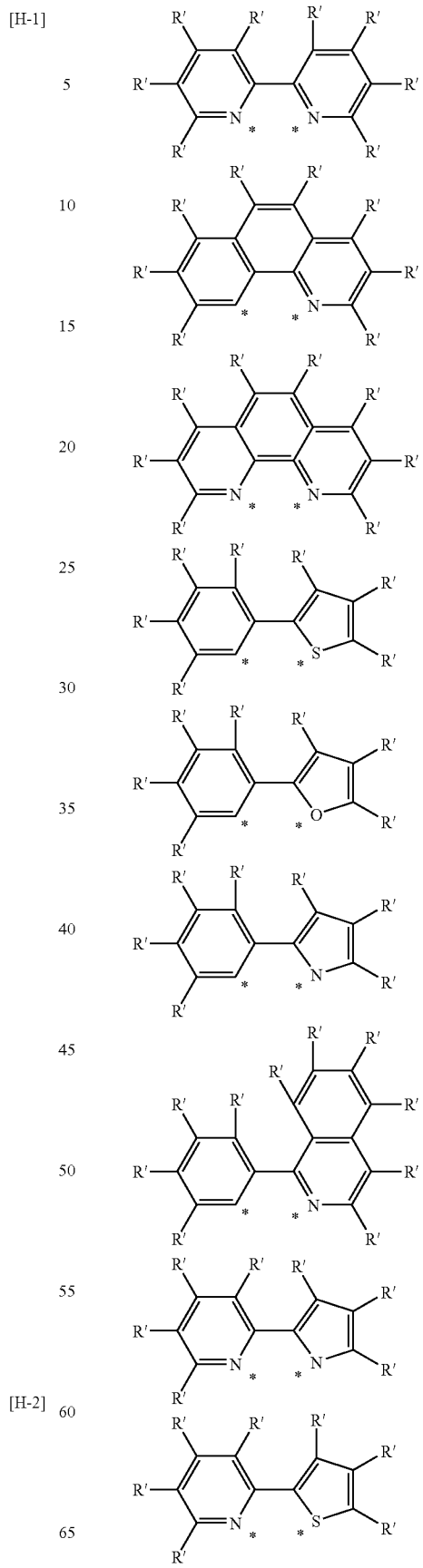
[H-1]
[H-2]

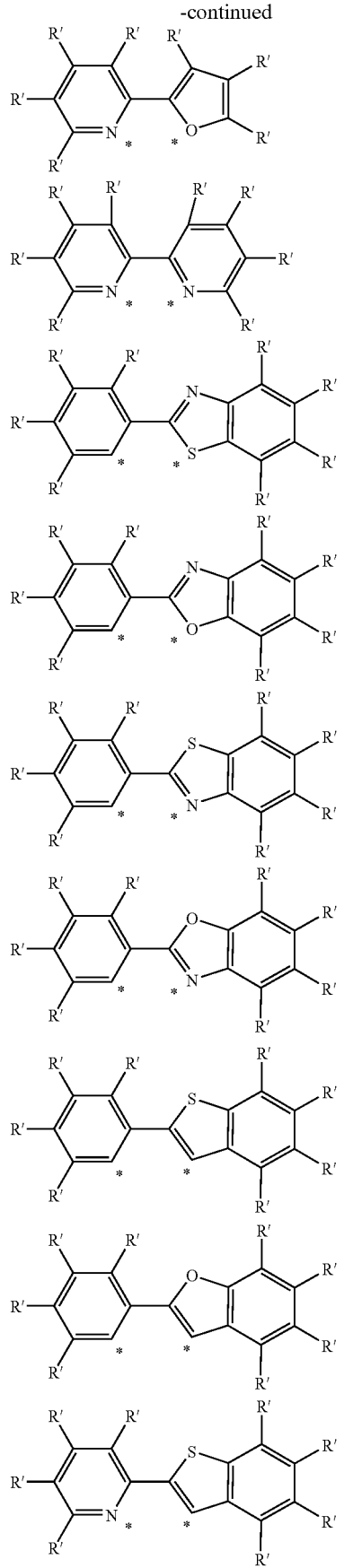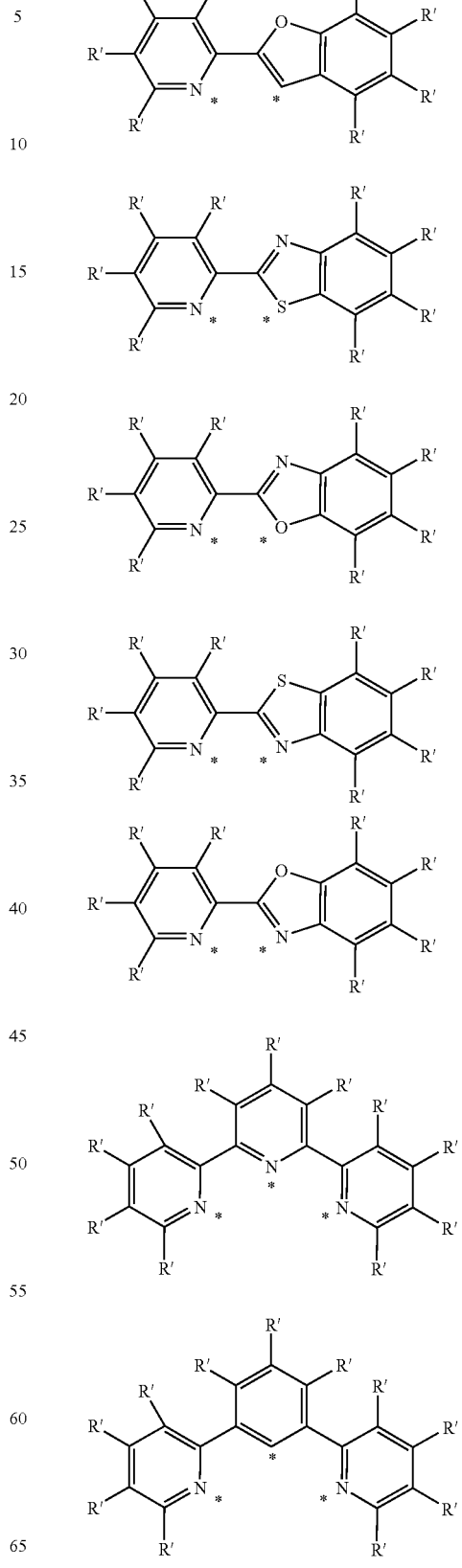

Wherein R' each independently represent a hydrogen atom, halogen atom, alkyl group, alkoxy group, alkylthio group, aryl group, aryloxy group, arylthio group, arylalkyl group, arylalkoxy group, arylalkylthio group, substituted amino group, substituted silyl group, acyl group, acyloxy group, imine residue, amide group, arylalkenyl group, arylalkynyl group, cyano group, or monovalent heterocyclic group. R' may be connected mutually to form a ring. In order to improve the solubility into a solvent, it is preferable that at least one of the R' contains an alkyl group of long chain.

Concrete example of halogen atom, alkyl group, alkoxy group, acyloxy group, alkylthio group, aryl group, aryloxy group, arylthio group, arylalkyl group, arylalkoxy group, arylalkylthio group, substituted amino group, substituted silyl group, acyl group, acyloxy group, imine residue, amide group, arylalkenyl group, arylalkynyl group, and monovalent heterocyclic group are the same as those exemplified in the above $R^1$-$R^8$.

It is preferable that H bonds to M with at least one nitrogen atom or carbon atom in view of the stability of the compound, and it is more preferable that H bonds to M at multidentate.

It is more preferable that H is represented by the below formulas (H-3)-(H-8) in view of the stability of the compound.

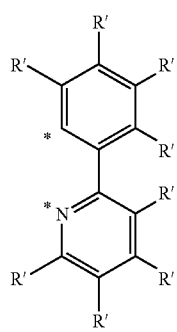

(H-3)

(Wherein, R' represents the same group with those of the above, and * represents the site which bonds to M.)

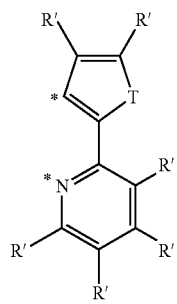

(H-4)

(Wherein, R' represents the same group with those of the above, and * represents the site which bonds to M.)

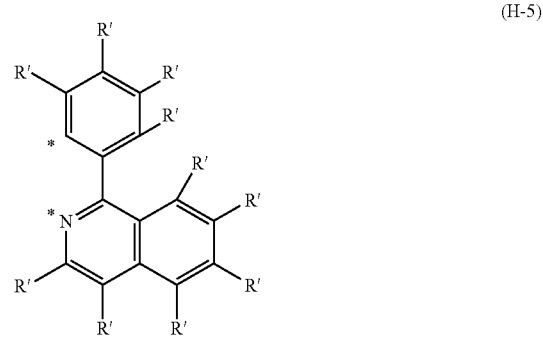

(H-5)

(Wherein, R' represents the same group with those of the above, and * represents the site which bonds to M.)

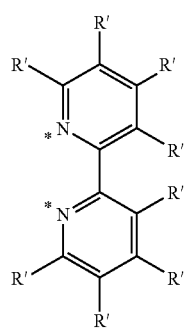

(H-6)

(Wherein, R' represents the same group with those of the above, and * represents the site which bonds to M.)

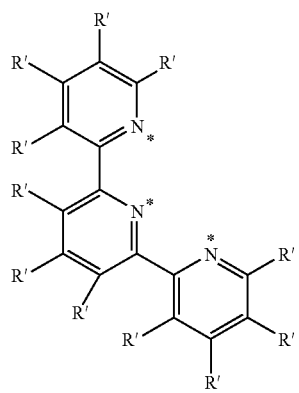

(H-7)

(Wherein, R' represents the same group with those of the above, and * represents the site which bonds to M.)

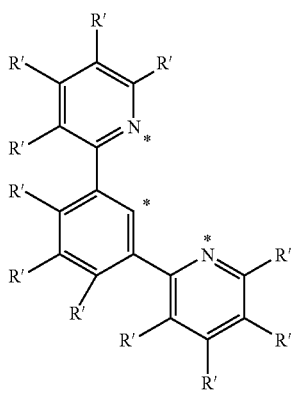

(H-8)

(Wherein, R' represents the same group with those of the above, and * represents the site which bonds to M.)

The polymer complex compound in the present invention has characteristics of comprising a repeating unit represented by the below formula (27), (28), (29) or (30), and having a polystyrene reduced number average molecular weights of $10^3$-$10^8$, and has a structure showing light-emission from triplet excited state at the side chain, main chain or terminal.

In the case having a structure of low molecular weight triplet light-emitting complex at the side chain of polymer compound, the structure is represented, for example, by the below formula (27).

  (27)

[wherein, $Ar^{18}$ represents a divalent aromatic hydrocarbon group or a divalent heterocyclic group which has one or more atoms selected from the group consisting of an oxygen atom, silicon atom, germanium atom, tin atom, phosphorus atom, boron atom, sulfur atom, selenium atom, and tellurium atom. Said $Ar^{18}$ has one to 4 groups represented by -L-X, X represents a monovalent group containing a metal complex showing light-emission from triplet excited state. L represents a single bond, —O—, —S—, —CO—, —CO$_2$—, —SO—, —SO$_2$—, —SiR$^{68}$R$^{69}$—, NR$^{70}$—, —BR$^{71}$—, —PR$^{72}$—, —P(=O) (R$^{73}$)—, alkylene group which may be substituted, alkenylene group which may be substituted, alkynylene group which may be substituted, arylene group which may be substituted, or divalent heterocyclic group which may be substituted. When this alkylene group, alkenylene group and alkynylene group contain —CH$_2$— group, one or more of —CH$_2$— groups contained in the alkylene group, and one or more of —CH$_2$— groups contained in the alkenylene group and one or more of —CH$_2$— groups contained in the alkynylene group, respectively may be replaced with the group selected from the group consisting of —O—, —S—, —CO—, —CO$_2$—, —SO—, —SO$_2$—, —SiR$^{74}$R$^{75}$—, NR$^{76}$—, —BR$^{77}$—, —PR$^{78}$— and —P(=O)(R$^{79}$)—. R$^{68}$, R$^{69}$, R$^{70}$, R$^{71}$, R$^{72}$, R$^{73}$, R$^{74}$, R$^{75}$R$^{76}$, R$^{77}$, R$^{78}$ and R$^{79}$ each independently represent a group selected from the group consisting of a hydrogen atom, alkyl group, aryl group, monovalent heterocyclic group, and cyano group. Further, $Ar^{18}$ may have a substituent selected from the group consisting of an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group, and cyano group, in addition to the group represented by -L-X. When $Ar^{18}$ has a plurality of substituents, they may be the same or different.]

When a partial structure of low molecular weight triplet light-emitting complex compound is contained in the main chain of a polymer compound, the structure is represented, for example, by the below formula (28) and (29).

 (28)

[wherein, M, H and K represent the same atoms or groups with those described in above formula (26). $L_1$ represents a residue in which two hydrogen atoms are removed from a ligand containing one or more atoms as the atom which bonds to M, selected from a nitrogen atom, oxygen atom, carbon atom, sulfur atom, and phosphorus atom. $h_1$ represents an integer of 0 to 5, $k_1$ represents an integer of 1 to 5, and $h_1$+$k_1$ represents an integer of 1 to 5.]

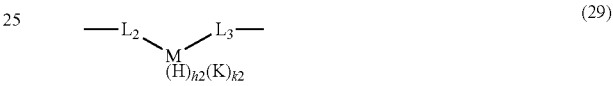 (29)

[wherein, M, H and K represent the same atoms or groups with those described in above formula (26). $L_2$ and $L_3$ each independently represents a residue in which a hydrogen atom is removed from a ligand containing one or more atoms as the atom which bonds to M, selected from a nitrogen atom, oxygen atom, carbon atom, sulfur atom, and phosphorus atom. $h_2$ represents an integer of 0 to 5, $k_2$ represents an integer of 1 to 5, and $h_2$+$k_2$ represents an integer of 1 to 5.]

When a partial structure of low molecular weight triplet light-emitting complex compound is contained in the terminal of a polymer compound, the structure is represented, for example, by the below formula (30).

 (30)

[wherein, M, H and K represent the same atoms or groups with those described in above formula (26). $L_4$ represents a residue in which a hydrogen atom is removed from a ligand containing one or more atoms as the atom which bonds to M, selected from a nitrogen atom, oxygen atom, carbon atom, sulfur atom, and phosphorus atom. $h_3$ represents an integer of 0 to 5, $k_3$ represents an integer of 1 to 5, and $h_3$+$k_3$ represents an integer of 1 to 5.]

In the above formula (27), $Ar^{18}$ represents a divalent aromatic hydrocarbon group or a divalent heterocyclic group which has one or more atoms selected from the group consisting of an oxygen atom, silicon atom, germanium atom, tin atom, phosphorus atom, boron atom, sulfur atom, selenium atom, and tellurium atom, and has one to 4 groups represented by -L-X.

X in -L-X represents a monovalent group containing a partial structure of low molecular weight triplet light-emitting complex compound.

As X, those represented by the below formula (X-1) are exemplified.

 (X-1)

[wherein, M, H and K represent the same atoms or groups with those described in above formula (26). $L_5$ represents a residue in which a hydrogen atom is removed from a ligand containing one or more atoms as the atom which bonds to M, selected from a nitrogen atom, oxygen atom, carbon atom, sulfur atom, and phosphorus atom. $h_4$ represents an integer of 0 to 5, $k_4$ represents an integer of 1 to 5, and $h_4+k_4$ represents an integer of 1 to 5.]

In the above formula (X-1), examples of $L_5$ include a residue having a connecting bond with L, and in the residue, one R or a hydrogen atom on R shown in the above H is removed. Concrete examples thereof include the residues in which one R or a hydrogen atom on R is removed from the examples shown in the above structural formula.

L in the above -L-X represents a single bond, —O—, —S—, —CO—, —CO$_2$—, —SO—, —SO$_2$—, —SiR$^{80}$R$^{81}$—, NR$^{82}$—, —BR$^{83}$—, —PR$^{84}$—, —P(=O(R$^{85}$))—, alkylene group which may be substituted, alkenylene group which may be substituted, alkynylene group which may be substituted, arylene group which may be substituted, or divalent heterocyclic group which may be substituted. When this alkylene group, alkenylene group and alkynylene group contain —CH$_2$— group, one or more of —CH$_2$— groups contained in the alkylene group, and one or more of —CH$_2$— groups contained in the alkenylene group and one or more of —CH$_2$— groups contained in the alkynylene group, respectively may be replaced with the group selected from the group consisting of —O—, —S—, —CO—, —CO$_2$—, —SO—, —SO$_2$—, —SiR$^{86}$R$^{87}$—, NR$^{88}$—, —BR$^{89}$—, —PR$^{90}$— and —P(=O)(R$^{91}$)—. R$^{80}$, R$^{81}$, R$^{82}$, R$^{83}$, R$^{84}$, R$^{85}$, R$^{86}$, R$^{87}$, R$^{88}$, R$^{89}$, R$^{90}$ and R$^{91}$ each independently represent a group selected from the group consisting of a hydrogen atom, alkyl group, aryl group, monovalent heterocyclic group, and cyano group. Concrete examples of R$^{80}$-R$^{91}$ include the same with those shown in the above R$^1$-R$^8$.

When L is an alkylene group which may be substituted, the number of carbon atoms is usually about 1 to 12, examples of the substituents include an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, acid imide group, monovalent heterocyclic group, carboxyl group, substituted carboxyl group, cyano group, etc.

When the alkylene group contains two or more —CH$_2$— groups, one or more of the —CH$_2$— groups contained in the alkylene group may be replaced by a group selected from the group consisting of —O—, —S—, —CO—, —CO$_2$—, —SO—, —SO$_2$—, —SiR$^{86}$R$^{87}$—, NR$^{88}$—, —BR$^{89}$—, —PR$^{90}$—, and —P(=O)(R$^{91}$)—. As the preferable examples of the alkylene group, —C$_3$H$_6$—, —C$_4$H$_8$—, —C$_5$H$_{10}$—, —C$_6$H$_{12}$—, —C$_8$H$_{16}$—, —C$_{10}$H$_{20}$—, etc. are exemplified.

When L is an alkenylene group which may be substituted, the number of carbon atoms is usually about 1 to 12, examples of the substituents include an alkyl group, alkoxy group, alkylthio group, aryl group, aryloxy group, arylthio group, arylalkyl group, arylalkoxy group, arylalkylthio group, arylalkenyl group, arylalkynyl group, Amino group, substituted amino group, silyl group, substituted silyl group, halogen atom, acyl group, acyloxy group, imino group, amide group, acid imide group, monovalent heterocyclic group, carboxyl group, substituted carboxyl group, cyano group, etc.

When the alkenylene group contains —CH$_2$— group, one or more of the —CH$_2$— groups contained in the alkenylene group may be replaced by a group selected from the group consisting of —O—, —S—, —CO—, —CO$_2$—, —SO—, —SO$_2$—, —SiR$^{86}$R$^{87}$—, NR$^{88}$—, BR$^{89}$—, PR$^{90}$—, and —P(=O)(R$^{91}$)—. As the preferable examples of the alkenylene group, —CH=CH—, —CH=CH—CH2-, etc. are exemplified.

When L is an alkynylene group, the number of carbon atoms is usually about 1 to 12. Examples of the substituents include an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, acid imide group, monovalent heterocyclic group, carboxyl group, substituted carboxyl group, cyano group, etc.

When the alkynylene group contains —CH$_2$— group, one or more of the —CH$_2$— groups contained in the alkenylene group may be replaced by a group selected from the group consisting of —O—, —S—, —CO—, —CO$_2$—, —SO—, —SO$_2$—, SiR$^{86}$R$^{87}$—, NR$^{88}$—, —BR$^{89}$—, —PR$^{90}$—, and —P(=O)(R$^{91}$)—. As the preferable examples of the alkynylene group, —C≡C—, —CH$_2$—C≡C—CH$_2$—, etc are exemplified.

When L an arylene group which may be substituted, concrete examples of the arylene group include an atomic group in which two hydrogen atoms are removed from the aromatic ring of aromatic hydrocarbon having 6-60 carbon atoms, and preferably an atomic group in which two hydrogen atoms are removed from a benzene ring is exemplified. As the substituent which may be substituted on the aromatic ring, $C_1$-$C_{12}$ alkyl group, and $C_1$-$C_{12}$ alkoxy group are preferable.

When L is a divalent heterocyclic group which may be substituted, as the substituent which may be substituted on the heterocyclic group, $C_1$-$C_{12}$ alkyl group, and $C_1$-$C_{12}$ alkoxy group are preferable. The number of carbon atoms is usually about 4 to 60, and preferably 4 to 20. The number of carbon atoms of the substituent is not counted as the number of carbon atoms of the heterocyclic compound group. The heterocyclic compound means an organic compound having a cyclic structure in which heteroatom such as oxygen, sulfur, nitrogen, phosphorus, boron, etc. is contained in the cyclic structure as the element other than carbon atoms.

Concretely, thienyl group, $C_1$-$C_{12}$ alkylthienyl group, pyroryl group, furyl group, pyridyl group, $C_1$-$C_{12}$ alkylpyridyl group, piperidyl group, quinolyl group, isoquinolyl group, etc., and exemplified, and thienyl group, $C_1$-$C_{12}$ alkylthienyl group, pyridyl group, and $C_1$-$C_{12}$ alkylpyridyl group are preferable.

Among L, a single-bond, —O— and —S— are preferable.

As the concrete examples of the groups represented by -L-X, exemplified are: those wherein X is a residue in which one hydrogen atom is removed from a ligand of metal complex compound used as the above low molecular weight EL light-emitting material; or those wherein X a residue in which one hydrogen atom is removed from a substituent on a ligand AS the concrete structure of the above formula (X-1), exemplified are residues in which one R or a hydrogen in R is removed from each of the concrete examples (PL-1 to PL-37) of the triplet light-emitting complex represented by the above structural formula.

In the above formulas (28) to (30), as the ligand containing an atom which bonds to one or more M, selected from a nitrogen atom, oxygen atom, carbon atom, sulfur atom, and phosphorus atom, exemplified are an alkyl group, alkoxy group, acyloxy group, alkylthio group, aryl group, aryloxy group, arylthio group, arylalkyl group, arylalkoxy group, arylalkylthio group, amino group, substituted amino group, alkene, alkyne, Amine, imine, amide group, acid imide group, isonitril ligand, cyano group, phosphine, phosphine oxide ligand, phosphite, sulfone ligand, sulfoxide ligand, sulfonate group, sulfide, heterocyclic ligand, carboxyl group, carbonyl compound, and ether. Multidentate ligand derived from the combination thereof are also exemplified.

M represents the same atom as the above.

H and K represent the same group with those of the above.

As $L_1$, $L_2$, $L_3$ or $L_4$, exemplified are residues in which R or hydrogen on R, the number is correspond to the number of connecting bonds to the polymer chain, are removed from the group described in the above (H-1) or (H-2). Concretely, exemplified are residues in which R or hydrogen on R, the number is correspond to the number of connecting bonds to the polymer chain, are removed from the concrete examples shown in the above structural formula.

In case of $L_1$, the number of connecting bonds to a polymer chain is 2, and in $L_2$, $L_3$ and $L_4$, the number of connecting bonds to a polymer chain is 1.

The polymer light-emitting material of the present invention may contain 2 or more kinds of metal complexes showing light-emission from triplet excited state. Metal complexes respectively may have the same or different metals. Moreover, each of the metal complex structure may have mutually different light-emission color. For example, exemplified is a case where both of a metal complex structure which emits green light, and a metal complex structure which emits red light are contained in one polymer complex compound. In this case, since a light-emission color is controllable by designing so that an appropriate amount of the metal complex structure may be included, it is preferable.

The amount of the metal complex showing light-emission from triplet excited state in the polymer complex compound in the present invention is not especially limited, and it is usually 0.01 to 80 parts by weight based on the amount of the polymer complex compound as 100 parts by weight, and preferably, it is 0.05 to 60 parts by weight.

The amount of the triplet light-emitting compound in the composition used for the polymer light-emitting material in the present invention is not especially limited, since it depends on the kind of polymer compounds to be combined, and the characteristics to be optimized, and it is usually 0.1 to 60 parts by weight, preferably 0.01 to 80 parts by weight, based on the amount of a polymer compound as 100 parts by weight.

When the light-emitting material of the present invention is used for a light-emitting material of polymer LED, the purity of the polymer compound exerts an influence on light emitting property, therefore, it is preferable that a monomer is purified by a method such as distillation, sublimation purification, re-crystallization and the like before being polymerized. Further, it is preferable to conduct a purification treatment such as re-precipitation purification, chromatographic separation and the like after the polymerization. In addition, the polymer compound used for the present invention can be used as a light-emitting material, and also as an organic semiconductor material, an optical material, or a conductive material with doping.

Next, the polymer light-emitting device (polymer LED) of the present invention is explained. It is characterized by having a layer which contains a complex composition of the present invention between the electrodes consisting of an anode and a cathode.

It is preferable that the layer containing the composition of the present invention is a light emitting layer.

As the polymer LED of the present invention, there are exemplified: a polymer LED having an electron transporting layer between a cathode and a light emitting layer; a polymer LED having a hole transporting layer between an anode and a light emitting layer; and a polymer LED having an electron transporting layer between a cathode and a light emitting layers, and a hole transporting layer between an anode and a light emitting layer.

Moreover, exemplified are: a polymer LED having a layer which contains a conductive polymer between at least one electrode and a light emitting layer, adjacently to the electrode; and a polymer LED having a buffer layer having a mean film thickness of 2 nm or less adjacently to the electrode.

For example, the following structures of a-d are specifically exemplified.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode
(wherein, "/" indicates adjacent lamination of layers. Hereinafter, the same).

Here, the light emitting layer is a layer having a function of emitting light, the hole transporting layer is a layer having a function of transporting holes, and the electron transporting layer is a layer having a function of transporting electrons. Herein, the electron transporting layer and the hole transporting layer are generically called a charge transporting layer. The light emitting layer, hole transporting layer, and electron transporting layer, may be each independently used as two or more layers.

Moreover, among the charge transporting layers provided adjacent to an electrode, those having a function to improve the charge injection efficiency from an electrode, and having the effect of lowering driving voltage of a device, are generally just called a charge injection layer (a hole injection layer, electron injection layer).

Further, for the improvement of adhesion and charge injection from the electrode, the above charge injection layer or an insulating layer 2 nm or less of film thickness may be adjacently prepared to the electrode, and for the improvement of adhesion of the interface and prevention of mixing, a thin buffer layer may be inserted into the interface of a charge transporting layer and a light emitting layer.

Furthermore, in order to transport electrons and to shut up holes, a hole prevention layer may be inserted to the interface with a light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode
j) anode/charge injecting layer/hole transporting layer/light emitting layer/charge injecting layer/cathode k) anode/charge injecting layer/light emitting layer/electron transporting layer/cathode
l) anode/light emitting layer/electron transporting layer/charge injecting layer/cathode
m) anode/charge injecting layer/light emitting layer/electron transporting layer/charge injecting layer/cathode
n) anode/charge injecting layer/hole transporting layer/light emitting layer/electron transporting layer/cathode
o) anode/hole transporting layer/light emitting layer/electron transporting layer/charge injecting layer/cathode
p) anode/charge injecting layer/hole transporting layer/light emitting layer/electron transporting layer/charge injecting layer/cathode As the concrete examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing an conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.
q) anode/insulation layer having a thickness of 2 nm or less/light emitting layer/cathode
r) anode/light emitting layer/insulation layer having a thickness of 2 nm or less/cathode
s) anode/insulation layer having a thickness of 2 nm or less/light emitting layer/insulation layer having a thickness of 2 nm or less/cathode
t) anode/insulation layer having a thickness of 2 nm or less/hole transporting layer/light emitting layer/cathode
u) anode/hole transporting layer/light emitting layer/insulation layer having a thickness of 2 nm or less/cathode
v) anode/insulation layer having a thickness of 2 nm or less/hole transporting layer/light emitting layer/insulation layer having
a thickness of 2 nm or less/cathode
w) anode/insulation layer having a thickness of 2 nm or less/light emitting layer/electron transporting layer/cathode
x) anode/light emitting layer/electron transporting layer/insulation layer having a thickness of 2 nm or less/cathode
y) anode/insulation layer having a thickness of 2 nm or less/light emitting layer/electron transporting layer/insulation layer having a thickness of 2 nm or less/cathode
z) anode/insulation layer having a thickness of 2 nm or less/hole transporting layer/light emitting layer/electron transporting layer/cathode
aa) anode/hole transporting layer/light emitting layer/electron transporting layer/insulation layer having a thickness of 2 nm or less/cathode
ab) anode/insulation layer having a thickness of 2 nm or less/hole transporting layer/light emitting layer/electron transporting layer/insulation layer having a thickness of 2 nm or less/cathode The hole prevention layer is a layer having a function of transporting electrons and shutting up holes transported from anode, and is prepared in the interface at the cathode side of a light emitting layer, and consists of a material having larger ionization potential than that of the light emitting layer, for example, bathocuproin, 8-hydroxyquinoline or a metal complex of the derivatives.

The film thickness of the hole prevention layer, for example, is 1 nm to 100 nm, preferably 2 nm to 50 nm.

Specifically, the following structures of ac) to an) are exemplified.
ac) anode/charge injection layer/light emitting layer/hole prevention layer/cathode
ad) anode/light emitting layer/hole prevention layer/charge injection layer/cathode
ae) anode/charge injection layer/light emitting layer/hole prevention layer/charge injection layer/cathode
af) anode/charge injection layer/hole transporting layer/light emitting layer/hole prevention layer/cathode
ag) anode/hole transporting layer/light emitting layer/hole prevention layer/charge injection layer/cathode
ah) anode/charge injection layer/hole transporting layer/light emitting layer/hole prevention layer/charge injection layer/cathode
ai) anode/charge injection layer/light emitting layer/hole prevention layer/charge transporting layer/cathode
aj) anode/light emitting layer/hole prevention layer/electron transporting layer/charge injection layer/cathode
ak) anode/charge injection layer/light emitting layer/hole prevention layer/electron transporting layer/charge injection layer/cathode al) anode/charge injection layer/hole transporting layer/light emitting layer/hole prevention layer/charge transporting layer/cathode
am) anode/hole transporting layer/light emitting layer/hole prevention layer/electron transporting layer/charge injection layer/cathode
an) anode/charge injection layer/hole transporting layer/light emitting layer/hole prevention layer/electron transporting layer/charge injection layer/cathode In case of polymer-LED production, when a film formation is carried out from a solution, it can be done by coating and then just drying the solvent, by using the polymer light-emitting material of the present invention. In case where a charge transporting material or a light-emitting material is mixed, the same technique can be applied, and it is very advantageous on production. As for the film-forming method from solution, there can be used coating methods, such as spin coating method, casting method, micro gravure coating method, gravure coating method, bar-coating method, roll coating method, wire-bar coating method, dip coating method, spray coating method, screen stenciling method, flexography method, offset printing method, and ink-jet printing method.

As for the thickness of the light emitting layer in the polymer LED of the present invention, the optimum value differs depending on material used, and may properly be selected so that the driving voltage and the light emitting efficiency become optimum values, and for example, it is from 1 nm to 1 µm, preferably from 2 nm to 500 nm, further preferably from 5 nm to 200 nm.

In the polymer LED of the present invention, light-emitting materials other than the polymer light-emitting material of the present invention may be mixed in a light emitting layer. Moreover, in the polymer LED of the present invention, a light emitting layer containing light-emitting materials other than the present invention may be laminated with the light emitting layer containing the polymer light-emitting material of the present invention.

As the light-emitting material, known materials can be used. As for low molecular weight compound, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Poly(N-vinyl carbazole) or derivative thereof can be obtained, for example, by cation polymerization or radical polymerization of a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transporting property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 μm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or molten state is exemplified, respectively. At the time of film-forming from a solution or molten state, the above polymer binder can be used together.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably that which does not extremely disturb a charge transporting property, and that does not have strong absorption of a visible light is suitably used. As such polymer binder, poly(N-vinylcarbazole), polyaniline or derivatives thereof, polythiophene or derivatives thereof, poly(p-phenylene vinylene) or derivatives thereof, poly(2,5-thienylene vinylene) or derivatives thereof, polycarbonate, polyacrylate, poly(methyl acrylate), poly(methyl methacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 μm, preferably from 2 nm to 500 nm, further preferably from 5 nm to 200 nm.

The substrate forming the polymer LED of the present invention may preferably be that does not change in forming an electrode and layers of organic materials, and there are exemplified glass, plastics, polymer film, silicon substrates and the like. In the case of a opaque substrate, it is preferable that the opposite electrode is transparent or semitransparent.

Usually, at least one of the electrodes consisting of an anode and a cathode, is transparent or semitransparent. It is preferable that the anode is transparent or semitransparent.

As the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium/tin/oxide (ITO), indium/zinc/oxide and the like, which are metal oxide complexes, and gold, platinum, silver, copper and the like are used, and among them, ITO, indium/zinc/oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two of more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected while considering transmission of a light and electric conductivity, and for example, from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising an conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymeric compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent an device from being injured. If an inner gas such as nitrogen and argon is sealed in this space, it is possible to prevent oxidation of a cathode, and further, by placing a desiccant such as barium oxide and the like in the above-described space, it is easy to suppress the damage of an device by moisture adhered in the production process. Among them, any one or more means are preferably adopted.

The polymer LED of the present invention can be used for a flat light source, a segment display, a dot matrix display, and a liquid crystal display as a back light, etc.

For obtaining light emission in plane form using the polymer LED of the present invention, an anode and a cathode in the plane form may properly be placed so that they are laminated each other. Further, for obtaining light emission in pattern form, there is a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric compounds emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

The following examples will illustrate the present invention further in detail, but the scope of the invention is not limited to them.

EXAMPLE 1

After adding iridium complex A (commercially available from American Dye Source, Inc.) to Polymer compound 1 described hereinafter in an amount of 5% by weight, a chloroform solution was prepared including the mixture in an amount of 0.8% by weight.

On a glass substrate with 150 nm thickness of ITO film formed thereon by a sputtering method, a solution of poly(ethylenedioxythiophene)/polystyrenesulfonic acid (commercially available from Bayer, Baytron P) was coated by a spin-costing method to form a 50 nm thickness film, followed by drying on a hot plate at 200° C. for 10 minutes. Thereafter, a film was formed using the chloroform solution prepared above by a spin-costing method with 2500 rpm of rotating speed. The thickness of the film formed was 100 nm. This film was further dried under a reduced pressure at 80° C. for 1 hour, and then subjected to vapor deposition in the order of LiF having about 4 nm thickness as a cathode buffer layer, and calcium having about 5 nm thickness and then aluminum having about 80 nm thickness as a cathode to form an EL device. The vapor deposition of metals was commenced after a degree of vacuum reached to $1 \times 10^{-4}$ Pa or less. By applying voltage to the device obtained, EL light emission having a peak at 620 nm was obtained.

Polymer compound 1: A polymer substantially composed of the following repeating unit.

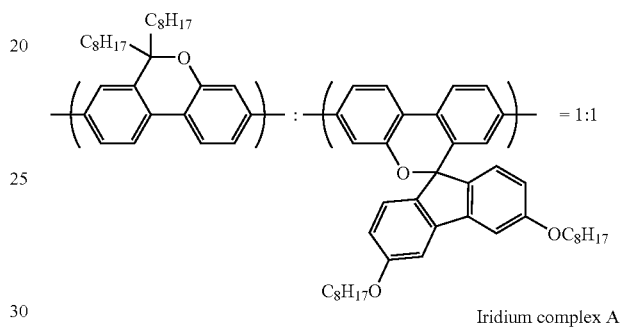

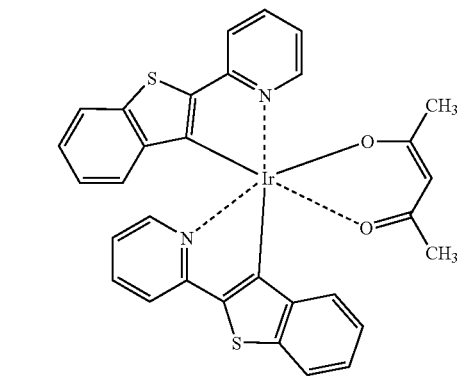

Polymer compound 1 was synthesized as follows. The number-average molecular weight thereof was determined by gel permeation chromatography (GPC) in terms of polystyrene-reduced number-average molecular weight. A mobile phase used chloroform or tetrahydrofuran (THF).

SYNTHETIC EXAMPLE 1

Synthesis of Polymer compound 1

Synthesis of Compound 1

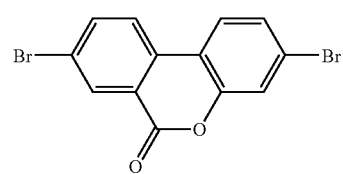

1

In a three-neck flask having a capacity of 500 ml being replaced with nitrogen, 6.65 g (19.9 mmol) of 2,7-Dibromo-9-fluorenone was charged, followed by dissolution in 140 ml of a mixed solvent composed of trifluoroacetic acid chloroform=1:1. To this solution was added sodium perborate monohydrate, followed by stirring for 20 hours. The reactant solution was filtrated through Celite, followed by washing with toluene. The filtrate was washed with water, sodium hydrogensulfite and saturated saline in this order, followed by drying with sodium sulfate. After eliminating the solvent, 6.11 g of a crude product was obtained.

This crude product was recrystallized from toluene (33 ml) to obtain 4.99 g of Compound 1. Further, the compound was recrystallized from chloroform (50 ml) to obtain 1.19 g of Compound 1.

Synthesis of Compound 3

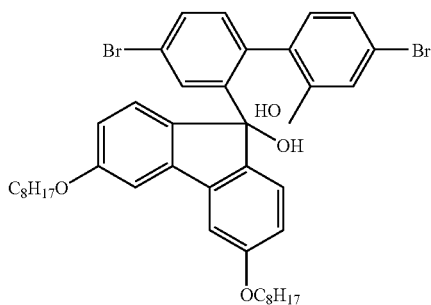

3

After a three-neck flask having a capacity of 100 ml being replaced with nitrogen, 3.1 g of magnesium, 33 ml of THF and 8.23 g of Compound 2 were charged into the flask. After adding a few drops of 1,2-dibromoethane therein, reaction was commenced by heating with a heat gun. The reaction solution was stirred for 5 hours under reflux, and then left to be cooled down; thereafter, being subjected to elimination of excess amount of magnesium by decantation, and then being washed with 100 ml of THF. This solution obtained was dropped with a THF solution (50 ml) which had been suspended with 5.00 g of Compound 2, followed by stirring for 1.5 hours. Thereafter, 100 ml of water was added to cause extraction by phase separation. The aqueous phase was extracted twice with 100 ml of ethyl acetate, and organic phases were combined and washed with water and then with saturated saline. After concentrating the solution, 11.07 g of a crude product was obtained. This product was used in the next step without being subjected to any other purification.

MS (ESI (Negative, KCl addition)) m/z: 765, 763, 761 (M−H)

The Compound 2 was synthesized according to the method disclosed in WO2003062443.

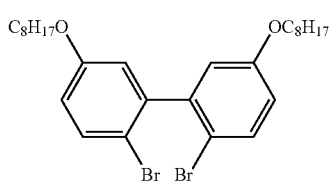

2

-continued

Synthesis of Compound 4

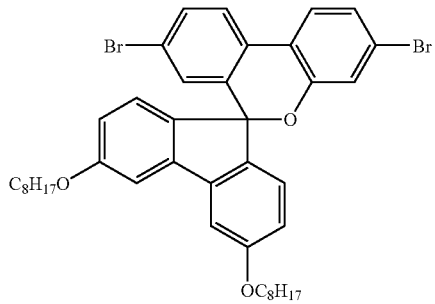

4

In a egg-plant type flask having a capacity of 100 ml, 11.0 g of Compound 3, 22 ml of toluene and 1.27 g of p-toluenesulfonic acid monohydrate were charged, followed by stirring for 2.5 hours under reflux. Thereafter, the solution was left to be cooled down, followed by addition of 100 ml of toluene and then being washed with 50 ml of water. The solution was passed through a short column packed with silica gel to be concentrated to obtain a crude product. After being subjected to purification by silica gel column chromatography (hexane:toluene=5:1), 6.81 g of Compound 4 was obtained.

$^1$H-NMR (300 MHz/CDCl3):

d7.67 (d, 2H), 7.45 (dd, 1H), 7.26 to 7.06 (m, 6H), 6.77 (br, 1H), 6.69 (dd, 2H), 4.01 (t, 4H), 1.81 (m, 4H), 1.48 to 1.30 (m, 20H), 0.89 (t, 6H)

MS (ESI (Negative, KCl addition)) m/z: 747, 745, 743 (M−H)

Synthesis of Compound 5

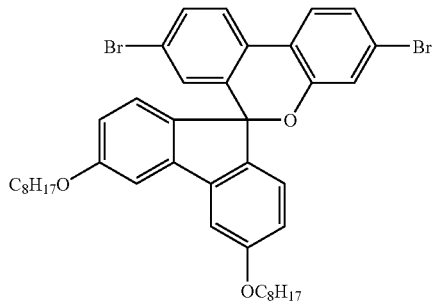

Preparation of C8H17MgBr

In a three-neck flask having a capacity of 100 ml, 1.33 g (54.2 mmol) of magnesium was charged, followed by subjecting to flame drying and then to replacement of atmosphere with argon. To this was added 10 ml of THF and 2.3 ml (13.6 ml) of 1-bromooctane, followed by heating to commence reaction. After 2.5 hours had passed under reflux, the reactant was left to be cooled down.

Grignard Reaction

In a three-neck flask having a capacity of 300 ml being replaced with nitrogen, 1.00 g (p. 96%, 2.7 mmol) of "1" was charged to be suspended with 10 ml of THF. The suspended solution was cooled to at 0° C., and then added with the C8H17MgBr solution prepared above. After taking off the cold bath, the solution was stirred for 5 hours under reflux. The reactant solution, after having been left to be cooled down, was added with 10 ml of water and hydrochloric acid. A state of the solution was transformed by the addition of hydrochloric acid from a suspended solution to a two-phase solution. After being subjected to phase separation, the organic phase was washed with water and saturated saline. The solution was dried over sodium sulfate, and then, the solvent was distilled off to obtain 1.65 g of a crude product. After being subjected to purification by silica gel column chromatography (hexane:ethyl acetate=20:1), 1.30 g of Compound 5 was obtained.

$^1$H-NMR (CDCl$_3$, 300 MHz):7.66 (br, 1H), 7.42 (dd, 1H), 7.10 to 7.06 (m, 2H), 6.91 to 6.85 (m, 2H), 5.55 (br, 1H), 1.90 to 0.86 (m, 34H) MS (APCI, Negative, m/z): 583, 581, 579

Synthesis of Compound 6

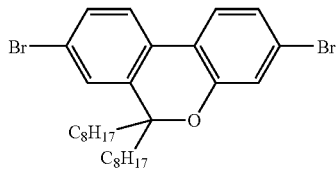

(6)

In a two-neck flask having a capacity of 25 ml being replaced with nitrogen, 0.20 g (0.32 mmol) of Compound 5 was charged, followed by dissolution of 4 ml of toluene. This solution was added with 0.02 g (0.06 mmol) of p-toluenesulfonic acid monohydrate, followed by stirring at 100° C. for 11 hours. The reactant solution, after having been left to be cooled down, was washed with water, 4N aqueous NaOH, water and saturated saline in this order, followed by elimination of the solvent to obtain 0.14 g of Compound 6.

$^1$H-NMR (CDCl$_3$, 300 MHz):7.59 (d, 1H), 7.53 (d, 1H), 7.47 (d, 1H), 7.29 (br, 1H), 7.15 (s, 1H), 7.13 (d, 1H), 1.92 (br, 4H), 1.28 (m, 24H), 0.93 (t, 6H),

FD-MS (m/z): 566, 564, 562

Synthesis of Polymer Compound 1

After charging 0.37 g of Compound 4, 0.28 g of Compound 6 and 0.31 g of 2,2'-bipyridyl in a reactor, an atmosphere in the reaction system was replaced with nitrogen. To this was added 40 g of tetrahydrofuran (THF) (a dehydrated solvent) which had been previously deaerated by bubbling with an argon gas. Thereafter, this mixed solution was added with 0.55 g of bis(1,5-cyclooctadiene)nickel(0) {Ni(COD)$_2$}, followed by stirring at a room temperature for 10 minutes, and consecutively being subjected to reaction at a room temperature for 20 hours. The reaction was carried out under a nitrogen atmosphere. After the reaction was completed, the reactant solution was poured with a mixed solution of methanol 50 ml/ion-exchanged water 50 ml, followed by stirring for about 1 hour to precipitate. Thereafter, the precipitate generated was collected by filtration. The precipitate collected was dried under reduced pressure, followed by dissolution in toluene. This solution was filtrated to eliminate insolubles, followed by being passed through a column packed with alumina. This solution was washed with about 1N hydrochloric acid. This solution was left under standstill, followed by recovery of a toluene layer. This solution was washed with about 2.5% of aqueous ammonia; thereafter, this solution was left under standstill, followed by recovery of a toluene layer. This solution was washed with ion-exchanged water, followed by recovery of a toluene layer. This solution was poured into methanol to generate precipitate again, followed by recovery of the generated precipitate. This precipitate was dried under reduced pressure to obtain 0.17 g of Polymer compound 1.

The polystyrene-reduced number-average molecular weight of Polymer compound 1 was 2.8×10$^4$, and the polystyrene-reduced weight-average molecular weight thereof was 1.4×10$^5$.

INDUSTRIAL APPLICABILITY

The light-emitting device using the polymer light emitting material of the invention in a light emission layer thereof is excellent in light emitting efficiency. Therefore, the polymer light emitting material of the invention can be suitably applied to light emitting materials of polymer LED, thereby employed as a material for polymer light emitting devices and organic EL devices using the same and the like.

The invention claimed is:

1. A polymer light emitting material consisting essentially of a compound exhibiting light emission from the triplet excited state and either (a) a polymer compound consisting essentially of a repeating unit represented by the formula (4) and having a polystyrene-reduced number-average molecular weight of 10$^3$ to 10$^8$, or (b) a polymer compound consisting essentially of a repeating unit represented by the formula (4) and a repeating unit selected from the group consisting of groups (5), (6), (7) or (8) and having a polystyrene-reduced number-average molecular weight of 10$^3$ to 10$^8$

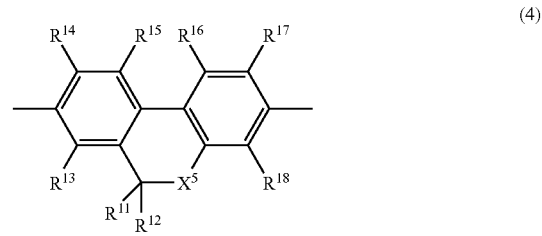

(4)

—[—wherein

R$^{11}$ and R$^{12}$ each independently represent a hydrogen atom, halogen atom, alkyl group, aryl group, arylalkyl group or monovalent heterocyclic group; R$^{11}$ and R$^{12}$ may mutually be connected to form a ring; and X$^5$ represents O;

R$^{13}$, R$^{14}$, R$^{15}$, R$^{16}$, R$^{17}$ and R$^{18}$ each independently represent a hydrogen atom, halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, heteroaryloxy group, heteroarylthio group, arylalkenyl group, arylethynyl group, carboxyl group, alkoxycarbonyl group, aryloxycarbonyl group, arylalkyloxycarbonyl group, heteroaryloxycarbonyl group or cyano group; and (R$^{14}$ and R$^{15}$) or (R$^{16}$ and R$^{17}$) may mutually be connected to form a ring—]—;

—Ar$^5$—  (5)

—Ar$^5$—X$^6$—(Ar$^6$—X$^7$)$_a$—Ar$^7$—  (6)

—Ar$^5$—X$^7$—  (7)

—X$^7$—  (8)

—[—wherein $Ar^5$, $Ar^6$ and $Ar^7$ each independently represent an arylene group selected from the group consisting of phenylene group, biphenylene group, fluorene-diyl group and stilbene-diyl group;

$X^6$ represents —C≡C—, —N($R^{21}$)— or —(Si$R^{22}R^{23}$)$_b$—;

$X^7$ represents —C$R^{19}$=C$R^{20}$—, —C≡C—, —N($R^{21}$)— or —(Si$R^{22}R^{23}$)$_b$—;

$R^{19}$ and $R^{20}$ each independently represent a hydrogen atom, alkyl group, aryl group, monovalent heterocyclic group, carboxyl group, alkoxycarbonyl group, aryloxycarbonyl group, arylalkyloxycarbonyl group, heteroaryloxycarbonyl group or cyano group;

$R^{21}$, $R^{22}$ and $R^{23}$ each independently represent a hydrogen atom, alkyl group, aryl group, monovalent heterocyclic group or arylalkyl group; and a represents an integer of 0 or 1 and b represents an integer of 1 to 12—]—.

2. The polymer light emitting material according to claim 1 wherein the formula (5) is a repeating unit represented by the following formula (9):

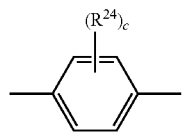

(9)

[wherein $R^{24}$ represents a halogen atom, alkyl group, alkyloxy group, alkylthio group, aryl group, aryloxy group, arylthio group, arylalkyl group, arylalkyloxy group, arylalkylthio group, acyl group, acyloxy group, amide group, acid imide group, imine residue, amino group, substituted amino group, substituted silyl group, substituted silyloxy group, substituted silylthio group, substituted silylamino group, monovalent heterocyclic group, heteroaryloxy group, heteroarylthio group, arylalkenyl group, arylethynyl group, carboxyl group, alkoxycarbonyl group, aryloxycarbonyl group, arylalkyloxycarbonyl group, heteroaryloxycarbonyl group or cyano group; c represents an integer of 0 to 4].

3. The polymer light emitting material according to claim 1 wherein the total amount of the repeating unit represented by the formula (4) is 10% by mole or more based on an amount of whole repeating units.

4. The polymer light emitting material according to claim 1 further including at least one kind of materials selected from the group consisting of a hole transporting material, an electron transporting material and a light emitting material.

5. The polymer light emitting material according to claim 1, wherein a compound or structure exhibiting light emission from the triplet excited state is a metal complex.

6. An ink composition comprising a polymer light emitting material of claim 1.

7. The ink composition according to claim 6 having 1 to 100 mPa·s of viscosity at 25° C.

8. A light emitting thin film comprising a polymer light emitting material of claim 1.

9. A conductive thin film comprising a polymer light emitting material of claim 1.

10. An organic semiconductor thin film comprising a emitting light emitting material of claim 1.

11. A polymer light emitting device having a layer comprising a polymer light emitting material of claim 1 between electrodes consisting of an anode and a cathode.

12. The polymer light emitting device according to claim 11, wherein the light emission layer further comprises a hole transporting material, an electron transporting material or a light-emitting material.

13. A flat light source comprising a polymer light emitting device of claim 11 or claim 12.

14. A segment display comprising a polymer light emitting device of claim 11 or claim 12.

15. A dot matrix display comprising a polymer light emitting device of claim 11 or claim 12.

16. A liquid crystal display comprising a backlight composed of a polymer light emitting device of claim 11 or claim 12.

17. An illumination comprising a polymer light emitting device of claim 11 or claim 12.

* * * * *